US012175166B1

(12) United States Patent
Lekivetz et al.

(10) Patent No.: US 12,175,166 B1
(45) Date of Patent: Dec. 24, 2024

(54) MIXED-LEVEL SCREENING DESIGN CONSTRUCTION AND GRAPHICAL USER INTERFACES

(71) Applicant: JMP Statistical Discovery LLC, Cary, NC (US)

(72) Inventors: Ryan Adam Lekivetz, Cary, NC (US); Bradley Allen Jones, Cary, NC (US); Jacob Davis Rhyne, Dallas, NC (US); Joseph Albert Morgan, Raleigh, NC (US)

(73) Assignee: JMP STATISTICAL DISCOVERY LLC, Cary, NC (US)

( * ) Notice: Subject to any disclaimer, the term of this patent is extended or adjusted under 35 U.S.C. 154(b) by 0 days.

(21) Appl. No.: 18/769,847

(22) Filed: Jul. 11, 2024

Related U.S. Application Data

(60) Provisional application No. 63/641,903, filed on May 2, 2024, provisional application No. 63/574,182, filed on Apr. 3, 2024, provisional application No. 63/548,669, filed on Feb. 1, 2024.

(51) Int. Cl.
*G06F 30/17* (2020.01)

(52) U.S. Cl.
CPC .................................... *G06F 30/17* (2020.01)

(58) Field of Classification Search
CPC ....................................................... G06F 30/17
See application file for complete search history.

(56) References Cited

U.S. PATENT DOCUMENTS

| | | | | |
|---|---|---|---|---|
| 5,253,331 A * | 10/1993 | Lorenzen | G16B 40/00 | 706/45 |
| 7,216,113 B1 * | 5/2007 | Goldwasser | G16C 20/90 | 706/50 |
| 10,535,422 B2 | 1/2020 | Lekivetz et al. | | |
| 2007/0143240 A1 * | 6/2007 | Goldwasser | G16H 10/40 | 706/47 |

(Continued)

OTHER PUBLICATIONS

Ares, J. et al., Enumeration and Multicriteria Selection of Orthogonal Minimally Aliased Response Surface Designs, Technometrics, vol. 62, No. 1, Mar. 22, 2019, pp. 20-36, Taylor & Francis Group.

(Continued)

*Primary Examiner* — Phi Hoang
(74) *Attorney, Agent, or Firm* — COATS & BENNETT, PLLC

(57) ABSTRACT

A computing device receives a request requesting a screening design for an experiment. The device obtains factors for screening. A first factor has a first set of candidate inputs comprising at least two candidate inputs for allowable inputs in the experiment. A second factor has a second set of candidate inputs comprising at least three candidate inputs for allowable inputs in the experiment. The device receives an indication of a run size. The device generates the screening design by assigning, based on the run size, the first factor to a two-level group that only allows at most two allowable inputs for the first factor in the experiment. The device generates the screening design by assigning, based on the initial run size, the second factor to a three-level group that only allows at most three allowable inputs for the second factor in the experiment. The device outputs the screening design.

30 Claims, 50 Drawing Sheets

(56) References Cited

U.S. PATENT DOCUMENTS

| | | | | |
|---|---|---|---|---|
| 2009/0125270 | A1* | 5/2009 | O'Shea | G06F 11/263 702/108 |
| 2012/0075322 | A1* | 3/2012 | Hathaway | G06T 11/206 703/2 |
| 2012/0079379 | A1* | 3/2012 | Hathaway | G06Q 10/06 715/709 |
| 2021/0133366 | A1* | 5/2021 | Morgan | G06F 30/20 |

OTHER PUBLICATIONS

Lekivetz, R. et al., On Algorithms for Obtaining Orthogonal and Near-Orthogonal Arrays for Main-Effects Screening, Journal of Quality Technology, vol. 47, No. 1, Jan. 1, 2015, pp. 1-13, Taylor & Francis Group.

Ares, J. et al., Orthogonal Minimally Aliased Response Surface Designs for Three-Level Quantitative Factors and Two-Level Categorical Factors, Statistica Sinica Preprint No. SS-2020-0347, pp. 1-30.

Hedayat, A. et al., "Hadamard Matrices and Their Applications", The Annals of Statistics, vol. 6, No. 6, Nov. 1, 1978, pp. 1184-1238, Institute of Mathematical Statistics.

Lekivetz, R. et al., "Designs of Variable Resolution Robust to Non-Negligible Two-Factor Interactions", Statistica Sinica, vol. 26, No. 3, Jul. 1, 2016, pp. 1269-1278, Institute of Statistical Science.

Nguyen, N. et al., "Constructing D-Efficient Mixed-Level Foldover Designs Using Hadamard Matrices", Technometrics, vol. 62, No. 1. pp. 48-56, May 9, 2019, Taylor and Francis.

Yang, J. et al., "Construction of Minimal-Point Mixed-Level Screening Designs Using Conference Matrices", Journal of Quality Technology, vol. 46, No. 3, pp. 251-264, Jul. 1, 2014, asq.org.

Jones, B. et al., "A Class of Three-Level Designs for Definitive Screening in the Presence of Second-Order Effects", Journal of Quality Technology, vol. 43, pp. 1-15, No. 1, Jan. 1, 2011, asq.org.

Jones, B. et al., "Definitive Screening Designs with Added Two-Level Categorical Factors", Journal of Quality Technology, vol. 45, No. 2, pp. 121-129, Apr. 1, 2013, asq.org.

Jones, B. et al., "Effective Design-Based Model Selection for Definitive Screening Designs", Technometrics, vol. 59, No. 3, pp. 319-329, Apr. 21, 2017, Taylor & Francis Group.

Nachtsheim, A. et al., "Two-Level Augmented Definitive Screening Designs", Journal of Quality Technology, vol. 49, No. 2, pp. 93-107, Apr. 1, 2017, asq.org.

Nguyen, N. "A Note on the Construction of Near-Orthogonal Arrays With Mixed Levels and Economic Run Size", Technometrics, vol. 38, No. 3, pp. 279-283, Aug. 1, 1996, Taylor & Francis Ltd.

Starks, T.H. "A Note on Small Orthogonal Main-Effect Plans for Factorial Experiments", Technometrics, vol. 6, No. 2, pp. 220-222, May 1, 1964, Taylor & Francis Ltd.

Tang, B. "Orthogonal arrays robust to nonnegligible two-factor interactions", Biometrika, vol. 93, Issue 1, pp. 137-146, Mar. 1, 2006, Biometrika.

Wang, J.C. et al., "Nearly Orthogonal Arrays with Mixed Levels and Small Runs", Technometrics, vol. 34, No. 4, pp. 409-422, Nov. 1, 1992, Taylor & Francis Ltd.

Xiao, L. et al., "Constructing Definitive Screening Designs Using Conference Matrices", Journal of Quality Technology, vol. 44, No. 1, pp. 1-7, Jan. 1, 2012, asq.org.

Xu, H. "An Algorithm for Constructing Orthogonal and Nearly-Orthogonal Arrays With Mixed Levels and Small Runs", Technometrics, vol. 44, No. 4, pp. 356-368, Nov. 1, 2002, Taylor & Francis Group.

* cited by examiner

400

1100

1600

Design

| Run | X1 | X2 | X3 | X4 | X5 | X6 | X7 | X8 | X9 | X10 | X11 | X12 |
|---|---|---|---|---|---|---|---|---|---|---|---|---|
| 1 | 0 | 1 | 1 | 1 | 1 | 1 | L2 | L2 | L2 | L2 | L2 | L2 |
| 2 | 0 | -1 | -1 | -1 | -1 | -1 | L1 | L1 | L1 | L1 | L1 | L1 |
| 3 | 1 | 0 | -1 | 1 | -1 | -1 | L2 | L2 | L2 | L2 | L1 | L1 |
| 4 | -1 | 0 | 1 | -1 | 1 | 1 | L1 | L1 | L1 | L1 | L2 | L2 |
| 5 | 1 | -1 | 0 | -1 | 1 | -1 | L1 | L2 | L2 | L2 | L2 | L1 |
| 6 | -1 | 1 | 0 | 1 | -1 | 1 | L2 | L1 | L1 | L1 | L1 | L2 |
| 7 | 1 | 1 | -1 | 0 | -1 | 1 | L1 | L1 | L2 | L2 | L2 | L2 |
| 8 | -1 | -1 | 1 | 0 | 1 | -1 | L2 | L2 | L1 | L1 | L1 | L1 |
| 9 | 1 | -1 | 1 | -1 | 0 | -1 | L2 | L1 | L1 | L2 | L2 | L2 |
| 10 | -1 | 1 | -1 | 1 | 0 | 1 | L1 | L2 | L2 | L1 | L1 | L1 |
| 11 | 1 | -1 | -1 | 1 | -1 | 0 | L1 | L2 | L1 | L1 | L2 | L2 |
| 12 | -1 | 1 | 1 | -1 | 1 | 0 | L2 | L1 | L2 | L2 | L1 | L1 |
| 13 | 1 | 1 | -1 | -1 | 1 | -1 | L2 | L1 | L2 | L1 | L1 | L2 |
| 14 | -1 | -1 | 1 | 1 | -1 | 1 | L1 | L2 | L1 | L2 | L2 | L1 |
| 15 | 1 | 1 | 1 | -1 | -1 | 1 | L1 | L2 | L1 | L2 | L1 | L1 |
| 16 | -1 | -1 | -1 | 1 | 1 | -1 | L2 | L1 | L2 | L1 | L2 | L2 |
| 17 | 1 | 1 | 1 | 1 | -1 | -1 | L2 | L1 | L2 | L1 | L2 | L1 |
| 18 | -1 | -1 | -1 | -1 | 1 | 1 | L1 | L2 | L1 | L2 | L1 | L2 |
| 19 | 1 | 1 | 1 | 1 | 1 | -1 | L1 | L2 | L1 | L2 | L1 | L2 |
| 20 | -1 | -1 | -1 | -1 | -1 | 1 | L2 | L1 | L2 | L1 | L2 | L1 |
| 21 | 1 | -1 | 1 | 1 | 1 | 1 | L1 | L1 | L2 | L1 | L2 | L1 |
| 22 | -1 | 1 | -1 | -1 | -1 | -1 | L2 | L2 | L1 | L2 | L1 | L2 |
| 23 | 1 | -1 | -1 | 1 | 1 | 1 | L2 | L1 | L1 | L2 | L1 | L2 |
| 24 | -1 | 1 | 1 | -1 | -1 | -1 | L1 | L2 | L2 | L1 | L2 | L1 |
| 25 | 1 | 1 | -1 | -1 | 1 | 1 | L2 | L2 | L1 | L1 | L2 | L1 |
| 26 | -1 | -1 | 1 | 1 | -1 | -1 | L1 | L1 | L2 | L2 | L1 | L2 |
| 27 | 1 | -1 | 1 | -1 | -1 | 1 | L2 | L2 | L2 | L1 | L1 | L2 |
| 28 | -1 | 1 | -1 | 1 | 1 | -1 | L1 | L1 | L1 | L2 | L2 | L1 |
| 29 | 0 | 0 | 0 | 0 | 0 | 0 | L1 | L1 | L1 | L1 | L1 | L1 |
| 30 | 0 | 0 | 0 | 0 | 0 | 0 | L2 | L2 | L2 | L2 | L2 | L2 |

Design

| Run | X1 | X2 | X3 | X4 | X5 | X6 | X7 | X8 | X9 | X10 | X11 | X12 |
|---|---|---|---|---|---|---|---|---|---|---|---|---|
| 1 | 0 | -1 | 1 | -1 | -1 | 1 | L2 | L2 | L2 | L2 | L2 | L2 |
| 2 | -1 | 0 | -1 | -1 | -1 | -1 | L1 | L2 | L1 | L2 | L1 | L2 |
| 3 | 1 | -1 | 0 | -1 | -1 | -1 | L2 | L1 | L1 | L2 | L2 | L1 |
| 4 | 1 | 1 | -1 | 0 | -1 | 1 | L1 | L1 | L2 | L2 | L1 | L1 |
| 5 | 1 | 1 | 1 | -1 | 0 | -1 | L2 | L2 | L2 | L1 | L1 | L1 |
| 6 | -1 | 1 | 1 | -1 | 1 | 0 | L1 | L2 | L1 | L1 | L2 | L1 |
| 7 | -1 | 1 | 1 | 1 | -1 | -1 | L2 | L1 | L1 | L1 | L1 | L2 |
| 8 | 0 | 1 | -1 | 1 | 1 | -1 | L2 | L2 | L2 | L2 | L2 | L2 |
| 9 | 1 | 0 | 1 | 1 | 1 | 1 | L1 | L2 | L1 | L2 | L1 | L2 |
| 10 | -1 | 1 | 0 | 1 | 1 | 1 | L2 | L1 | L1 | L2 | L2 | L1 |
| 11 | -1 | -1 | 1 | 0 | 1 | -1 | L1 | L1 | L2 | L2 | L1 | L1 |
| 12 | -1 | -1 | -1 | 1 | 0 | 1 | L2 | L2 | L2 | L1 | L1 | L1 |
| 13 | 1 | -1 | -1 | 1 | -1 | 0 | L1 | L2 | L1 | L1 | L2 | L1 |
| 14 | 1 | -1 | -1 | -1 | 1 | 1 | L2 | L1 | L1 | L1 | L1 | L2 |

Figure 21:
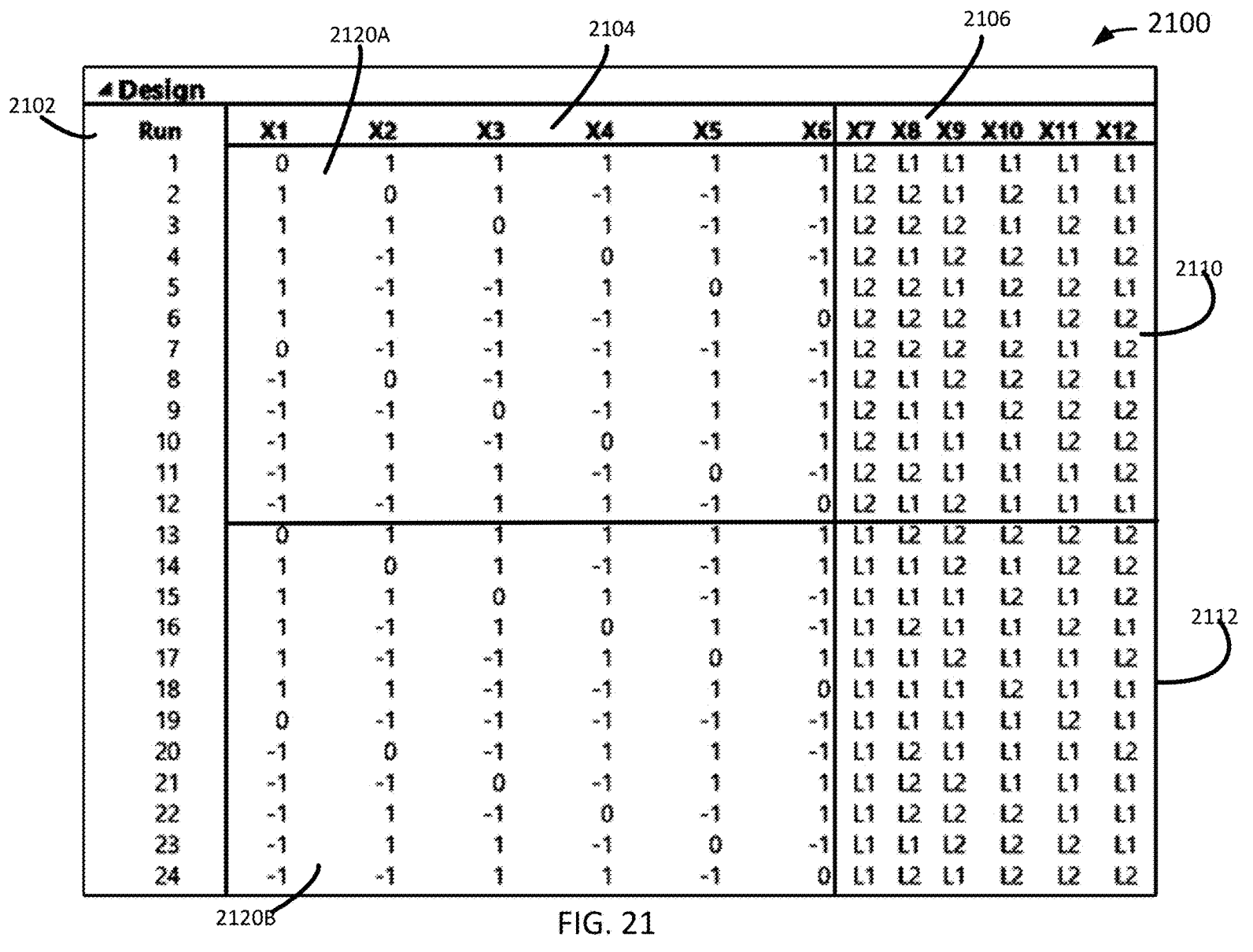

◢ Design

| Run | X1 | X2 | X3 | X4 | X5 | X6 | X7 | X8 | X9 | X10 | X11 | X12 |
|---|---|---|---|---|---|---|---|---|---|---|---|---|
| 1 | 0 | 1 | 1 | 1 | 1 | 1 | L2 | L1 | L1 | L1 | L1 | L1 |
| 2 | 1 | 0 | 1 | -1 | -1 | 1 | L2 | L2 | L1 | L2 | L1 | L1 |
| 3 | 1 | 1 | 0 | 1 | -1 | -1 | L2 | L2 | L2 | L1 | L2 | L1 |
| 4 | 1 | -1 | 1 | 0 | 1 | -1 | L2 | L1 | L2 | L2 | L1 | L2 |
| 5 | 1 | -1 | -1 | 1 | 0 | 1 | L2 | L2 | L1 | L2 | L2 | L1 |
| 6 | 1 | 1 | -1 | -1 | 1 | 0 | L2 | L2 | L2 | L1 | L2 | L2 |
| 7 | 0 | -1 | -1 | -1 | -1 | -1 | L2 | L2 | L2 | L2 | L1 | L2 |
| 8 | -1 | 0 | -1 | 1 | 1 | -1 | L2 | L1 | L2 | L2 | L2 | L1 |
| 9 | -1 | -1 | 0 | -1 | 1 | 1 | L2 | L1 | L1 | L2 | L2 | L2 |
| 10 | -1 | 1 | -1 | 0 | -1 | 1 | L2 | L1 | L1 | L1 | L2 | L2 |
| 11 | -1 | 1 | 1 | -1 | 0 | -1 | L2 | L2 | L1 | L1 | L1 | L2 |
| 12 | -1 | -1 | 1 | 1 | -1 | 0 | L2 | L1 | L2 | L1 | L1 | L1 |
| 13 | 0 | 1 | 1 | 1 | 1 | 1 | L1 | L2 | L2 | L2 | L2 | L2 |
| 14 | 1 | 0 | 1 | -1 | -1 | 1 | L1 | L1 | L2 | L1 | L2 | L2 |
| 15 | 1 | 1 | 0 | 1 | -1 | -1 | L1 | L1 | L1 | L2 | L1 | L2 |
| 16 | 1 | -1 | 1 | 0 | 1 | -1 | L1 | L2 | L1 | L1 | L2 | L1 |
| 17 | 1 | -1 | -1 | 1 | 0 | 1 | L1 | L1 | L2 | L1 | L1 | L2 |
| 18 | 1 | 1 | -1 | -1 | 1 | 0 | L1 | L1 | L1 | L2 | L1 | L1 |
| 19 | 0 | -1 | -1 | -1 | -1 | -1 | L1 | L1 | L1 | L1 | L2 | L1 |
| 20 | -1 | 0 | -1 | 1 | 1 | -1 | L1 | L2 | L1 | L1 | L1 | L2 |
| 21 | -1 | -1 | 0 | -1 | 1 | 1 | L1 | L2 | L2 | L1 | L1 | L1 |
| 22 | -1 | 1 | -1 | 0 | -1 | 1 | L1 | L2 | L2 | L2 | L1 | L1 |
| 23 | -1 | 1 | 1 | -1 | 0 | -1 | L1 | L1 | L2 | L2 | L2 | L1 |
| 24 | -1 | -1 | 1 | 1 | -1 | 0 | L1 | L2 | L1 | L2 | L2 | L2 |

Figure 22A:
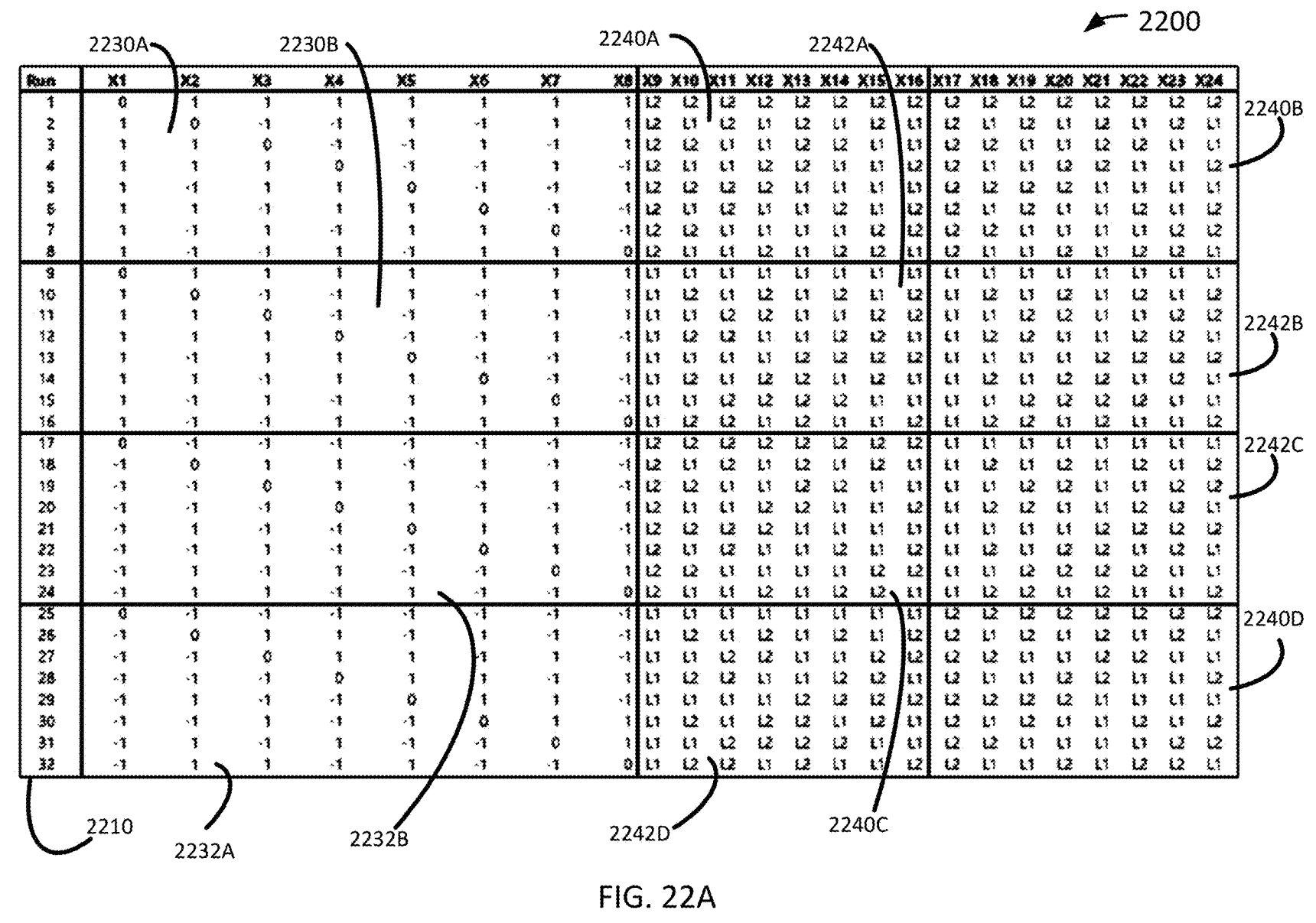

| Run | X1 | X2 | X3 | X4 | X5 | X6 | X7 | X8 | X9 | X10 | X11 | X12 | X13 | X14 | X15 | X16 | X17 | X18 | X19 | X20 | X21 | X22 | X23 | X24 |
|---|---|---|---|---|---|---|---|---|---|---|---|---|---|---|---|---|---|---|---|---|---|---|---|---|
| 1 | 0 | 1 | 1 | 1 | 1 | 1 | 1 | 1 | L2 | L2 | L2 | L2 | L2 | L2 | L2 | L2 | L2 | L2 | L2 | L2 | L2 | L2 | L2 | L2 |
| 2 | 1 | 0 | -1 | -1 | 1 | -1 | 1 | 1 | L2 | L1 | L2 | L1 | L2 | L1 | L2 | L1 | L2 | L1 | L2 | L1 | L2 | L1 | L2 | L1 |
| 3 | 1 | 1 | 0 | -1 | -1 | 1 | -1 | 1 | L2 | L2 | L1 | L1 | L2 | L2 | L1 | L1 | L2 | L2 | L1 | L1 | L2 | L2 | L1 | L1 |
| 4 | 1 | 1 | 1 | 0 | -1 | -1 | 1 | -1 | L2 | L1 | L1 | L2 | L2 | L1 | L1 | L2 | L2 | L1 | L1 | L2 | L2 | L1 | L1 | L2 |
| 5 | 1 | -1 | 1 | 1 | 0 | -1 | -1 | 1 | L2 | L2 | L2 | L2 | L1 | L1 | L1 | L1 | L2 | L2 | L2 | L2 | L1 | L1 | L1 | L1 |
| 6 | 1 | 1 | -1 | 1 | 1 | 0 | -1 | -1 | L2 | L1 | L2 | L1 | L1 | L2 | L1 | L2 | L2 | L1 | L2 | L1 | L1 | L2 | L1 | L2 |
| 7 | 1 | -1 | 1 | -1 | 1 | 1 | 0 | -1 | L2 | L2 | L1 | L1 | L1 | L1 | L2 | L2 | L2 | L2 | L1 | L1 | L1 | L1 | L2 | L2 |
| 8 | 1 | -1 | -1 | 1 | -1 | 1 | 1 | 0 | L2 | L1 | L1 | L2 | L1 | L2 | L2 | L1 | L2 | L1 | L1 | L2 | L1 | L2 | L2 | L1 |
| 9 | 0 | 1 | 1 | 1 | 1 | 1 | 1 | 1 | L1 | L1 | L1 | L1 | L1 | L1 | L1 | L1 | L1 | L1 | L1 | L1 | L1 | L1 | L1 | L1 |
| 10 | 1 | 0 | -1 | -1 | 1 | -1 | 1 | 1 | L1 | L2 | L1 | L2 | L1 | L2 | L1 | L2 | L1 | L2 | L1 | L2 | L1 | L2 | L1 | L2 |
| 11 | 1 | 1 | 0 | -1 | -1 | 1 | -1 | 1 | L1 | L1 | L2 | L2 | L1 | L1 | L2 | L2 | L1 | L1 | L2 | L2 | L1 | L1 | L2 | L2 |
| 12 | 1 | 1 | 1 | 0 | -1 | -1 | 1 | -1 | L1 | L2 | L2 | L1 | L1 | L2 | L2 | L1 | L1 | L2 | L2 | L1 | L1 | L2 | L2 | L1 |
| 13 | 1 | -1 | 1 | 1 | 0 | -1 | -1 | 1 | L1 | L1 | L1 | L1 | L2 | L2 | L2 | L2 | L1 | L1 | L1 | L1 | L2 | L2 | L2 | L2 |
| 14 | 1 | 1 | -1 | 1 | 1 | 0 | -1 | -1 | L1 | L2 | L1 | L2 | L2 | L1 | L2 | L1 | L1 | L2 | L1 | L2 | L2 | L1 | L2 | L1 |
| 15 | 1 | -1 | 1 | -1 | 1 | 1 | 0 | -1 | L1 | L1 | L2 | L2 | L2 | L2 | L1 | L1 | L1 | L1 | L2 | L2 | L2 | L2 | L1 | L1 |
| 16 | 1 | -1 | -1 | 1 | -1 | 1 | 1 | 0 | L1 | L2 | L2 | L1 | L2 | L1 | L1 | L2 | L1 | L2 | L2 | L1 | L2 | L1 | L1 | L2 |
| 17 | 0 | -1 | -1 | -1 | -1 | -1 | -1 | -1 | L2 | L2 | L2 | L2 | L2 | L2 | L2 | L2 | L1 | L1 | L1 | L1 | L1 | L1 | L1 | L1 |
| 18 | -1 | 0 | 1 | 1 | -1 | 1 | -1 | -1 | L2 | L1 | L2 | L1 | L2 | L1 | L2 | L1 | L1 | L2 | L1 | L2 | L1 | L2 | L1 | L2 |
| 19 | -1 | -1 | 0 | 1 | 1 | -1 | 1 | -1 | L2 | L2 | L1 | L1 | L2 | L2 | L1 | L1 | L1 | L1 | L2 | L2 | L1 | L1 | L2 | L2 |
| 20 | -1 | -1 | -1 | 0 | 1 | 1 | -1 | 1 | L2 | L1 | L1 | L2 | L2 | L1 | L1 | L2 | L1 | L2 | L2 | L1 | L1 | L2 | L2 | L1 |
| 21 | -1 | 1 | -1 | -1 | 0 | 1 | 1 | -1 | L2 | L2 | L2 | L2 | L1 | L1 | L1 | L1 | L1 | L1 | L1 | L1 | L2 | L2 | L2 | L2 |
| 22 | -1 | -1 | 1 | -1 | -1 | 0 | 1 | 1 | L2 | L1 | L2 | L1 | L1 | L2 | L1 | L2 | L1 | L2 | L1 | L2 | L2 | L1 | L2 | L1 |
| 23 | -1 | 1 | -1 | 1 | -1 | -1 | 0 | 1 | L2 | L2 | L1 | L1 | L1 | L1 | L2 | L2 | L1 | L1 | L2 | L2 | L2 | L2 | L1 | L1 |
| 24 | -1 | 1 | 1 | -1 | 1 | -1 | -1 | 0 | L2 | L1 | L1 | L2 | L1 | L2 | L2 | L1 | L1 | L2 | L2 | L1 | L2 | L1 | L1 | L2 |
| 25 | 0 | -1 | -1 | -1 | -1 | -1 | -1 | -1 | L1 | L1 | L1 | L1 | L1 | L1 | L1 | L1 | L2 | L2 | L2 | L2 | L2 | L2 | L2 | L2 |
| 26 | -1 | 0 | 1 | 1 | -1 | 1 | -1 | -1 | L1 | L2 | L1 | L2 | L1 | L2 | L1 | L2 | L2 | L1 | L2 | L1 | L2 | L1 | L2 | L1 |
| 27 | -1 | -1 | 0 | 1 | 1 | -1 | 1 | -1 | L1 | L1 | L2 | L2 | L1 | L1 | L2 | L2 | L2 | L2 | L1 | L1 | L2 | L2 | L1 | L1 |
| 28 | -1 | -1 | -1 | 0 | 1 | 1 | -1 | 1 | L1 | L2 | L2 | L1 | L1 | L2 | L2 | L1 | L2 | L1 | L1 | L2 | L2 | L1 | L1 | L2 |
| 29 | -1 | 1 | -1 | -1 | 0 | 1 | 1 | -1 | L1 | L1 | L1 | L1 | L2 | L2 | L2 | L2 | L2 | L2 | L2 | L2 | L1 | L1 | L1 | L1 |
| 30 | -1 | -1 | 1 | -1 | -1 | 0 | 1 | 1 | L1 | L2 | L1 | L2 | L2 | L1 | L2 | L1 | L2 | L1 | L2 | L1 | L1 | L2 | L1 | L2 |
| 31 | -1 | 1 | -1 | 1 | -1 | -1 | 0 | 1 | L1 | L1 | L2 | L2 | L2 | L2 | L1 | L1 | L2 | L2 | L1 | L1 | L1 | L1 | L2 | L2 |
| 32 | -1 | 1 | 1 | -1 | 1 | -1 | -1 | 0 | L1 | L2 | L2 | L1 | L2 | L1 | L1 | L2 | L2 | L1 | L1 | L2 | L1 | L2 | L2 | L1 |

Design

| Run | X1 | X2 | X3 | X4 | X5 | X6 | X7 | X8 | X9 | X10 | X11 | X12 |
|---|---|---|---|---|---|---|---|---|---|---|---|---|
| 1 | 0 | 1 | 1 | 1 | 1 | 1 | L2 | L2 | L2 | L2 | L2 | L2 |
| 2 | 1 | 0 | -1 | -1 | 1 | -1 | L2 | L1 | L2 | L1 | L2 | L1 |
| 3 | 1 | 1 | 0 | -1 | -1 | 1 | L2 | L2 | L1 | L1 | L2 | L2 |
| 4 | 1 | 1 | 1 | 0 | -1 | -1 | L2 | L1 | L1 | L2 | L2 | L1 |
| 5 | 1 | -1 | 1 | 1 | 0 | -1 | L2 | L2 | L2 | L2 | L1 | L1 |
| 6 | 1 | 1 | -1 | 1 | 1 | 0 | L2 | L1 | L2 | L1 | L1 | L2 |
| 7 | 1 | -1 | 1 | -1 | 1 | 1 | L2 | L2 | L1 | L1 | L1 | L1 |
| 8 | 1 | -1 | -1 | 1 | -1 | 1 | L2 | L1 | L1 | L2 | L1 | L2 |
| 9 | 0 | 1 | 1 | 1 | 1 | 1 | L1 | L1 | L1 | L1 | L1 | L1 |
| 10 | 1 | 0 | -1 | -1 | 1 | -1 | L1 | L2 | L1 | L2 | L1 | L2 |
| 11 | 1 | 1 | 0 | -1 | -1 | 1 | L1 | L1 | L2 | L2 | L1 | L1 |
| 12 | 1 | 1 | 1 | 0 | -1 | -1 | L1 | L2 | L2 | L1 | L1 | L2 |
| 13 | 1 | -1 | 1 | 1 | 0 | -1 | L1 | L1 | L1 | L1 | L2 | L2 |
| 14 | 1 | 1 | -1 | 1 | 1 | 0 | L1 | L2 | L1 | L2 | L2 | L1 |
| 15 | 1 | -1 | 1 | -1 | 1 | 1 | L1 | L1 | L2 | L2 | L2 | L2 |
| 16 | 1 | -1 | -1 | 1 | -1 | 1 | L1 | L2 | L2 | L1 | L2 | L1 |
| 17 | 0 | -1 | -1 | -1 | -1 | -1 | L2 | L2 | L2 | L2 | L2 | L2 |
| 18 | -1 | 0 | 1 | 1 | -1 | 1 | L2 | L1 | L2 | L1 | L2 | L1 |
| 19 | -1 | -1 | 0 | 1 | 1 | -1 | L2 | L2 | L1 | L1 | L2 | L2 |
| 20 | -1 | -1 | -1 | 0 | 1 | 1 | L2 | L1 | L1 | L2 | L2 | L1 |
| 21 | -1 | 1 | -1 | -1 | 0 | 1 | L2 | L2 | L2 | L2 | L1 | L1 |
| 22 | -1 | -1 | 1 | -1 | -1 | 0 | L2 | L1 | L2 | L1 | L1 | L2 |
| 23 | -1 | 1 | -1 | 1 | -1 | -1 | L2 | L2 | L1 | L1 | L1 | L1 |
| 24 | -1 | 1 | 1 | -1 | 1 | -1 | L2 | L1 | L1 | L2 | L1 | L2 |
| 25 | 0 | -1 | -1 | -1 | -1 | -1 | L1 | L1 | L1 | L1 | L1 | L1 |
| 26 | -1 | 0 | 1 | 1 | -1 | 1 | L1 | L2 | L1 | L2 | L1 | L2 |
| 27 | -1 | -1 | 0 | 1 | 1 | -1 | L1 | L1 | L2 | L2 | L1 | L1 |
| 28 | -1 | -1 | -1 | 0 | 1 | 1 | L1 | L2 | L2 | L1 | L1 | L2 |
| 29 | -1 | 1 | -1 | -1 | 0 | 1 | L1 | L1 | L1 | L1 | L2 | L2 |
| 30 | -1 | -1 | 1 | -1 | -1 | 0 | L1 | L2 | L1 | L2 | L2 | L1 |
| 31 | -1 | 1 | -1 | 1 | -1 | -1 | L1 | L1 | L2 | L2 | L2 | L2 |
| 32 | -1 | 1 | 1 | -1 | 1 | -1 | L1 | L2 | L2 | L1 | L2 | L1 |

◢ Design

| Run | X1 | X2 | X3 | X4 | X5 | X6 | X7 | X8 | X9 | X10 | X11 | X12 |
|---|---|---|---|---|---|---|---|---|---|---|---|---|
| 1 | 0 | 1 | 1 | 1 | 1 | 1 | L1 | L1 | L1 | L1 | L1 | L1 |
| 2 | -1 | 1 | -1 | 1 | -1 | -1 | L2 | L2 | L1 | L1 | L1 | L1 |
| 3 | 1 | 1 | 1 | 0 | -1 | -1 | L1 | L2 | L2 | L1 | L1 | L2 |
| 4 | -1 | 0 | 1 | 1 | -1 | 1 | L2 | L1 | L2 | L1 | L2 | L1 |
| 5 | -1 | -1 | 0 | 1 | 1 | -1 | L1 | L1 | L2 | L2 | L1 | L1 |
| 6 | -1 | 1 | -1 | -1 | 0 | 1 | L2 | L2 | L2 | L2 | L1 | L1 |
| 7 | 1 | 1 | -1 | 1 | 1 | 0 | L1 | L2 | L1 | L2 | L2 | L1 |
| 8 | -1 | -1 | -1 | 0 | 1 | 1 | L2 | L1 | L1 | L2 | L2 | L1 |
| 9 | 1 | 0 | -1 | -1 | 1 | -1 | L2 | L1 | L2 | L1 | L2 | L1 |
| 10 | 0 | 1 | 1 | 1 | 1 | 1 | L2 | L2 | L2 | L2 | L2 | L2 |
| 11 | 1 | -1 | -1 | 1 | -1 | 1 | L1 | L2 | L2 | L1 | L2 | L1 |
| 12 | 1 | 1 | 0 | -1 | -1 | 1 | L1 | L1 | L2 | L2 | L1 | L1 |
| 13 | 1 | 0 | -1 | -1 | 1 | -1 | L1 | L2 | L1 | L2 | L1 | L2 |
| 14 | -1 | 1 | -1 | 1 | -1 | -1 | L1 | L1 | L2 | L2 | L2 | L2 |
| 15 | 1 | 1 | 0 | -1 | -1 | 1 | L2 | L2 | L1 | L1 | L2 | L2 |
| 16 | 1 | -1 | -1 | 1 | -1 | 1 | L2 | L1 | L1 | L2 | L1 | L2 |
| 17 | 1 | 1 | 1 | 0 | -1 | -1 | L2 | L1 | L1 | L2 | L2 | L1 |
| 18 | -1 | 0 | 1 | 1 | -1 | 1 | L1 | L2 | L1 | L2 | L1 | L2 |
| 19 | -1 | 1 | 1 | -1 | 1 | -1 | L2 | L1 | L1 | L2 | L1 | L2 |
| 20 | -1 | -1 | -1 | 0 | 1 | 1 | L1 | L2 | L2 | L1 | L1 | L2 |
| 21 | 1 | -1 | 1 | 1 | 0 | -1 | L1 | L1 | L1 | L1 | L2 | L2 |
| 22 | 0 | -1 | -1 | -1 | -1 | -1 | L1 | L1 | L1 | L1 | L1 | L1 |
| 23 | -1 | -1 | 0 | 1 | 1 | -1 | L2 | L2 | L1 | L1 | L2 | L2 |
| 24 | 1 | 1 | -1 | 1 | 1 | 0 | L2 | L1 | L2 | L1 | L1 | L2 |
| 25 | 1 | -1 | 1 | -1 | 1 | 1 | L2 | L2 | L1 | L1 | L1 | L1 |
| 26 | -1 | 1 | -1 | -1 | 0 | 1 | L1 | L1 | L1 | L1 | L2 | L2 |
| 27 | 1 | -1 | 1 | -1 | 1 | 1 | L1 | L1 | L2 | L2 | L2 | L2 |
| 28 | -1 | -1 | 1 | -1 | -1 | 0 | L1 | L2 | L1 | L2 | L2 | L1 |
| 29 | 0 | -1 | -1 | -1 | -1 | -1 | L2 | L2 | L2 | L2 | L2 | L2 |
| 30 | -1 | -1 | 1 | -1 | -1 | 0 | L2 | L1 | L2 | L1 | L1 | L2 |
| 31 | 1 | -1 | 1 | 1 | 0 | -1 | L2 | L2 | L2 | L2 | L1 | L1 |
| 32 | -1 | 1 | 1 | -1 | 1 | -1 | L1 | L2 | L2 | L1 | L2 | L1 |

Figure 25B:
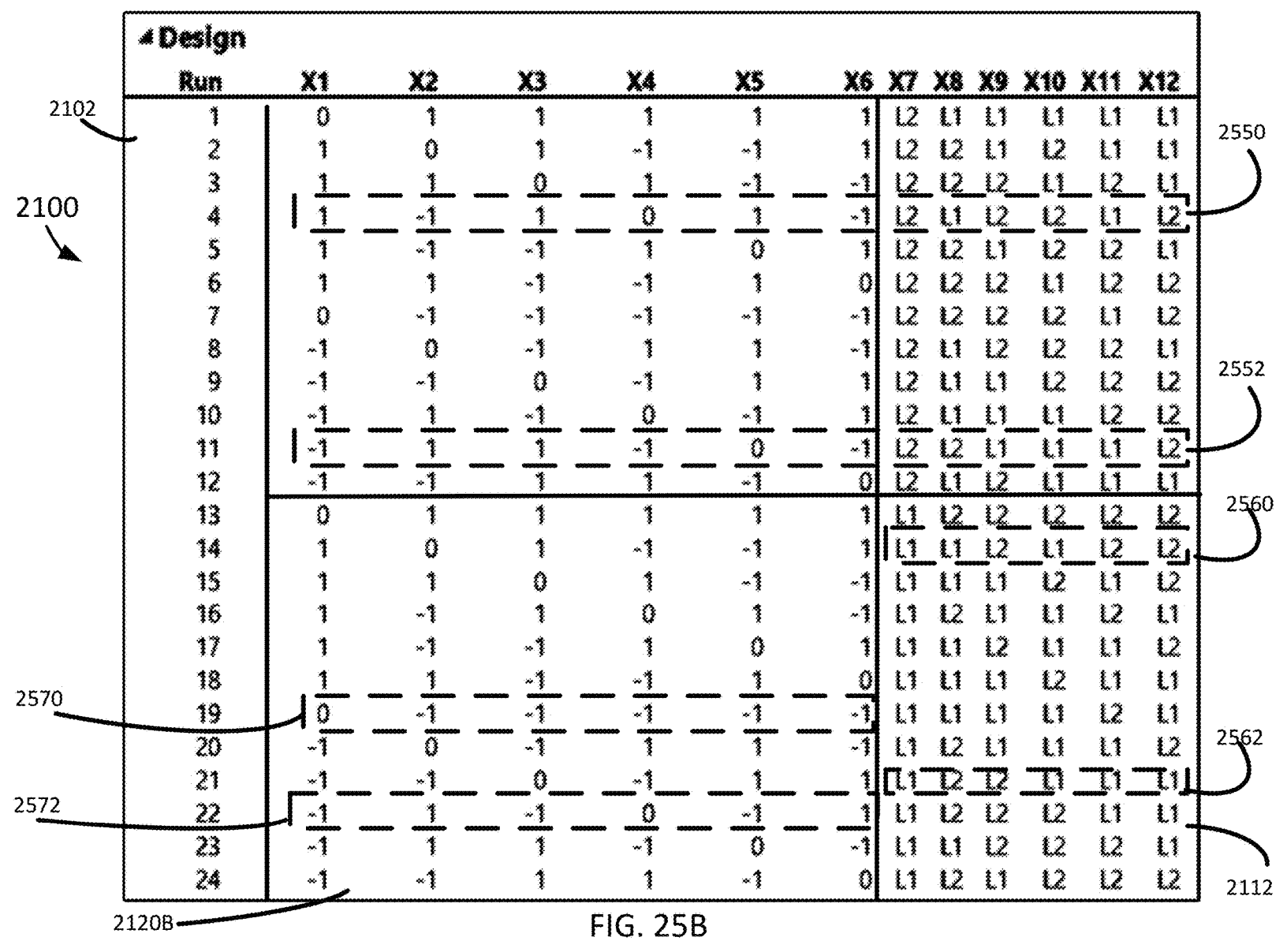

Design

| Run | X1 | X2 | X3 | X4 | X5 | X6 | X7 | X8 | X9 | X10 | X11 | X12 |
|---|---|---|---|---|---|---|---|---|---|---|---|---|
| 1 | 0 | 1 | 1 | 1 | 1 | 1 | L2 | L1 | L1 | L1 | L1 | L1 |
| 2 | 1 | 0 | 1 | -1 | -1 | 1 | L2 | L2 | L1 | L2 | L1 | L1 |
| 3 | 1 | 1 | 0 | 1 | -1 | -1 | L2 | L2 | L2 | L1 | L2 | L1 |
| 4 | 1 | -1 | 1 | 0 | 1 | -1 | L2 | L1 | L2 | L2 | L1 | L2 |
| 5 | 1 | -1 | -1 | 1 | 0 | 1 | L2 | L2 | L1 | L2 | L2 | L1 |
| 6 | 1 | 1 | -1 | -1 | 1 | 0 | L2 | L2 | L2 | L1 | L2 | L2 |
| 7 | 0 | -1 | -1 | -1 | -1 | -1 | L2 | L2 | L2 | L2 | L1 | L2 |
| 8 | -1 | 0 | -1 | 1 | 1 | -1 | L2 | L1 | L2 | L2 | L2 | L1 |
| 9 | -1 | -1 | 0 | -1 | 1 | 1 | L2 | L1 | L1 | L2 | L2 | L2 |
| 10 | -1 | 1 | -1 | 0 | -1 | 1 | L2 | L1 | L1 | L1 | L2 | L2 |
| 11 | -1 | 1 | 1 | -1 | 0 | -1 | L2 | L2 | L1 | L1 | L1 | L2 |
| 12 | -1 | -1 | 1 | 1 | -1 | 0 | L2 | L1 | L2 | L1 | L1 | L1 |
| 13 | 0 | 1 | 1 | 1 | 1 | 1 | L1 | L2 | L2 | L2 | L2 | L2 |
| 14 | 1 | 0 | 1 | -1 | -1 | 1 | L1 | L1 | L2 | L1 | L2 | L2 |
| 15 | 1 | 1 | 0 | 1 | -1 | -1 | L1 | L1 | L1 | L2 | L1 | L2 |
| 16 | 1 | -1 | 1 | 0 | 1 | -1 | L1 | L2 | L1 | L1 | L2 | L1 |
| 17 | 1 | -1 | -1 | 1 | 0 | 1 | L1 | L1 | L2 | L1 | L1 | L2 |
| 18 | 1 | 1 | -1 | -1 | 1 | 0 | L1 | L1 | L1 | L2 | L1 | L1 |
| 19 | 0 | -1 | -1 | -1 | -1 | -1 | L1 | L1 | L1 | L1 | L2 | L1 |
| 20 | -1 | 0 | -1 | 1 | 1 | -1 | L1 | L2 | L1 | L1 | L1 | L2 |
| 21 | -1 | -1 | 0 | -1 | 1 | 1 | L1 | L2 | L2 | L1 | L1 | L1 |
| 22 | -1 | 1 | -1 | 0 | -1 | 1 | L1 | L2 | L2 | L2 | L1 | L1 |
| 23 | -1 | 1 | 1 | -1 | 0 | -1 | L1 | L1 | L2 | L2 | L2 | L1 |
| 24 | -1 | -1 | 1 | 1 | -1 | 0 | L1 | L2 | L1 | L2 | L2 | L2 |

Figure 29:
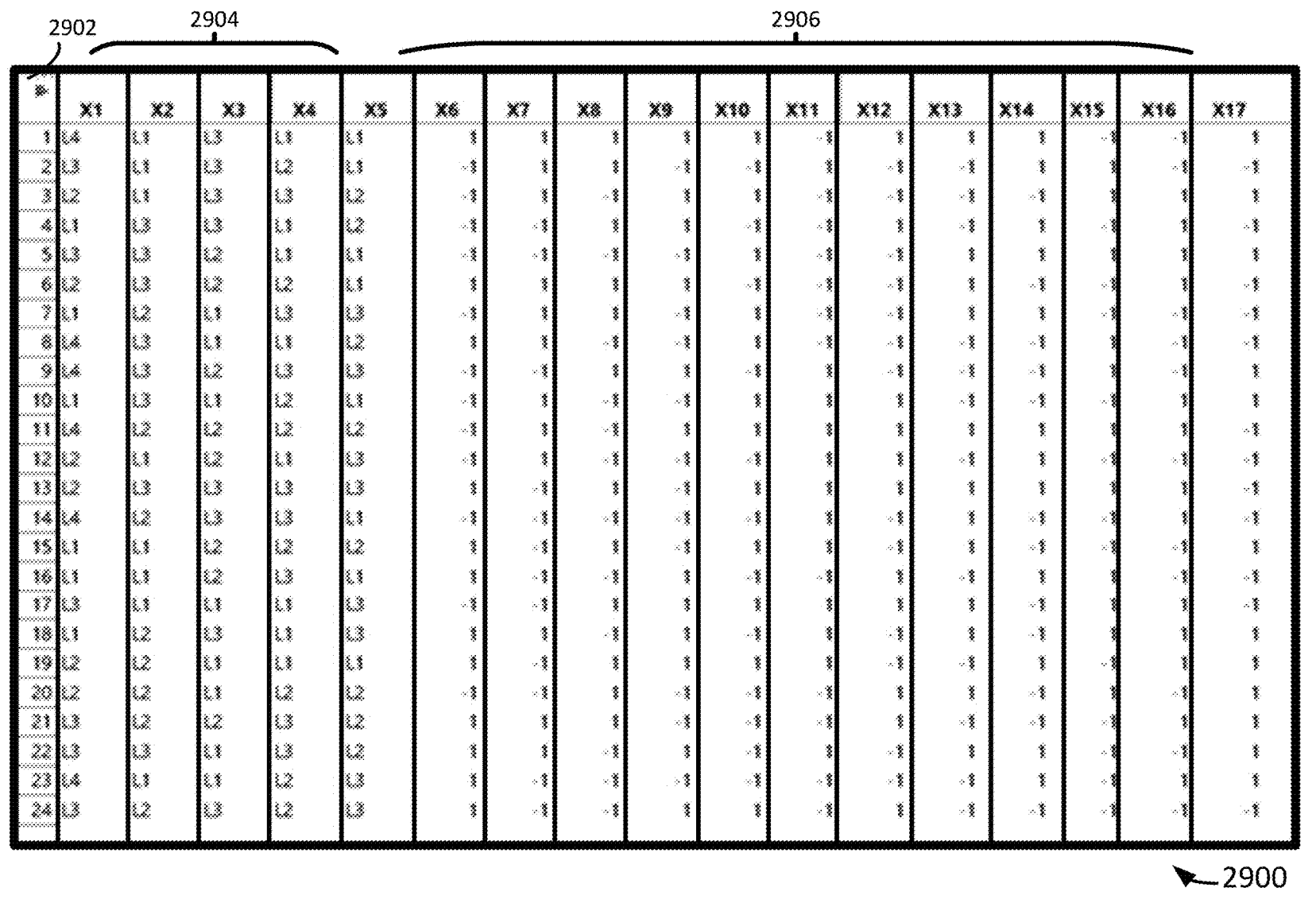

| # | X1 | X2 | X3 | X4 | X5 | X6 | X7 | X8 | X9 | X10 | X11 | X12 | X13 | X14 | X15 | X16 | X17 |
|---|---|---|---|---|---|---|---|---|---|---|---|---|---|---|---|---|---|
| 1 | L4 | L1 | L3 | L1 | L1 | 1 | 1 | 1 | 1 | 1 | -1 | 1 | 1 | 1 | -1 | -1 | 1 |
| 2 | L3 | L1 | L3 | L2 | L1 | -1 | 1 | 1 | -1 | -1 | 1 | -1 | -1 | 1 | 1 | -1 | -1 |
| 3 | L2 | L1 | L3 | L3 | L2 | -1 | 1 | -1 | 1 | 1 | -1 | -1 | -1 | -1 | 1 | 1 | 1 |
| 4 | L1 | L3 | L3 | L1 | L2 | -1 | -1 | 1 | 1 | -1 | -1 | 1 | -1 | 1 | -1 | 1 | -1 |
| 5 | L3 | L3 | L2 | L1 | L1 | -1 | -1 | -1 | -1 | 1 | -1 | -1 | 1 | 1 | 1 | 1 | 1 |
| 6 | L2 | L3 | L2 | L2 | L1 | 1 | 1 | 1 | 1 | -1 | -1 | -1 | 1 | -1 | -1 | 1 | -1 |
| 7 | L1 | L2 | L1 | L3 | L3 | -1 | 1 | 1 | -1 | 1 | -1 | -1 | 1 | 1 | -1 | -1 | -1 |
| 8 | L4 | L3 | L1 | L1 | L2 | 1 | 1 | -1 | -1 | 1 | -1 | -1 | -1 | -1 | 1 | -1 | -1 |
| 9 | L4 | L3 | L2 | L3 | L3 | -1 | -1 | 1 | 1 | -1 | 1 | -1 | -1 | -1 | 1 | -1 | 1 |
| 10 | L1 | L3 | L1 | L2 | L1 | -1 | 1 | -1 | -1 | 1 | 1 | 1 | -1 | -1 | -1 | 1 | 1 |
| 11 | L4 | L2 | L2 | L2 | L2 | -1 | 1 | -1 | 1 | 1 | 1 | 1 | 1 | 1 | 1 | 1 | -1 |
| 12 | L2 | L1 | L2 | L1 | L3 | -1 | 1 | -1 | -1 | -1 | 1 | 1 | -1 | 1 | -1 | -1 | -1 |
| 13 | L2 | L3 | L3 | L3 | L3 | 1 | -1 | 1 | -1 | 1 | 1 | 1 | 1 | 1 | 1 | 1 | -1 |
| 14 | L4 | L2 | L3 | L3 | L1 | -1 | -1 | -1 | -1 | -1 | 1 | -1 | 1 | -1 | -1 | 1 | -1 |
| 15 | L1 | L1 | L2 | L2 | L2 | 1 | -1 | 1 | -1 | 1 | 1 | -1 | 1 | -1 | -1 | -1 | 1 |
| 16 | L1 | L1 | L2 | L3 | L1 | 1 | -1 | -1 | 1 | -1 | -1 | 1 | -1 | 1 | 1 | -1 | -1 |
| 17 | L3 | L1 | L1 | L1 | L3 | -1 | -1 | 1 | 1 | 1 | 1 | 1 | 1 | -1 | 1 | 1 | -1 |
| 18 | L1 | L2 | L3 | L1 | L3 | 1 | 1 | -1 | 1 | -1 | 1 | -1 | 1 | -1 | 1 | 1 | 1 |
| 19 | L2 | L2 | L1 | L1 | L1 | 1 | -1 | 1 | 1 | 1 | 1 | -1 | -1 | 1 | -1 | 1 | 1 |
| 20 | L2 | L2 | L1 | L2 | L2 | -1 | -1 | 1 | -1 | -1 | -1 | 1 | 1 | -1 | 1 | -1 | 1 |
| 21 | L3 | L2 | L2 | L3 | L2 | 1 | 1 | 1 | -1 | -1 | -1 | 1 | -1 | -1 | -1 | 1 | 1 |
| 22 | L3 | L3 | L1 | L3 | L2 | 1 | 1 | -1 | 1 | -1 | 1 | -1 | 1 | 1 | -1 | -1 | 1 |
| 23 | L4 | L1 | L1 | L2 | L3 | 1 | -1 | -1 | -1 | -1 | -1 | -1 | -1 | 1 | -1 | 1 | 1 |
| 24 | L3 | L2 | L3 | L2 | L3 | 1 | -1 | -1 | 1 | 1 | -1 | 1 | -1 | -1 | -1 | -1 | -1 |

Design Diagnostics

| | Efficiency of NOA_mixed_level_N24_cat Relative to NOA_mixed_level_N24_cat_custom_design |
|---|---|
| D-efficiency | 1.003 |
| G-efficiency | 1.605 |
| A-efficiency | 1.063 |
| I-efficiency | 1.045 |

Design Diagnostics

| | Efficiency of Mixedlevel_N48ascat Relative to Mixedlevel_N48ascat_custom |
|---|---|
| D-efficiency | 1.036 |
| G-efficiency | 1.754 |
| A-efficiency | 1.103 |
| I-efficiency | 1.107 |

Factors

| Continuous | Discrete Numeric ▽ | Categorical ▽ |

| Remove | Add N Factors ☐ |

| Name | Role | Values | | | | Units |
|------|------|--------|----|----|----|-------|
| X1 | Categorical | L1 | L2 | L3 | L4 | |
| X2 | Categorical | L1 | L2 | L3 | | |

Design

3732

| Run | X1 | X2 |
|-----|----|----|
| 1 | L1 | L1 |
| 2 | L2 | L3 |
| 3 | L3 | L3 |
| 4 | L4 | L1 |
| 5 | L1 | L2 |
| 6 | L2 | L2 |
| 7 | L3 | L1 |
| 8 | L4 | L2 |
| 9 | L1 | L3 |
| 10 | L2 | L1 |

▷ Design Evaluation

Output Options

Run Order: | Randomize ▽ |

| Make a Table |

| Back |

3736  3738  3734  3730

Distributions

Frequencies 4-Levels

| Level | Count | Prob |
|---|---|---|
| L1 | 3 | 0.30000 |
| L2 | 3 | 0.30000 |
| L3 | 2 | 0.20000 |
| L4 | 2 | 0.20000 |
| Total | 10 | 1.00000 |
| N Missing | 0 | |

3764

Frequencies 3-Levels

| Level | Count | Prob |
|---|---|---|
| L1 | 4 | 0.40000 |
| L2 | 3 | 0.30000 |
| L3 | 3 | 0.30000 |
| Total | 10 | 1.00000 |
| N Missing | 0 | |

3766

3760

MIXED-LEVEL SCREENING DESIGN CONSTRUCTION AND GRAPHICAL USER INTERFACES

CROSS-REFERENCE TO RELATED APPLICATIONS

This application claims the benefit of, and priority based on, 35 U.S.C. § 119 to U.S. Provisional Application No. 63/641,903, filed May 2, 2024; U.S. Provisional Application No. 63/574,182, filed Apr. 3, 2024; and U.S. Provisional Application No. 63/548,669, filed Feb. 1, 2024, the disclosures of each of which are incorporated herein by reference in their entirety.

BACKGROUND

Scientists designing an experiment often need to account for many different factors. For example, if the experiment is testing or analyzing a complex system or environment there can be different factors with different inputs for each factor. There can be categorical factors with different inputs related to different component types for the system. Alternatively, or additionally, there can be continuous factors related to different environmental constraints with inputs such as pressure or temperature ranges for the system. Alternatively, or additionally, there can be different discrete numeric factors with inputs such as different component options. Runs for those experiments can specify which of different inputs to use or apply for a particular experiment.

SUMMARY

In an example embodiment, a computer-program product tangibly embodied in a non-transitory machine-readable storage medium is provided. The computer-program product includes instructions operable to cause a computing system to receive a request, via a graphical user interface, requesting a screening design for an experiment. The computer-program product includes instructions operable to cause the computing system to obtain, for the screening design, multiple factors of a quantity k for screening in the experiment according to the screening design. A first factor of the multiple factors has a first set of candidate inputs comprising at least two candidate inputs for allowable inputs in the experiment. A second factor of the multiple factors has a second set of candidate inputs comprising at least three candidate inputs for allowable inputs in the experiment. The computer-program product includes instructions operable to cause the computing system to receive, via the graphical user interface, an indication of an initial run size that is a user-requested quantity of runs for the screening design. The initial run size is less than 2k+1 runs. The computer-program product includes instructions operable to cause the computing system to generate the screening design by assigning, based on the initial run size, the first factor to a two-level group that only allows at most two allowable inputs for the first factor in the experiment. The computer-program product includes instructions operable to cause the computing system to generate the screening design by assigning, based on the initial run size, the second factor to a three-level group that only allows at most three allowable inputs for the second factor in the experiment. The computer-program product includes instructions operable to cause the computing system to output the screening design which provides candidate runs according to the initial run size with at most two input options for the first factor and at most three input options for the second factor within the screening design for the experiment.

In another example embodiment, a computing device is provided. The computing device includes a processor and memory. The memory contains instructions executable by the processor wherein the computing device is configured to receive a request, via a graphical user interface, requesting a screening design for an experiment. The computing device is configured to obtain, for the screening design, multiple factors of a quantity k for screening in the experiment according to the screening design. A first factor of the multiple factors has a first set of candidate inputs comprising at least two candidate inputs for allowable inputs in the experiment. A second factor of the multiple factors has a second set of candidate inputs comprising at least three candidate inputs for allowable inputs in the experiment. The computing device is configured to receive, via the graphical user interface, an indication of an initial run size that is a user-requested quantity of runs for the screening design. The initial run size is less than 2k+1 runs. The computing device is configured to generate the screening design by assigning, based on the initial run size, the first factor to a two-level group that only allows at most two allowable inputs for the first factor in the experiment. The computing device is configured to generate the screening design by assigning, based on the initial run size, the second factor to a three-level group that only allows at most three allowable inputs for the second factor in the experiment. The computing device is configured to output the screening design which provides candidate runs according to the initial run size with at most two input options for the first factor and at most three input options for the second factor within the screening design for the experiment.

In another example embodiment, a computer-implemented method is provided. The method includes receiving a request, via a graphical user interface, requesting a screening design for an experiment. The method includes obtaining, for the screening design, multiple factors of a quantity k for screening in the experiment according to the screening design. A first factor of the multiple factors has a first set of candidate inputs comprising at least two candidate inputs for allowable inputs in the experiment. A second factor of the multiple factors has a second set of candidate inputs comprising at least three candidate inputs for allowable inputs in the experiment. The method includes receiving, via the graphical user interface, an indication of an initial run size that is a user-requested quantity of runs for the screening design. The initial run size is less than 2k+1 runs. The method includes generating the screening design by: assigning, based on the initial run size, the first factor to a two-level group that only allows at most two allowable inputs for the first factor in the experiment, and assigning, based on the initial run size, the second factor to a three-level group that only allows at most three allowable inputs for the second factor in the experiment. The method includes outputting the screening design which provides candidate runs according to the initial run size with at most two input options for the first factor and at most three input options for the second factor within the screening design for the experiment.

In another example embodiment, a computer-program product tangibly embodied in a non-transitory machine-readable storage medium is provided. The computer-program product includes instructions operable to cause a computing system to receive a request, via a graphical user interface, requesting a screening design for an experiment. The computer-program product includes instructions operable to cause the computing system to obtain, for the screening design, multiple factors for screening in the experiment according to the screening design. A first factor of the multiple factors is a categorical factor with a first set of candidate inputs comprising at least three candidate inputs in the experiment. A second factor of the multiple factors is a continuous factor with a second set of candidate inputs comprising multiple candidate input options within one or more ranges for the second factor. The computer-program product includes instructions operable to cause the computing system to receive, via the graphical user interface, an indication of an initial run size that is a user-requested quantity of runs for the screening design. The computer-program product includes instructions operable to cause the computing system to generate the screening design based on the initial run size. The computer-program product includes instructions operable to cause the computing system to output the screening design. The screening design comprises multiple runs of a quantity based on the user-requested quantity of runs for the screening design. Each of the multiple runs individually define a respective single input for each of the multiple factors. The multiple runs collectively comprise all of the first set of candidate inputs and at least three inputs of the second set of candidate inputs.

In another example embodiment, a computing device is provided. The computing device includes a processor and memory. The memory contains instructions executable by the processor wherein the computing device is configured to receive a request, via a graphical user interface, requesting a screening design for an experiment. The computing device is configured to obtain, for the screening design, multiple factors for screening in the experiment according to the screening design. A first factor of the multiple factors is a categorical factor with a first set of candidate inputs comprising at least three candidate inputs in the experiment. A second factor of the multiple factors is a continuous factor with a second set of candidate inputs comprising multiple candidate input options within one or more ranges for the second factor. The computing device is configured to receive, via the graphical user interface, an indication of an initial run size that is a user-requested quantity of runs for the screening design. The computing device is configured to generate the screening design based on the initial run size. The computing device is configured to output the screening design. The screening design comprises multiple runs of a quantity based on the user-requested quantity of runs for the screening design. Each of the multiple runs individually define a respective single input for each of the multiple factors. The multiple runs collectively comprise all of the first set of candidate inputs and at least three inputs of the second set of candidate inputs.

In another example embodiment, a computer-implemented method is provided. The method includes receiving a request, via a graphical user interface, requesting a screening design for an experiment. The method includes obtaining, for the screening design, multiple factors for screening in the experiment according to the screening design. A first factor of the multiple factors is a categorical factor with a first set of candidate inputs comprising at least three candidate inputs in the experiment. A second factor of the multiple factors is a continuous factor with a second set of candidate inputs comprising multiple candidate input options within one or more ranges for the second factor. The method includes receiving, via the graphical user interface, an indication of an initial run size that is a user-requested quantity of runs for the screening design. The method includes generating the screening design based on the initial run size. The method includes outputting the screening design. The screening design comprises multiple runs of a quantity based on the user-requested quantity of runs for the screening design. Each of the multiple runs individually define a respective single input for each of the multiple factors. The multiple runs collectively comprise all of the first set of candidate inputs and at least three inputs of the second set of candidate inputs.

Other features and aspects of example embodiments are presented below in the Detailed Description when read in connection with the drawings presented with this application.

BRIEF DESCRIPTION OF THE DRAWINGS

FIG. 16 illustrates a definitive screening design according to at least one embodiment of the present technology.

FIG. 20 illustrates a mixed-level screening design where main effects in the design can be correlated with second-order effects according to at least one embodiment of the present technology.

FIG. 21 illustrates a mixed-level screening design where main effects in the design are orthogonal to the second-order effects from three-level continuous factors according to at least one embodiment of the present technology.

FIGS. 22A-22C illustrate mixed-level screening designs where main effects in the design are orthogonal to groups of second-order effects according to at least one embodiment of the present technology.

FIGS. 25A-25B illustrate a design evaluation of a screening design according to at least one embodiment of the present technology.

FIGS. 28-29 illustrate designs with factors with three or more levels according to at least one embodiment of the present technology.

FIGS. 31A-31B illustrate design diagnostics for designs with categorical and continuous factors according to at least one embodiment of the present technology.

DETAILED DESCRIPTION

In the following description, for the purposes of explanation, specific details are set forth in order to provide a thorough understanding of embodiments of the technology. However, it will be apparent that various embodiments may be practiced without these specific details. The figures and description are not intended to be restrictive.

The ensuing description provides example embodiments only, and is not intended to limit the scope, applicability, or configuration of the disclosure. Rather, the ensuing description of the example embodiments will provide those skilled in the art with an enabling description for implementing an example embodiment. It should be understood that various changes may be made in the function and arrangement of elements without departing from the spirit and scope of the technology as set forth in the appended claims.

Specific details are given in the following description to provide a thorough understanding of the embodiments. However, it will be understood by one of ordinary skill in the art that the embodiments may be practiced without these specific details. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional operations not included in a figure. A process may correspond to a method, a function, a procedure, a subroutine, a subprogram, etc. When a process corresponds to a function, its termination can correspond to a return of the function to the calling function or the main function.

Systems depicted in some of the figures may be provided in various configurations. In some embodiments, the systems may be configured as a distributed system where one or more components of the system are distributed across one or more networks in a cloud computing system.

Figure 1:
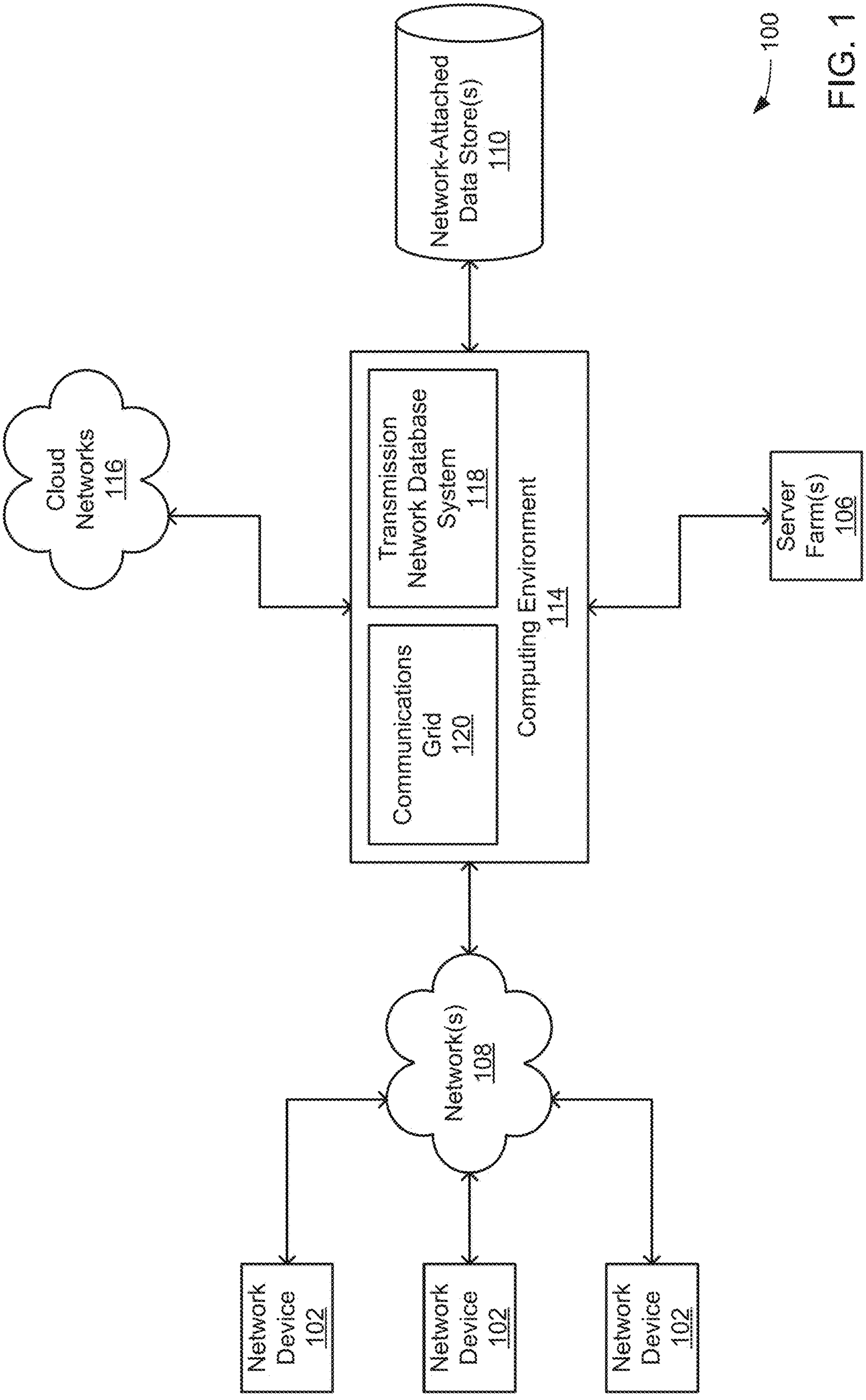
FIG. 1 illustrates a block diagram that provides an illustration of the hardware components of a computing system, according to some embodiments of the present technology.

FIG. 1 is a block diagram that provides an illustration of the hardware components of a data transmission network 100, according to embodiments of the present technology. Data transmission network 100 is a specialized computer system that may be used for processing large amounts of data where a large number of computer processing cycles are required.

Data transmission network 100 may also include computing environment 114. Computing environment 114 may be a specialized computer or other machine that processes the data received within the data transmission network 100. Data transmission network 100 also includes one or more network devices 102. Network devices 102 may include client devices that attempt to communicate with computing environment 114. For example, network devices 102 may send data to the computing environment 114 to be processed, may send signals to the computing environment 114 to control different aspects of the computing environment or the data it is processing, among other reasons. Network devices 102 may interact with the computing environment 114 through a number of ways, such as, for example, over one or more networks 108. As shown in FIG. 1, computing environment 114 may include one or more other systems. For example, computing environment 114 may include a database system 118 and/or a communications grid 120.

Figure 8:
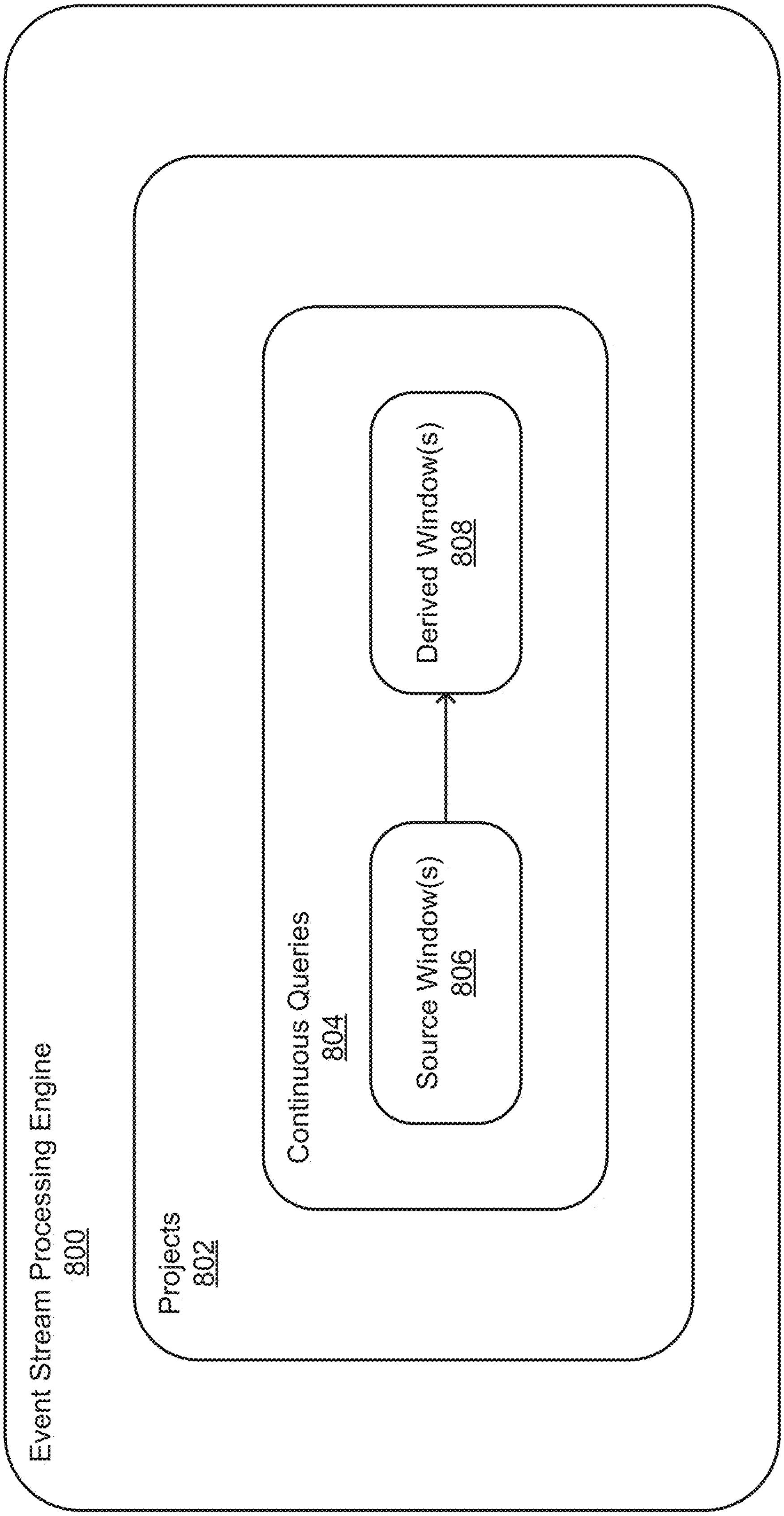
FIG. 8 illustrates a block diagram including components of an Event Stream Processing Engine (ESPE), according to embodiments of the present technology.
Figure 9:
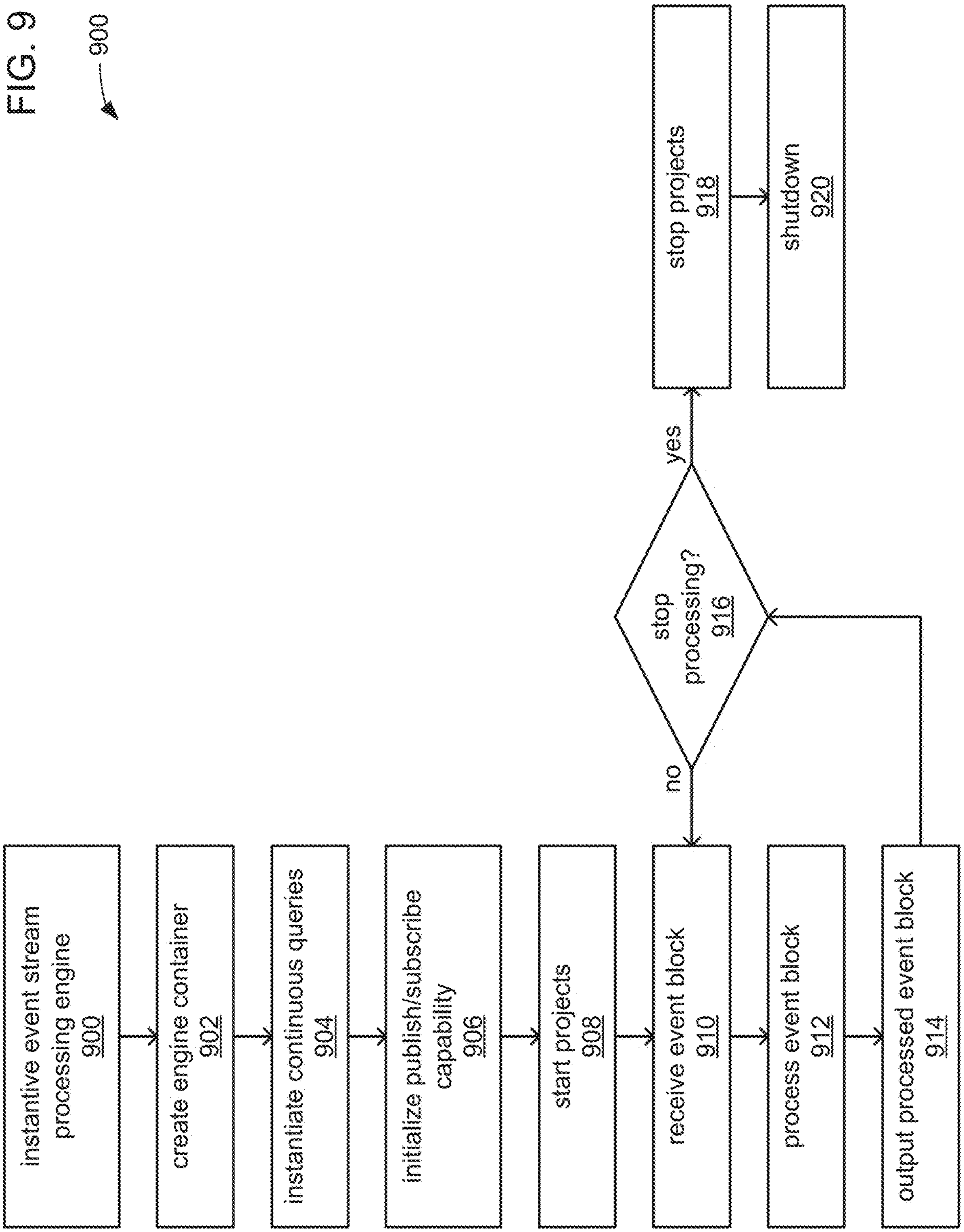
FIG. 9 illustrates a flow chart showing an example process including operations performed by an event stream processing engine, according to some embodiments of the present technology.
Figure 10:
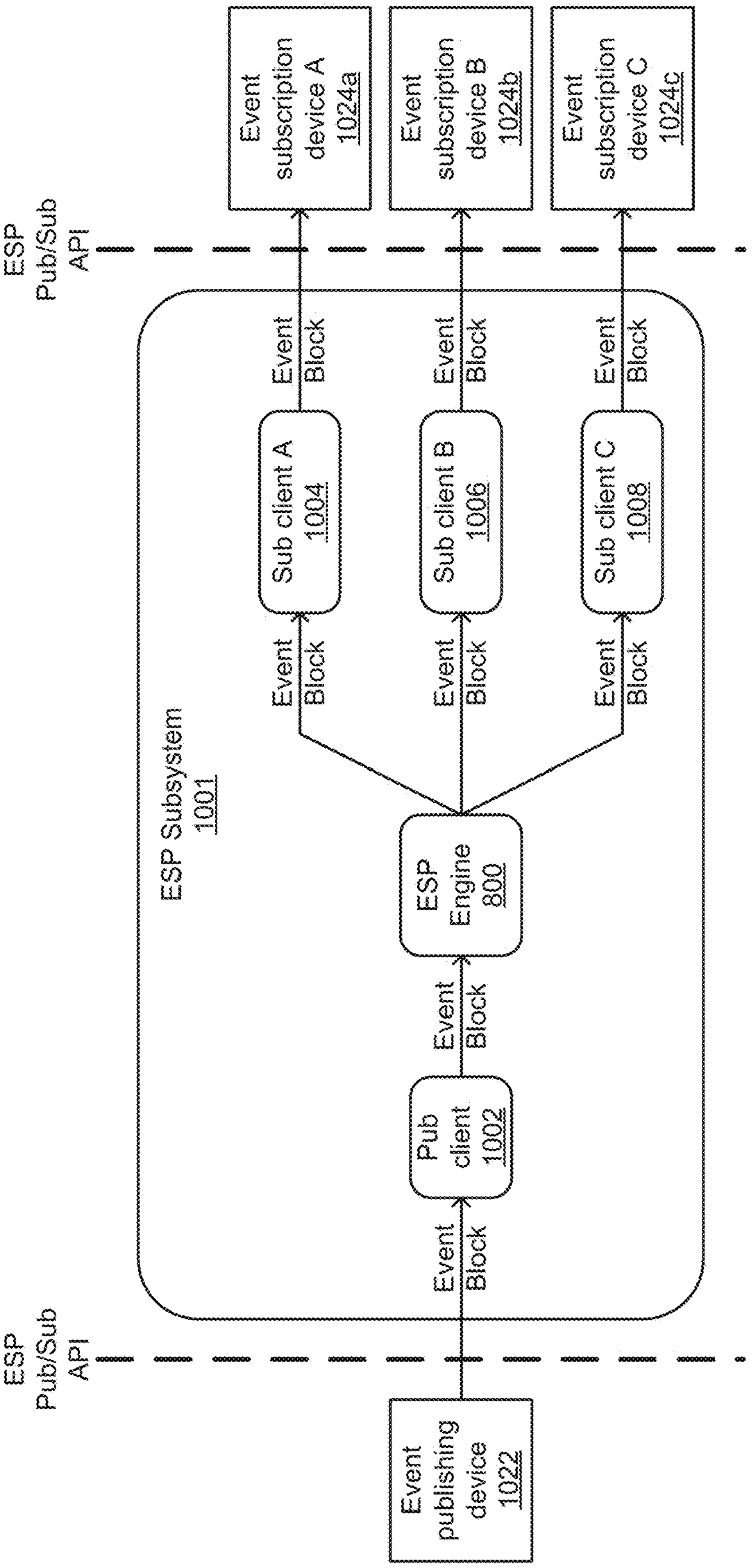
FIG. 10 illustrates an ESP system interfacing between a publishing device and multiple event subscribing devices, according to embodiments of the present technology.

In other embodiments, network devices may provide a large amount of data, either all at once or streaming over a period of time (e.g., using event stream processing (ESP), described further with respect to FIGS. 8-10), to the computing environment 114 via networks 108. For example, network devices 102 may include network computers, sensors, databases, or other devices that may transmit or otherwise provide data to computing environment 114. For example, network devices may include local area network devices, such as routers, hubs, switches, or other computer networking devices. These devices may provide a variety of stored or generated data, such as network data or data specific to the network devices themselves. Network devices may also include sensors that monitor their environment or other devices to collect data regarding that environment or those devices, and such network devices may provide data they collect over time. Network devices may also include devices within the internet of things, such as devices within a home automation network. Some of these devices may be referred to as edge devices, and may involve edge computing circuitry. Data may be transmitted by network devices directly to computing environment 114 or to network-attached data stores, such as network-attached data stores 110 for storage so that the data may be retrieved later by the computing environment 114 or other portions of data transmission network 100.

Data transmission network 100 may also include one or more network-attached data stores 110. Network-attached data stores 110 are used to store data to be processed by the computing environment 114 as well as any intermediate or final data generated by the computing system in non-volatile memory. However, in certain embodiments, the configuration of the computing environment 114 allows its operations to be performed such that intermediate and final data results can be stored solely in volatile memory (e.g., RAM), without a requirement that intermediate or final data results be stored to non-volatile types of memory (e.g., disk). This can be useful in certain situations, such as when the computing environment 114 receives ad hoc queries from a user and when responses, which are generated by processing large amounts of data, need to be generated on-the-fly. In this non-limiting situation, the computing environment 114 may be configured to retain the processed information within memory so that responses can be generated for the user at different levels of detail as well as allow a user to interactively query against this information.

Network-attached data stores may store a variety of different types of data organized in a variety of different ways and from a variety of different sources. For example, network-attached data storage may include storage other than primary storage located within computing environment 114 that is directly accessible by processors located therein. Network-attached data storage may include secondary, tertiary or auxiliary storage, such as large hard drives, servers, virtual memory, among other types. Storage devices may include portable or non-portable storage devices, optical storage devices, and various other mediums capable of storing/containing data. A machine-readable storage medium or computer-readable storage medium may include a non-transitory medium in which data can be stored and that does not include carrier waves and/or transitory electronic signals. Examples of a non-transitory medium may include, for example, a magnetic disk or tape, optical storage media such as compact disk or digital versatile disk, flash memory, memory or memory devices. A computer-program product may include code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, among others. Furthermore, the data stores may hold a variety of different types of data. For example, network-attached data stores 110 may hold unstructured (e.g., raw) data, such as manufacturing data (e.g., a database containing records identifying products being manufactured with parameter data for each product, such as colors and models) or product sales databases (e.g., a database containing individual data records identifying details of individual product sales).

The unstructured data may be presented to the computing environment 114 in different forms such as a flat file or a conglomerate of data records and may have data values and accompanying time stamps. The computing environment 114 may be used to analyze the unstructured data in a variety of ways to determine the best way to structure (e.g., hierarchically) that data, such that the structured data is tailored to a type of further analysis that a user wishes to perform on the data. For example, after being processed, the unstructured time stamped data may be aggregated by time (e.g., into daily time period units) to generate time series data and/or structured hierarchically according to one or more dimensions (e.g., parameters, attributes, and/or variables). For example, data may be stored in a hierarchical data structure, such as a ROLAP OR MOLAP database, or may be stored in another tabular form, such as in a flat-hierarchy form.

Data transmission network 100 may also include one or more server farms 106. Computing environment 114 may route select communications or data to the one or more sever farms 106 or one or more servers within the server farms. Server farms 106 can be configured to provide information in a predetermined manner. For example, server farms 106 may access data to transmit in response to a communication. Server farms 106 may be separately housed from each other device within data transmission network 100, such as computing environment 114, and/or may be part of a device or system.

Server farms 106 may host a variety of different types of data processing as part of data transmission network 100. Server farms 106 may receive a variety of different data from network devices, from computing environment 114, from cloud network 116, or from other sources. The data may have been obtained or collected from one or more sensors, as inputs from a control database, or may have been received as inputs from an external system or device. Server farms 106 may assist in processing the data by turning raw data into processed data based on one or more rules implemented by the server farms. For example, sensor data may be analyzed to determine changes in an environment over time or in real-time.

Data transmission network 100 may also include one or more cloud networks 116. Cloud network 116 may include a cloud infrastructure system that provides cloud services. In certain embodiments, services provided by the cloud network 116 may include a host of services that are made available to users of the cloud infrastructure system on demand. Cloud network 116 is shown in FIG. 1 as being connected to computing environment 114 (and therefore having computing environment 114 as its client or user), but cloud network 116 may be connected to or utilized by any of the devices in FIG. 1. Services provided by the cloud network can dynamically scale to meet the needs of its users. The cloud network 116 may include one or more computers, servers, and/or systems. In some embodiments, the computers, servers, and/or systems that make up the cloud network 116 are different from the user's own on-premises computers, servers, and/or systems. For example, the cloud network 116 may host an application, and a user may, via a communication network such as the Internet, on demand, order and use the application.

While each device, server and system in FIG. 1 is shown as a single device, it will be appreciated that multiple devices may instead be used. For example, a set of network devices can be used to transmit various communications from a single user, or remote server 140 may include a server stack. As another example, data may be processed as part of computing environment 114.

Each communication within data transmission network 100 (e.g., between client devices, between servers 106 and computing environment 114 or between a server and a device) may occur over one or more networks 108. Networks 108 may include one or more of a variety of different types of networks, including a wireless network, a wired network, or a combination of a wired and wireless network. Examples of suitable networks include the Internet, a personal area network, a local area network (LAN), a wide area network (WAN), or a wireless local area network (WLAN). A wireless network may include a wireless interface or combination of wireless interfaces. As an example, a network in the one or more networks 108 may include a short-range communication channel, such as a BLUETOOTH® communication channel or a BLUETOOTH® Low Energy communication channel. A wired network may include a wired interface. The wired and/or wireless networks may be implemented using routers, access points, bridges, gateways, or the like, to connect devices in the network 114, as will be further described with respect to FIG. 2. The one or more networks 108 can be incorporated entirely within or can include an intranet, an extranet, or a combination thereof. In one embodiment, communications between two or more systems and/or devices can be achieved by a secure communications protocol, such as secure sockets layer (SSL) or transport layer security (TLS). In addition, data and/or transactional details may be encrypted.

Some aspects may utilize the Internet of Things (IoT), where things (e.g., machines, devices, phones, sensors) can be connected to networks and the data from these things can be collected and processed within the things and/or external to the things. For example, the IoT can include sensors in many different devices, and high value analytics can be applied to identify hidden relationships and drive increased efficiencies. This can apply to both big data analytics and real-time (e.g., ESP) analytics. This will be described further below with respect to FIG. 2.

As noted, computing environment 114 may include a communications grid 120 and a transmission network database system 118. Communications grid 120 may be a grid-based computing system for processing large amounts of data. The transmission network database system 118 may be for managing, storing, and retrieving large amounts of data that are distributed to and stored in the one or more network-attached data stores 110 or other data stores that reside at different locations within the transmission network database system 118. The compute nodes in the grid-based computing system 120 and the transmission network database system 118 may share the same processor hardware, such as processors that are located within computing environment 114.

Figure 2:
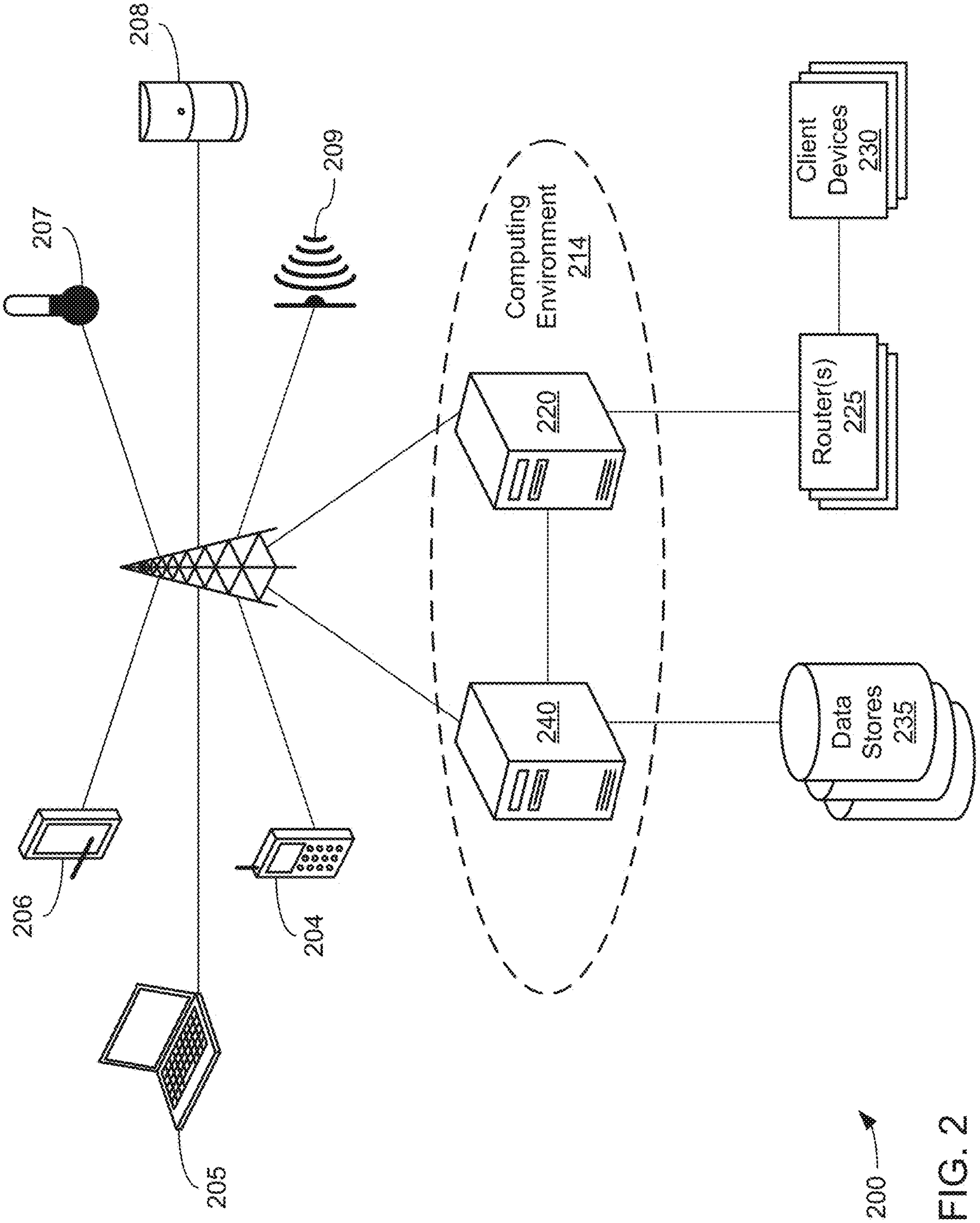
FIG. 2 illustrates an example network including an example set of devices communicating with each other over an exchange system and via a network, according to some embodiments of the present technology.

FIG. 2 illustrates an example network including an example set of devices communicating with each other over an exchange system and via a network, according to embodiments of the present technology. As noted, each communication within data transmission network 100 may occur over one or more networks. System 200 includes a network device 204 configured to communicate with a variety of types of client devices, for example client devices 230, over a variety of types of communication channels.

As shown in FIG. 2, network device 204 can transmit a communication over a network (e.g., a cellular network via a base station 210). The communication can be routed to another network device, such as network devices 205-209, via base station 210. The communication can also be routed to computing environment 214 via base station 210. For example, network device 204 may collect data either from its surrounding environment or from other network devices (such as network devices 205-209) and transmit that data to computing environment 214.

Although network devices 204-209 are shown in FIG. 2 as a mobile phone, laptop computer, tablet computer, temperature sensor, motion sensor, and audio sensor respectively, the network devices may be or include sensors that are sensitive to detecting aspects of their environment. For example, the network devices may include sensors such as water sensors, power sensors, electrical current sensors, chemical sensors, optical sensors, pressure sensors, geographic or position sensors (e.g., GPS), velocity sensors, acceleration sensors, flow rate sensors, among others. Examples of characteristics that may be sensed include force, torque, load, strain, position, temperature, air pressure, fluid flow, chemical properties, resistance, electromagnetic fields, radiation, irradiance, proximity, acoustics, moisture, distance, speed, vibrations, acceleration, electrical potential, and electrical current, among others. The sensors may be mounted to various components used as part of a variety of different types of systems (e.g., an oil drilling operation). The network devices may detect and record data related to the environment that it monitors, and transmit that data to computing environment 214.

As noted, one type of system that may include various sensors that collect data to be processed and/or transmitted to a computing environment according to certain embodiments includes an oil drilling system. For example, the one or more drilling operation sensors may include surface sensors that measure a hook load, a fluid rate, a temperature and a density in and out of the wellbore, a standpipe pressure, a surface torque, a rotation speed of a drill pipe, a rate of penetration, a mechanical specific energy, etc. and downhole sensors that measure a rotation speed of a bit, fluid densities, downhole torque, downhole vibration (axial, tangential, lateral), a weight applied at a drill bit, an annular pressure, a differential pressure, an azimuth, an inclination, a dog leg severity, a measured depth, a vertical depth, a downhole temperature, etc. Besides the raw data collected directly by the sensors, other data may include parameters either developed by the sensors or assigned to the system by a client or other controlling device. For example, one or more drilling operation control parameters may control settings such as a mud motor speed to flow ratio, a bit diameter, a predicted formation top, seismic data, weather data, etc. Other data may be generated using physical models such as an earth model, a weather model, a seismic model, a bottom hole assembly model, a well plan model, an annular friction model, etc. In addition to sensor and control settings, predicted outputs, of for example, the rate of penetration, mechanical specific energy, hook load, flow in fluid rate, flow out fluid rate, pump pressure, surface torque, rotation speed of the drill pipe, annular pressure, annular friction pressure, annular temperature, equivalent circulating density, etc. may also be stored in the data warehouse.

In another example, another type of system that may include various sensors that collect data to be processed and/or transmitted to a computing environment according to certain embodiments includes a home automation or similar automated network in a different environment, such as an office space, school, public space, sports venue, or a variety of other locations. Network devices in such an automated network may include network devices that allow a user to access, control, and/or configure various home appliances located within the user's home (e.g., a television, radio, light, fan, humidifier, sensor, microwave, iron, and/or the like), or outside of the user's home (e.g., exterior motion sensors, exterior lighting, garage door openers, sprinkler systems, or the like). For example, network device 102 may include a home automation switch that may be coupled with a home appliance. In another embodiment, a network device can allow a user to access, control, and/or configure devices, such as office-related devices (e.g., copy machine, printer, or fax machine), audio and/or video related devices (e.g., a receiver, a speaker, a projector, a DVD player, or a television), media-playback devices (e.g., a compact disc player, a CD player, or the like), computing devices (e.g., a home computer, a laptop computer, a tablet, a personal digital assistant (PDA), a computing device, or a wearable device), lighting devices (e.g., a lamp or recessed lighting), devices associated with a security system, devices associated with an alarm system, devices that can be operated in an automobile (e.g., radio devices, navigation devices), and/or the like. Data may be collected from such various sensors in raw form, or data may be processed by the sensors to create parameters or other data either developed by the sensors based on the raw data or assigned to the system by a client or other controlling device.

In another example, another type of system that may include various sensors that collect data to be processed and/or transmitted to a computing environment according to certain embodiments includes a power or energy grid. A variety of different network devices may be included in an energy grid, such as various devices within one or more power plants, energy farms (e.g., wind farm, solar farm, among others) energy storage facilities, factories, homes and businesses of consumers, among others. One or more of such devices may include one or more sensors that detect energy gain or loss, electrical input or output or loss, and a variety of other efficiencies. These sensors may collect data to inform users of how the energy grid, and individual devices within the grid, may be functioning and how they may be made more efficient.

Network device sensors may also perform processing on data it collects before transmitting the data to the computing environment 114, or before deciding whether to transmit data to the computing environment 114. For example, network devices may determine whether data collected meets certain rules, for example by comparing data or values calculated from the data and comparing that data to one or more thresholds. The network device may use this data and/or comparisons to determine if the data should be transmitted to the computing environment 214 for further use or processing.

Computing environment 214 may include machines 220 and 240. Although computing environment 214 is shown in FIG. 2 as having two machines, 220 and 240, computing environment 214 may have only one machine or may have more than two machines. The machines that make up computing environment 214 may include specialized computers, servers, or other machines that are configured to individually and/or collectively process large amounts of data. The computing environment 214 may also include storage devices that include one or more databases of structured data, such as data organized in one or more hierarchies, or unstructured data. The databases may communicate with the processing devices within computing environment 214 to distribute data to them. Since network devices may transmit data to computing environment 214, that data may be received by the computing environment 214 and subsequently stored within those storage devices. Data used by computing environment 214 may also be stored in data stores 235, which may also be a part of or connected to computing environment 214.

Computing environment 214 can communicate with various devices via one or more routers 225 or other inter-network or intra-network connection components. For example, computing environment 214 may communicate with devices 230 via one or more routers 225. Computing environment 214 may collect, analyze and/or store data from or pertaining to communications, client device operations, client rules, and/or user-associated actions stored at one or more data stores 235. Such data may influence communication routing to the devices within computing environment 214, how data is stored or processed within computing environment 214, among other actions.

Notably, various other devices can further be used to influence communication routing and/or processing between devices within computing environment 214 and with devices outside of computing environment 214. For example, as shown in FIG. 2, computing environment 214 may include a web server 240. Thus, computing environment 214 can retrieve data of interest, such as client information (e.g., product information, client rules, etc.), technical product details, news, current or predicted weather, and so on.

In addition to computing environment 214 collecting data (e.g., as received from network devices, such as sensors, and client devices or other sources) to be processed as part of a big data analytics project, it may also receive data in real time as part of a streaming analytics environment. As noted, data may be collected using a variety of sources as communicated via different kinds of networks or locally. Such data may be received on a real-time streaming basis. For example, network devices may receive data periodically from network device sensors as the sensors continuously sense, monitor and track changes in their environments. Devices within computing environment 214 may also perform pre-analysis on data it receives to determine if the data received should be processed as part of an ongoing project. The data received and collected by computing environment 214, no matter what the source or method or timing of receipt, may be processed over a period of time for a client to determine results data based on the client's needs and rules.

Figure 3:
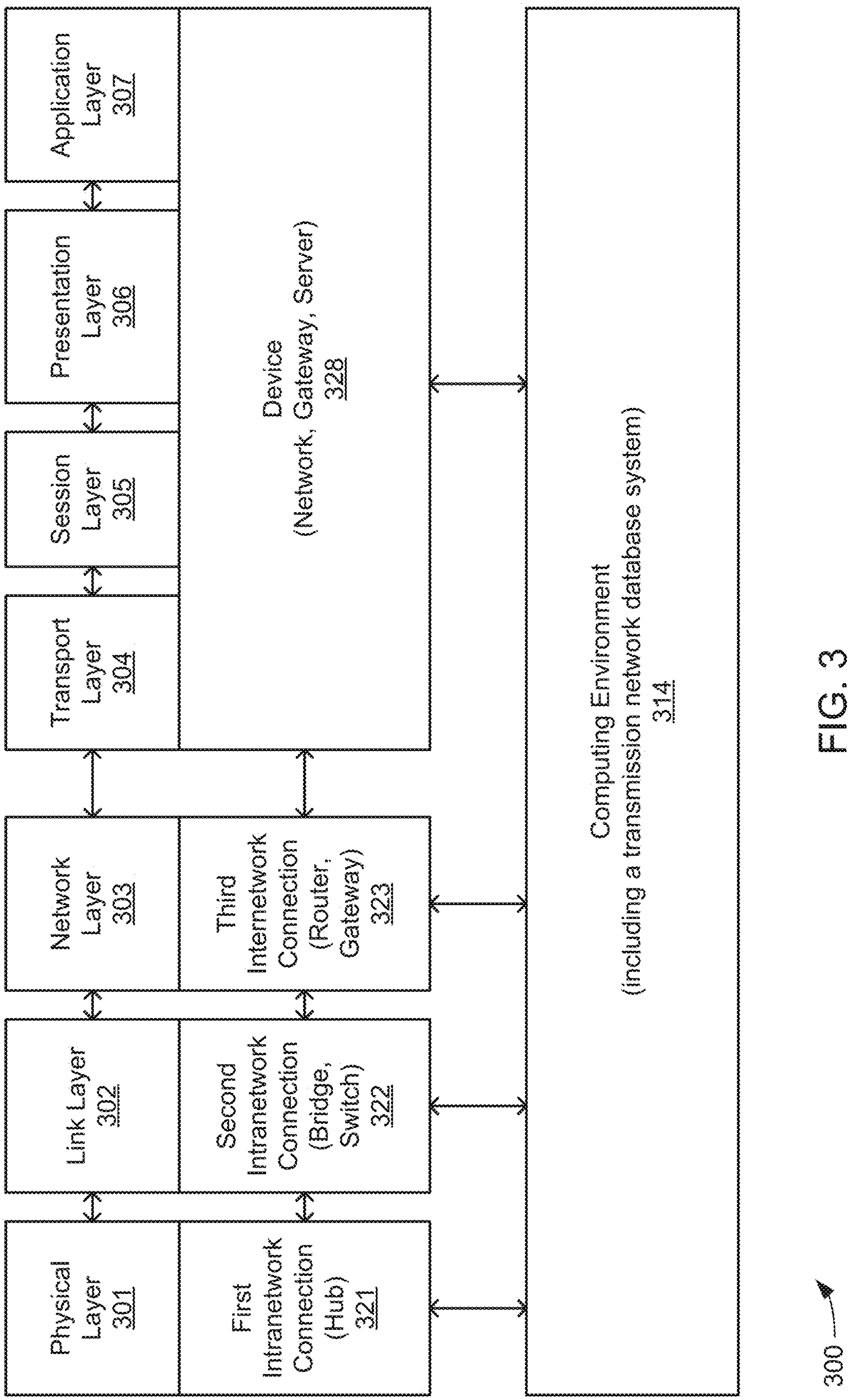
FIG. 3 illustrates a representation of a conceptual model of a communications protocol system, according to some embodiments of the present technology.

FIG. 3 illustrates a representation of a conceptual model of a communications protocol system, according to embodiments of the present technology. More specifically, FIG. 3 identifies operation of a computing environment in an Open Systems Interaction model that corresponds to various connection components. The model 300 shows, for example, how a computing environment, such as computing environment 314 (or computing environment 214 in FIG. 2) may communicate with other devices in its network, and control how communications between the computing environment and other devices are executed and under what conditions.

The model can include layers 301-307. The layers are arranged in a stack. Each layer in the stack serves the layer one level higher than it (except for the application layer, which is the highest layer), and is served by the layer one level below it (except for the physical layer, which is the lowest layer). The physical layer is the lowest layer because it receives and transmits raw bites of data and is the farthest layer from the user in a communications system. On the other hand, the application layer is the highest layer because it interacts directly with a software application.

As noted, the model includes a physical layer 301. Physical layer 301 represents physical communication and can define parameters of that physical communication. For example, such physical communication may come in the form of electrical, optical, or electromagnetic signals. Physical layer 301 also defines protocols that may control communications within a data transmission network.

Link layer 302 defines links and mechanisms used to transmit (i.e., move) data across a network. The link layer 302 manages node-to-node communications, such as within a grid computing environment. Link layer 302 can detect and correct errors (e.g., transmission errors in the physical layer 301). Link layer 302 can also include a media access control (MAC) layer and logical link control (LLC) layer.

Network layer 303 defines the protocol for routing within a network. In other words, the network layer coordinates transferring data across nodes in a same network (e.g., such as a grid computing environment). Network layer 303 can also define the processes used to structure local addressing within the network.

Transport layer 304 can manage the transmission of data and the quality of the transmission and/or receipt of that data. Transport layer 304 can provide a protocol for transferring data, such as, for example, a Transmission Control Protocol (TCP). Transport layer 304 can assemble and disassemble data frames for transmission. The transport layer can also detect transmission errors occurring in the layers below it.

Session layer 305 can establish, maintain, and manage communication connections between devices on a network. In other words, the session layer controls the dialogues or nature of communications between network devices on the network. The session layer may also establish checkpointing, adjournment, termination, and restart procedures.

Presentation layer 306 can provide translation for communications between the application and network layers. In other words, this layer may encrypt, decrypt and/or format data based on data types and/or encodings known to be accepted by an application or network layer.

Application layer 307 interacts directly with software applications and end users and manages communications between them. Application layer 307 can identify destinations, local resource states or availability and/or communication content or formatting using the applications.

Intra-network connection components 321 and 322 are shown to operate in lower levels, such as physical layer 301 and link layer 302, respectively. For example, a hub can operate in the physical layer, a switch can operate in the link layer, and a router can operate in the network layer. Inter-network connection components 323 and 328 are shown to operate on higher levels, such as layers 303-307. For example, routers can operate in the network layer and network devices can operate in the transport, session, presentation, and application layers.

As noted, a computing environment 314 can interact with and/or operate on, in various embodiments, one, more, all or any of the various layers. For example, computing environment 314 can interact with a hub (e.g., via the link layer) so as to adjust which devices the hub communicates with. The physical layer may be served by the link layer, so it may implement such data from the link layer. For example, the computing environment 314 may control which devices it will receive data from. For example, if the computing environment 314 knows that a certain network device has turned off, broken, or otherwise become unavailable or unreliable, the computing environment 314 may instruct the hub to prevent any data from being transmitted to the computing environment 314 from that network device. Such a process may be beneficial to avoid receiving data that is inaccurate or that has been influenced by an uncontrolled environment. As another example, computing environment 314 can communicate with a bridge, switch, router or gateway and influence which device within the system (e.g., system 200) the component selects as a destination. In some embodiments, computing environment 314 can interact with various layers by exchanging communications with equipment operating on a particular layer by routing or modifying existing communications. In another embodiment, such as in a grid computing environment, a node may determine how data within the environment should be routed (e.g., which node should receive certain data) based on certain parameters or information provided by other layers within the model.

As noted, the computing environment 314 may be a part of a communications grid environment, the communications of which may be implemented as shown in the protocol of FIG. 3. For example, referring back to FIG. 2, one or more of machines 220 and 240 may be part of a communications grid computing environment. A gridded computing environment may be employed in a distributed system with non-interactive workloads where data resides in memory on the machines, or compute nodes. In such an environment, analytic code, instead of a database management system, controls the processing performed by the nodes. Data is co-located by pre-distributing it to the grid nodes, and the analytic code on each node loads the local data into memory. Each node may be assigned a particular task such as a portion of a processing project, or to organize or control other nodes within the grid.

Figure 4:
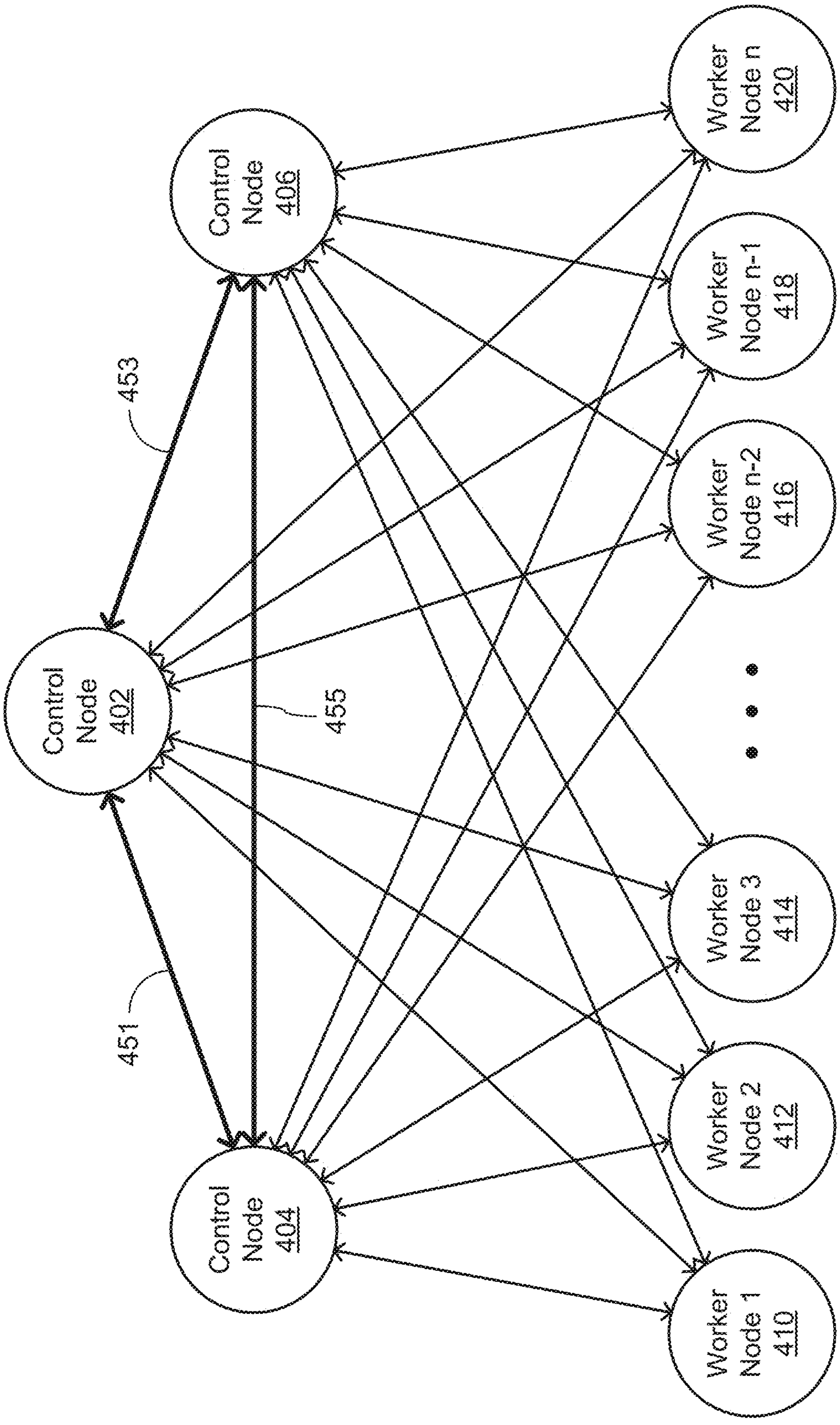
FIG. 4 illustrates a communications grid computing system including a variety of control and worker nodes, according to some embodiments of the present technology.

FIG. 4 illustrates a communications grid computing system 400 including a variety of control and worker nodes, according to embodiments of the present technology. Communications grid computing system 400 includes three control nodes and one or more worker nodes. Communications grid computing system 400 includes control nodes 402, 404, and 406. The control nodes are communicatively connected via communication paths 451, 453, and 455. Therefore, the control nodes may transmit information (e.g., related to the communications grid or notifications), to and receive information from each other. Although communications grid computing system 400 is shown in FIG. 4 as including three control nodes, the communications grid may include more or less than three control nodes.

Communications grid computing system (or just "communications grid") 400 also includes one or more worker nodes. Shown in FIG. 4 are six worker nodes 410-420. Although FIG. 4 shows six worker nodes, a communications grid according to embodiments of the present technology may include more or less than six worker nodes. The number of worker nodes included in a communications grid may be dependent upon how large the project or data set is being processed by the communications grid, the capacity of each worker node, the time designated for the communications grid to complete the project, among others. Each worker node within the communications grid 400 may be connected (wired or wirelessly, and directly or indirectly) to control nodes 402-406. Therefore, each worker node may receive information from the control nodes (e.g., an instruction to perform work on a project) and may transmit information to the control nodes (e.g., a result from work performed on a project). Furthermore, worker nodes may communicate with each other (either directly or indirectly). For example, worker nodes may transmit data between each other related to a job being performed or an individual task within a job being performed by that worker node. However, in certain embodiments, worker nodes may not, for example, be connected (communicatively or otherwise) to certain other worker nodes. In an embodiment, worker nodes may only be able to communicate with the control node that controls it and may not be able to communicate with other worker nodes in the communications grid, whether they are other worker nodes controlled by the control node that controls the worker node, or worker nodes that are controlled by other control nodes in the communications grid.

A control node may connect with an external device with which the control node may communicate (e.g., a grid user, such as a server or computer, may connect to a controller of the grid). For example, a server or computer may connect to control nodes and may transmit a project or job to the node. The project may include a data set. The data set may be of any size. Once the control node receives such a project including a large data set, the control node may distribute the data set or projects related to the data set to be performed by worker nodes. Alternatively, for a project including a large data set, the data set may be received or stored by a machine other than a control node (e.g., a HADOOP® standard-compliant data node employing the HADOOP@Distributed File System, or HDFS).

Control nodes may maintain knowledge of the status of the nodes in the grid (i.e., grid status information), accept work requests from clients, subdivide the work across worker nodes, and coordinate the worker nodes, among other responsibilities. Worker nodes may accept work requests from a control node and provide the control node with results of the work performed by the worker node. A grid may be started from a single node (e.g., a machine, computer, server, etc.). This first node may be assigned or may start as the primary control node that will control any additional nodes that enter the grid.

When a project is submitted for execution (e.g., by a client or a controller of the grid) it may be assigned to a set of nodes. After the nodes are assigned to a project, a data structure (i.e., a communicator) may be created. The communicator may be used by the project for information to be shared between the project codes running on each node. A communication handle may be created on each node. A handle, for example, is a reference to the communicator that is valid within a single process on a single node, and the handle may be used when requesting communications between nodes.

A control node, such as control node 402, may be designated as the primary control node. A server, computer or other external device may connect to the primary control node. Once the control node receives a project, the primary control node may distribute portions of the project to its worker nodes for execution. For example, when a project is initiated on communications grid 400, primary control node 402 controls the work to be performed for the project in order to complete the project as requested or instructed. The primary control node may distribute work to the worker nodes based on various factors, such as which subsets or portions of projects may be completed most efficiently and in the correct amount of time. For example, a worker node may perform analysis on a portion of data that is already local (e.g., stored on) the worker node. The primary control node also coordinates and processes the results of the work performed by each worker node after each worker node executes and completes its job. For example, the primary control node may receive a result from one or more worker nodes, and the control node may organize (e.g., collect and assemble) the results received and compile them to produce a complete result for the project received from the end user.

Any remaining control nodes, such as control nodes 404 and 406, may be assigned as backup control nodes for the project. In an embodiment, backup control nodes may not control any portion of the project. Instead, backup control nodes may serve as a backup for the primary control node and take over as primary control node if the primary control node were to fail. If a communications grid were to include only a single control node, and the control node were to fail (e.g., the control node is shut off or breaks) then the communications grid as a whole may fail and any project or job being run on the communications grid may fail and may not complete. While the project may be run again, such a failure may cause a delay (severe delay in some cases, such as overnight delay) in completion of the project. Therefore, a grid with multiple control nodes, including a backup control node, may be beneficial.

To add another node or machine to the grid, the primary control node may open a pair of listening sockets, for example. A socket may be used to accept work requests from clients, and the second socket may be used to accept connections from other grid nodes. The primary control node may be provided with a list of other nodes (e.g., other machines, computers, servers) that will participate in the grid, and the role that each node will fill in the grid. Upon startup of the primary control node (e.g., the first node on the grid), the primary control node may use a network protocol to start the server process on every other node in the grid. Command line parameters, for example, may inform each node of one or more pieces of information, such as: the role that the node will have in the grid, the host name of the primary control node, the port number on which the primary control node is accepting connections from peer nodes, among others. The information may also be provided in a configuration file, transmitted over a secure shell tunnel, recovered from a configuration server, among others. While the other machines in the grid may not initially know about the configuration of the grid, that information may also be sent to each other node by the primary control node. Updates of the grid information may also be subsequently sent to those nodes.

For any control node other than the primary control node added to the grid, the control node may open three sockets. The first socket may accept work requests from clients, the second socket may accept connections from other grid members, and the third socket may connect (e.g., permanently) to the primary control node. When a control node (e.g., primary control node) receives a connection from another control node, it first checks to see if the peer node is in the list of configured nodes in the grid. If it is not on the list, the control node may clear the connection. If it is on the list, it may then attempt to authenticate the connection. If authentication is successful, the authenticating node may transmit information to its peer, such as the port number on which a node is listening for connections, the host name of the node, information about how to authenticate the node, among other information. When a node, such as the new control node, receives information about another active node, it will check to see if it already has a connection to that other node. If it does not have a connection to that node, it may then establish a connection to that control node.

Any worker node added to the grid may establish a connection to the primary control node and any other control nodes on the grid. After establishing the connection, it may authenticate itself to the grid (e.g., any control nodes, including both primary and backup, or a server or user controlling the grid). After successful authentication, the worker node may accept configuration information from the control node.

When a node joins a communications grid (e.g., when the node is powered on or connected to an existing node on the grid or both), the node is assigned (e.g., by an operating system of the grid) a universally unique identifier (UUID). This unique identifier may help other nodes and external entities (devices, users, etc.) to identify the node and distinguish it from other nodes. When a node is connected to the grid, the node may share its unique identifier with the other nodes in the grid. Since each node may share its unique identifier, each node may know the unique identifier of every other node on the grid. Unique identifiers may also designate a hierarchy of each of the nodes (e.g., backup control nodes) within the grid. For example, the unique identifiers of each of the backup control nodes may be stored in a list of backup control nodes to indicate an order in which the backup control nodes will take over for a failed primary control node to become a new primary control node. However, a hierarchy of nodes may also be determined using methods other than using the unique identifiers of the nodes. For example, the hierarchy may be predetermined, or may be assigned based on other predetermined factors.

The grid may add new machines at any time (e.g., initiated from any control node). Upon adding a new node to the grid, the control node may first add the new node to its table of grid nodes. The control node may also then notify every other control node about the new node. The nodes receiving the notification may acknowledge that they have updated their configuration information.

Primary control node 402 may, for example, transmit one or more communications to backup control nodes 404 and 406 (and, for example, to other control or worker nodes within the communications grid). Such communications may be sent periodically, at fixed time intervals, between known fixed stages of the project's execution, among other protocols. The communications transmitted by primary control node 402 may be of varied types and may include a variety of types of information. For example, primary control node 402 may transmit snapshots (e.g., status information) of the communications grid so that backup control node 404 always has a recent snapshot of the communications grid. The snapshot or grid status may include, for example, the structure of the grid (including, for example, the worker nodes in the grid, unique identifiers of the nodes, or their relationships with the primary control node) and the status of a project (including, for example, the status of each worker node's portion of the project). The snapshot may also include analysis or results received from worker nodes in the communications grid. The backup control nodes may receive and store the backup data received from the primary control node. The backup control nodes may transmit a request for such a snapshot (or other information) from the primary control node, or the primary control node may send such information periodically to the backup control nodes.

As noted, the backup data may allow the backup control node to take over as primary control node if the primary control node fails without requiring the grid to start the project over from scratch. If the primary control node fails, the backup control node that will take over as primary control node may retrieve the most recent version of the snapshot received from the primary control node and use the snapshot to continue the project from the stage of the project indicated by the backup data. This may prevent failure of the project as a whole.

A backup control node may use various methods to determine that the primary control node has failed. In one example of such a method, the primary control node may transmit (e.g., periodically) a communication to the backup control node that indicates that the primary control node is working and has not failed, such as a heartbeat communication. The backup control node may determine that the primary control node has failed if the backup control node has not received a heartbeat communication for a certain predetermined period of time. Alternatively, a backup control node may also receive a communication from the primary control node itself (before it failed) or from a worker node that the primary control node has failed, for example because the primary control node has failed to communicate with the worker node.

Different methods may be performed to determine which backup control node of a set of backup control nodes (e.g., backup control nodes 404 and 406) will take over for failed primary control node 402 and become the new primary control node. For example, the new primary control node may be chosen based on a ranking or "hierarchy" of backup control nodes based on their unique identifiers. In an alternative embodiment, a backup control node may be assigned to be the new primary control node by another device in the communications grid or from an external device (e.g., a system infrastructure or an end user, such as a server or computer, controlling the communications grid). In another alternative embodiment, the backup control node that takes over as the new primary control node may be designated based on bandwidth or other statistics about the communications grid.

A worker node within the communications grid may also fail. If a worker node fails, work being performed by the failed worker node may be redistributed amongst the operational worker nodes. In an alternative embodiment, the primary control node may transmit a communication to each of the operable worker nodes still on the communications grid that each of the worker nodes should purposefully fail also. After each of the worker nodes fail, they may each retrieve their most recent saved checkpoint of their status and re-start the project from that checkpoint to minimize lost progress on the project being executed.

Figure 5:
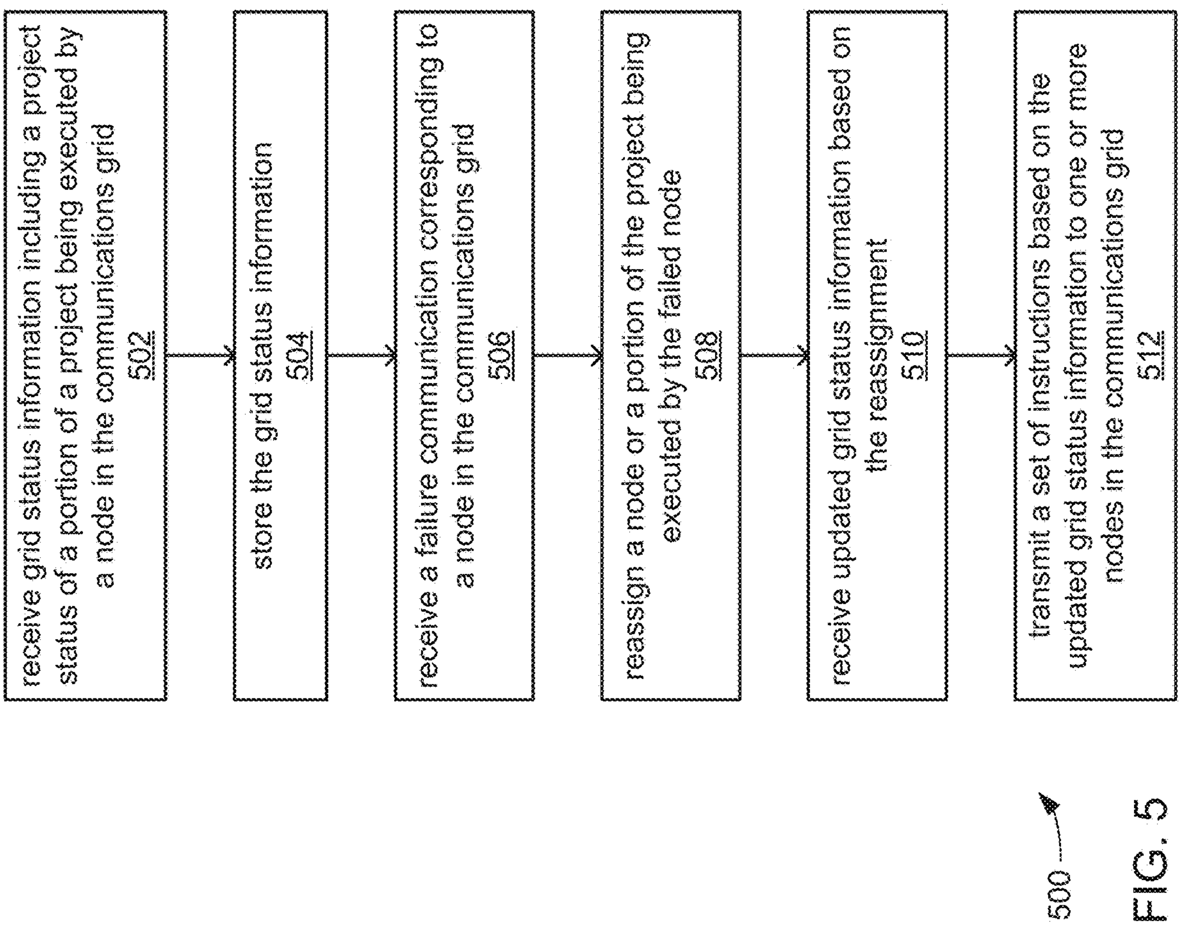
FIG. 5 illustrates a flow chart showing an example process for adjusting a communications grid or a work project in a communications grid after a failure of a node, according to some embodiments of the present technology.

FIG. 5 illustrates a flow chart showing an example process 500 for adjusting a communications grid or a work project in a communications grid after a failure of a node, according to embodiments of the present technology. The process may include, for example, receiving grid status information including a project status of a portion of a project being executed by a node in the communications grid, as described in operation 502. For example, a control node (e.g., a backup control node connected to a primary control node and a worker node on a communications grid) may receive grid status information, where the grid status information includes a project status of the primary control node or a project status of the worker node. The project status of the primary control node and the project status of the worker node may include a status of one or more portions of a project being executed by the primary and worker nodes in the communications grid. The process may also include storing the grid status information, as described in operation 504. For example, a control node (e.g., a backup control node) may store the received grid status information locally within the control node. Alternatively, the grid status information may be sent to another device for storage where the control node may have access to the information.

The process may also include receiving a failure communication corresponding to a node in the communications grid in operation 506. For example, a node may receive a failure communication including an indication that the primary control node has failed, prompting a backup control node to take over for the primary control node. In an alternative embodiment, a node may receive a failure that a worker node has failed, prompting a control node to reassign the work being performed by the worker node. The process may also include reassigning a node or a portion of the project being executed by the failed node, as described in operation 508. For example, a control node may designate the backup control node as a new primary control node based on the failure communication upon receiving the failure communication. If the failed node is a worker node, a control node may identify a project status of the failed worker node using the snapshot of the communications grid, where the project status of the failed worker node includes a status of a portion of the project being executed by the failed worker node at the failure time.

The process may also include receiving updated grid status information based on the reassignment, as described in operation 510, and transmitting a set of instructions based on the updated grid status information to one or more nodes in the communications grid, as described in operation 512. The updated grid status information may include an updated project status of the primary control node or an updated project status of the worker node. The updated information may be transmitted to the other nodes in the grid to update their stale stored information.

Figure 6:
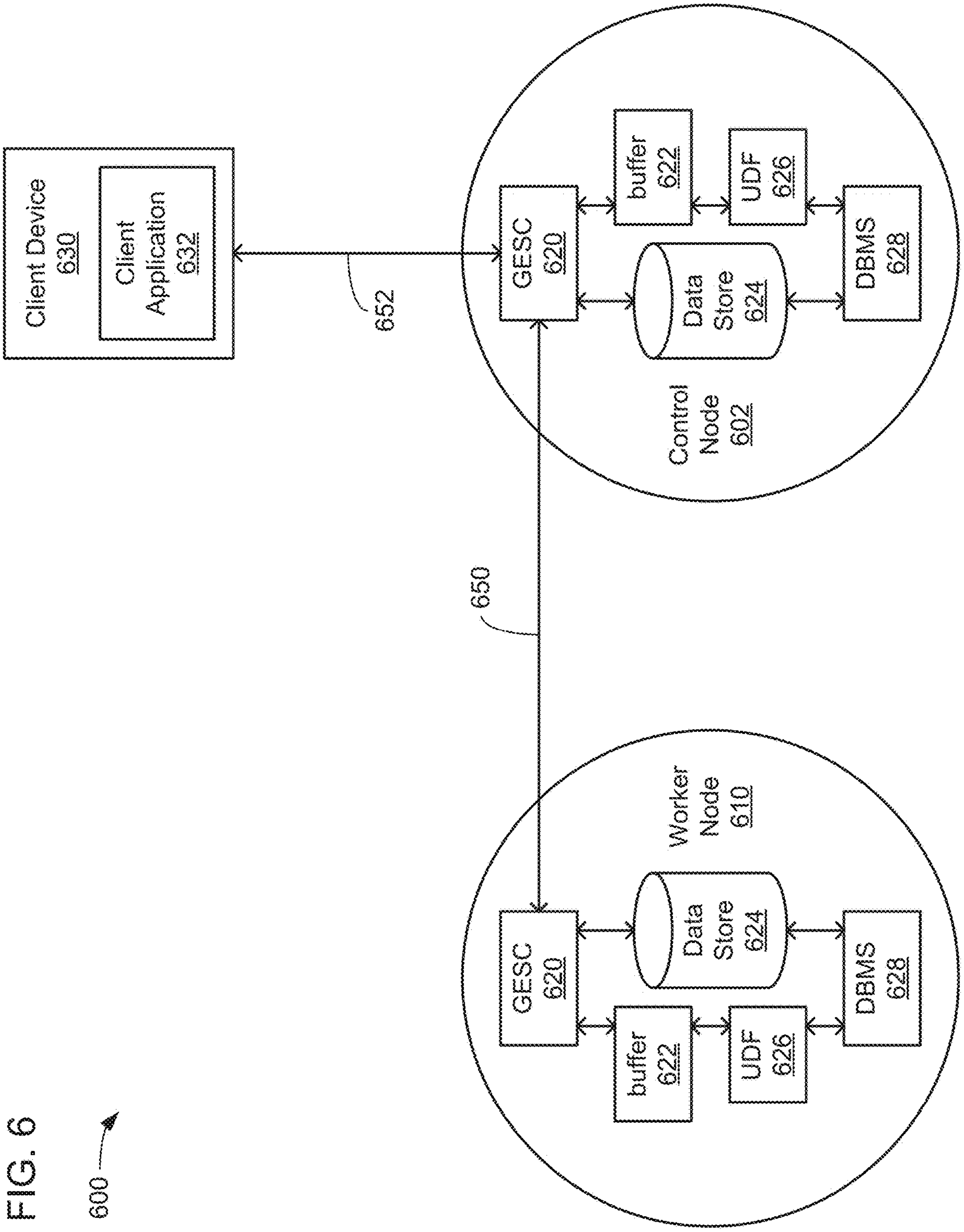
FIG. 6 illustrates a portion of a communications grid computing system including a control node and a worker node, according to some embodiments of the present technology.

FIG. 6 illustrates a portion of a communications grid computing system 600 including a control node and a worker node, according to embodiments of the present technology. Communications grid 600 computing system includes one control node (control node 602) and one worker node (worker node 610) for purposes of illustration but may include more worker and/or control nodes. The control node 602 is communicatively connected to worker node 610 via communication path 650. Therefore, control node 602 may transmit information (e.g., related to the communications grid or notifications), to and receive information from worker node 610 via path 650.

Similar to in FIG. 4, communications grid computing system (or just "communications grid") 600 includes data processing nodes (control node 602 and worker node 610). Nodes 602 and 610 include multi-core data processors. Each node 602 and 610 includes a grid-enabled software component (GESC) 620 that executes on the data processor associated with that node and interfaces with buffer memory 622 also associated with that node. Each node 602 and 610 includes database management software (DBMS) 628 that executes on a database server (not shown) at control node 602 and on a database server (not shown) at worker node 610.

Each node also includes a data store 624. Data stores 624, similar to network-attached data stores 110 in FIG. 1 and data stores 235 in FIG. 2, are used to store data to be processed by the nodes in the computing environment. Data stores 624 may also store any intermediate or final data generated by the computing system after being processed, for example in non-volatile memory. However, in certain embodiments, the configuration of the grid computing environment allows its operations to be performed such that intermediate and final data results can be stored solely in volatile memory (e.g., RAM), without a requirement that intermediate or final data results be stored to non-volatile types of memory. Storing such data in volatile memory may be useful in certain situations, such as when the grid receives queries (e.g., ad hoc) from a client and when responses, which are generated by processing large amounts of data, need to be generated quickly or on-the-fly. In such a situation, the grid may be configured to retain the data within memory so that responses can be generated at different levels of detail and so that a client may interactively query against this information.

Each node also includes a user-defined function (UDF) 626. The UDF provides a mechanism for the DBMS 628 to transfer data to or receive data from the database stored in the data stores 624 that are managed by the DBMS. For example, UDF 626 can be invoked by the DBMS to provide data to the GESC for processing. The UDF 626 may establish a socket connection (not shown) with the GESC to transfer the data. Alternatively, the UDF 626 can transfer data to the GESC by writing data to shared memory accessible by both the UDF and the GESC.

The GESC 620 at the nodes 602 and 620 may be connected via a network, such as network 108 shown in FIG. 1. Therefore, nodes 602 and 620 can communicate with each other via the network using a predetermined communication protocol such as, for example, the Message Passing Interface (MPI). Each GESC 620 can engage in point-to-point communication with the GESC at another node or in collective communication with multiple GESCs via the network. The GESC 620 at each node may contain identical (or nearly identical) software instructions. Each node may be capable of operating as either a control node or a worker node. The GESC at the control node 602 can communicate, over a communication path 652, with a client device 630. More specifically, control node 602 may communicate with client application 632 hosted by the client device 630 to receive queries and to respond to those queries after processing large amounts of data.

DBMS 628 may control the creation, maintenance, and use of database or data structure (not shown) within a nodes 602 or 610. The database may organize data stored in data stores 624. The DBMS 628 at control node 602 may accept requests for data and transfer the appropriate data for the request. With such a process, collections of data may be distributed across multiple physical locations. In this example, each node 602 and 610 stores a portion of the total data managed by the management system in its associated data store 624.

Furthermore, the DBMS may be responsible for protecting against data loss using replication techniques. Replication includes providing a backup copy of data stored on one node on one or more other nodes. Therefore, if one node fails, the data from the failed node can be recovered from a replicated copy residing at another node. However, as described herein with respect to FIG. 4, data or status information for each node in the communications grid may also be shared with each node on the grid.

Figure 7:
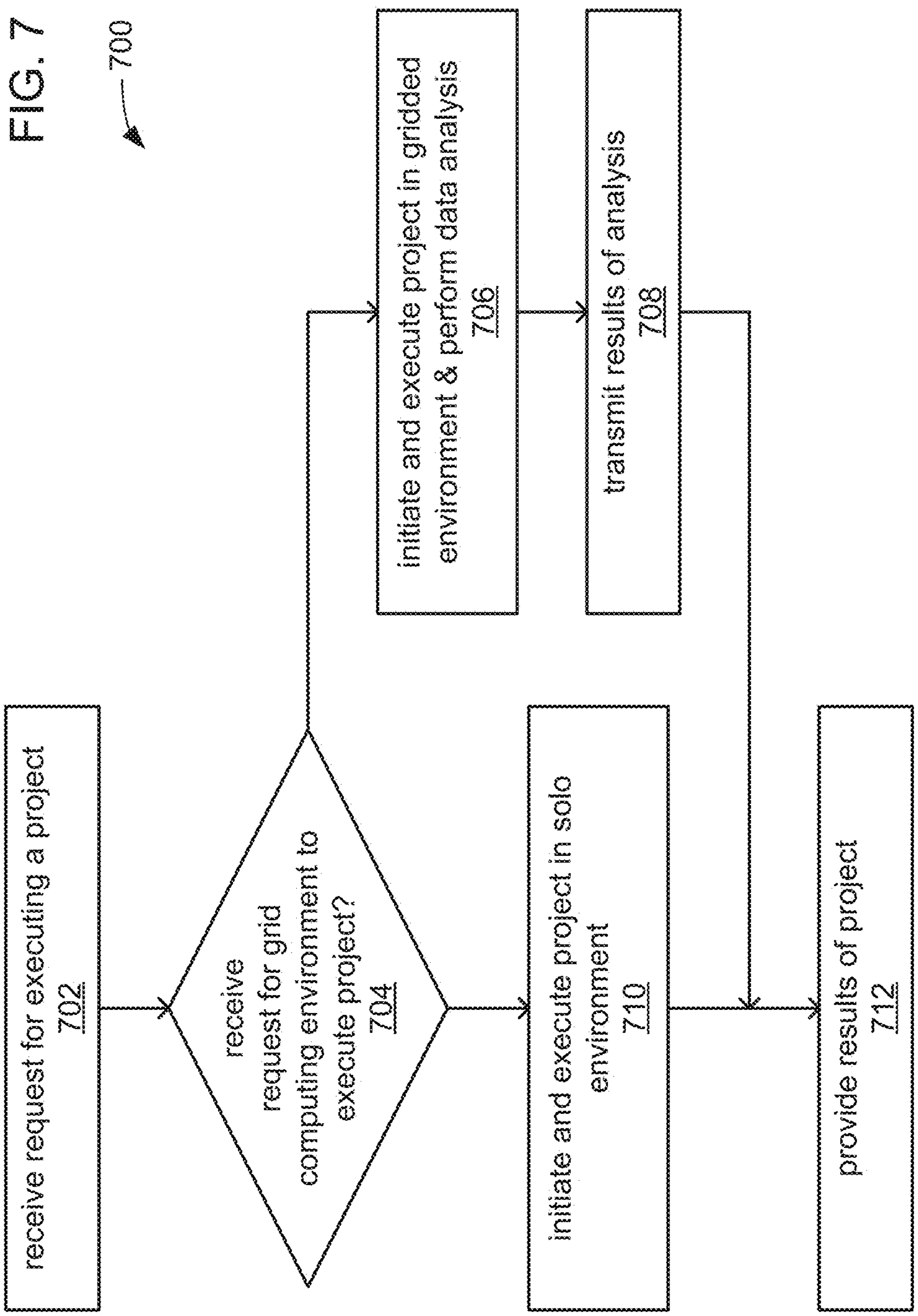
FIG. 7 illustrates a flow chart showing an example process for executing a data analysis or processing project, according to some embodiments of the present technology.

FIG. 7 illustrates a flow chart showing an example method 700 for executing a project within a grid computing system, according to embodiments of the present technology. As described with respect to FIG. 6, the GESC at the control node may transmit data with a client device (e.g., client device 630) to receive queries for executing a project and to respond to those queries after large amounts of data have been processed. The query may be transmitted to the control node, where the query may include a request for executing a project, as described in operation 702. The query can contain instructions on the type of data analysis to be performed in the project and whether the project should be executed using the grid-based computing environment, as shown in operation 704.

To initiate the project, the control node may determine if the query requests use of the grid-based computing environment to execute the project. If the determination is no, then the control node initiates execution of the project in a solo environment (e.g., at the control node), as described in operation 710. If the determination is yes, the control node may initiate execution of the project in the grid-based computing environment, as described in operation 706. In such a situation, the request may include a requested configuration of the grid. For example, the request may include a number of control nodes and a number of worker nodes to be used in the grid when executing the project. After the project has been completed, the control node may transmit results of the analysis yielded by the grid, as described in operation 708. Whether the project is executed in a solo or grid-based environment, the control node provides the results of the project, as described in operation 712.

As noted with respect to FIG. 2, the computing environments described herein may collect data (e.g., as received from network devices, such as sensors, such as network devices 204-209 in FIG. 2, and client devices or other sources) to be processed as part of a data analytics project, and data may be received in real time as part of a streaming analytics environment (e.g., ESP). Data may be collected using a variety of sources as communicated via different kinds of networks or locally, such as on a real-time streaming basis. For example, network devices may receive data periodically from network device sensors as the sensors continuously sense, monitor and track changes in their environments. More specifically, an increasing number of distributed applications develop or produce continuously flowing data from distributed sources by applying queries to the data before distributing the data to geographically distributed recipients. An event stream processing engine (ESPE) may continuously apply the queries to the data as it is received and determines which entities should receive the data. Client or other devices may also subscribe to the ESPE or other devices processing ESP data so that they can receive data after processing, based on for example the entities determined by the processing engine. For example, client devices 230 in FIG. 2 may subscribe to the ESPE in computing environment 214. In another example, event subscription devices 1024*a-c*, described further with respect to FIG. 10, may also subscribe to the ESPE. The ESPE may determine or define how input data or event streams from network devices or other publishers (e.g., network devices 204-209 in FIG. 2) are transformed into meaningful output data to be consumed by subscribers, such as for example client devices 230 in FIG. 2.

FIG. 8 illustrates a block diagram including components of an Event Stream Processing Engine (ESPE), according to embodiments of the present technology. ESPE 800 may include one or more projects 802. A project may be described as a second-level container in an engine model managed by ESPE 800 where a thread pool size for the project may be defined by a user. Each project of the one or more projects 802 may include one or more continuous queries 804 that contain data flows, which are data transformations of incoming event streams. The one or more continuous queries 804 may include one or more source windows 806 and one or more derived windows 808.

The ESPE may receive streaming data over a period of time related to certain events, such as events or other data sensed by one or more network devices. The ESPE may perform operations associated with processing data created by the one or more devices. For example, the ESPE may receive data from the one or more network devices 204-209 shown in FIG. 2. As noted, the network devices may include sensors that sense different aspects of their environments and may collect data over time based on those sensed observations. For example, the ESPE may be implemented within one or more of machines 220 and 240 shown in FIG. 2. The ESPE may be implemented within such a machine by an ESP application. An ESP application may embed an ESPE with its own dedicated thread pool or pools into its application space where the main application thread can do application-specific work and the ESPE processes event streams at least by creating an instance of a model into processing objects.

The engine container is the top-level container in a model that manages the resources of the one or more projects 802. In an illustrative embodiment, for example, there may be only one ESPE 800 for each instance of the ESP application, and ESPE 800 may have a unique engine name. Additionally, the one or more projects 802 may each have unique project names, and each query may have a unique continuous query name and begin with a uniquely named source window of the one or more source windows 806. ESPE 800 may or may not be persistent.

Continuous query modeling involves defining directed graphs of windows for event stream manipulation and transformation. A window in the context of event stream manipulation and transformation is a processing node in an event stream processing model. A window in a continuous query can perform aggregations, computations, pattern-matching, and other operations on data flowing through the window. A continuous query may be described as a directed graph of source, relational, pattern matching, and procedural windows. The one or more source windows 806 and the one or more derived windows 808 represent continuously executing queries that generate updates to a query result set as new event blocks stream through ESPE 800. A directed graph, for example, is a set of nodes connected by edges, where the edges have a direction associated with them.

An event object may be described as a packet of data accessible as a collection of fields, with at least one of the fields defined as a key or unique identifier (ID). The event object may be created using a variety of formats including binary, alphanumeric, XML, etc. Each event object may include one or more fields designated as a primary identifier (ID) for the event so ESPE 800 can support operation codes (opcodes) for events including insert, update, upsert, and delete. Upsert opcodes update the event if the key field already exists; otherwise, the event is inserted. For illustration, an event object may be a packed binary representation of a set of field values and include both metadata and field data associated with an event. The metadata may include an opcode indicating if the event represents an insert, update, delete, or upsert, a set of flags indicating if the event is a normal, partial-update, or a retention generated event from retention policy management, and a set of microsecond timestamps that can be used for latency measurements.

An event block object may be described as a grouping or package of event objects. An event stream may be described as a flow of event block objects. A continuous query of the one or more continuous queries 804 transforms a source event stream made up of streaming event block objects published into ESPE 800 into one or more output event streams using the one or more source windows 806 and the one or more derived windows 808. A continuous query can also be thought of as data flow modeling.

The one or more source windows 806 are at the top of the directed graph and have no windows feeding into them. Event streams are published into the one or more source windows 806, and from there, the event streams may be directed to the next set of connected windows as defined by the directed graph. The one or more derived windows 808 are all instantiated windows that are not source windows and that have other windows streaming events into them. The one or more derived windows 808 may perform computations or transformations on the incoming event streams. The one or more derived windows 808 transform event streams based on the window type (that is operators such as join, filter, compute, aggregate, copy, pattern match, procedural, union, etc.) and window settings. As event streams are published into ESPE 800, they are continuously queried, and the resulting sets of derived windows in these queries are continuously updated.

FIG. 9 illustrates a flow chart showing an example process including operations performed by an event stream processing engine, according to some embodiments of the present technology. As noted, the ESPE 800 (or an associated ESP application) defines how input event streams are transformed into meaningful output event streams. More specifically, the ESP application may define how input event streams from publishers (e.g., network devices providing sensed data) are transformed into meaningful output event streams consumed by subscribers (e.g., a data analytics project being executed by a machine or set of machines).

Within the application, a user may interact with one or more user interface windows presented to the user in a display under control of the ESPE independently or through a browser application in an order selectable by the user. For example, a user may execute an ESP application, which causes presentation of a first user interface window, which may include a plurality of menus and selectors such as dropdown menus, buttons, text boxes, hyperlinks, etc. associated with the ESP application as understood by a person of skill in the art. As further understood by a person of skill in the art, various operations may be performed in parallel, for example, using a plurality of threads.

At operation 900, an ESP application may define and start an ESPE, thereby instantiating an ESPE at a device, such as machine 220 and/or 240. In an operation 902, the engine container is created. For illustration, ESPE 800 may be instantiated using a function call that specifies the engine container as a manager for the model.

In an operation 904, the one or more continuous queries 804 are instantiated by ESPE 800 as a model. The one or more continuous queries 804 may be instantiated with a dedicated thread pool or pools that generate updates as new events stream through ESPE 800. For illustration, the one or more continuous queries 804 may be created to model business processing logic within ESPE 800, to predict events within ESPE 800, to model a physical system within ESPE 800, to predict the physical system state within ESPE 800, etc. For example, as noted, ESPE 800 may be used to support sensor data monitoring and management (e.g., sensing may include force, torque, load, strain, position, temperature, air pressure, fluid flow, chemical properties, resistance, electromagnetic fields, radiation, irradiance, proximity, acoustics, moisture, distance, speed, vibrations, acceleration, electrical potential, or electrical current, etc.).

ESPE 800 may analyze and process events in motion or "event streams." Instead of storing data and running queries against the stored data, ESPE 800 may store queries and stream data through them to allow continuous analysis of data as it is received. The one or more source windows 806 and the one or more derived windows 808 may be created based on the relational, pattern matching, and procedural algorithms that transform the input event streams into the output event streams to model, simulate, score, test, predict, etc. based on the continuous query model defined and application to the streamed data.

In an operation 906, a publish/subscribe (pub/sub) capability is initialized for ESPE 800. In an illustrative embodiment, a pub/sub capability is initialized for each project of the one or more projects 802. To initialize and enable pub/sub capability for ESPE 800, a port number may be provided. Pub/sub clients can use a host name of an ESP device running the ESPE and the port number to establish pub/sub connections to ESPE 800.

FIG. 10 illustrates an ESP system 1000 interfacing between publishing device 1022 and event subscribing devices 1024*a*-*c*, according to embodiments of the present technology. ESP system 1000 may include ESP device or subsystem 851, event publishing device 1022, an event subscribing device A 1024*a*, an event subscribing device B 1024*b*, and an event subscribing device C 1024*c*. Input event streams are output to ESP device 851 by publishing device 1022. In alternative embodiments, the input event streams may be created by a plurality of publishing devices. The plurality of publishing devices further may publish event streams to other ESP devices. The one or more continuous queries instantiated by ESPE 800 may analyze and process the input event streams to form output event streams output to event subscribing device A 1024*a*, event subscribing device B 1024*b*, and event subscribing device C 1024*c*. ESP system 1000 may include a greater or a fewer number of event subscribing devices of event subscribing devices.

Publish-subscribe is a message-oriented interaction paradigm based on indirect addressing. Processed data recipients specify their interest in receiving information from ESPE 800 by subscribing to specific classes of events, while information sources publish events to ESPE 800 without directly addressing the receiving parties. ESPE 800 coordinates the interactions and processes the data. In some cases, the data source receives confirmation that the published information has been received by a data recipient.

A publish/subscribe API may be described as a library that enables an event publisher, such as publishing device 1022, to publish event streams into ESPE 800 or an event subscriber, such as event subscribing device A 1024*a*, event subscribing device B 1024*b*, and event subscribing device C 1024*c*, to subscribe to event streams from ESPE 800. For illustration, one or more publish/subscribe APIs may be defined. Using the publish/subscribe API, an event publishing application may publish event streams into a running event stream processor project source window of ESPE 800, and the event subscription application may subscribe to an event stream processor project source window of ESPE 800.

The publish/subscribe API provides cross-platform connectivity and endianness compatibility between ESP application and other networked applications, such as event publishing applications instantiated at publishing device 1022, and event subscription applications instantiated at one or more of event subscribing device A 1024*a*, event subscribing device B 1024*b*, and event subscribing device C 1024*c*.

Referring back to FIG. 9, operation 906 initializes the publish/subscribe capability of ESPE 800. In an operation 908, the one or more projects 802 are started. The one or more started projects may run in the background on an ESP device. In an operation 910, an event block object is received from one or more computing device of the event publishing device 1022.

ESP subsystem 800 may include a publishing client 1002, ESPE 800, a subscribing client A 1004, a subscribing client B 1006, and a subscribing client C 1008. Publishing client 1002 may be started by an event publishing application executing at publishing device 1022 using the publish/subscribe API. Subscribing client A 1004 may be started by an event subscription application A, executing at event subscribing device A 1024*a* using the publish/subscribe API. Subscribing client B 1006 may be started by an event subscription application B executing at event subscribing device B 1024*b* using the publish/subscribe API. Subscribing client C 1008 may be started by an event subscription application C executing at event subscribing device C 1024*c* using the publish/subscribe API.

An event block object containing one or more event objects is injected into a source window of the one or more source windows 806 from an instance of an event publishing application on event publishing device 1022. The event block object may be generated, for example, by the event publishing application and may be received by publishing client 1002. A unique ID may be maintained as the event block object is passed between the one or more source windows 806 and/or the one or more derived windows 808 of ESPE 800, and to subscribing client A 1004, subscribing client B 1006, and subscribing client C 1008 and to event subscription device A 1024*a*, event subscription device B 1024*b*, and event subscription device C 1024*c*. Publishing client 1002 may further generate and include a unique embedded transaction ID in the event block object as the event block object is processed by a continuous query, as well as the unique ID that publishing device 1022 assigned to the event block object.

In an operation 912, the event block object is processed through the one or more continuous queries 804. In an operation 914, the processed event block object is output to one or more computing devices of the event subscribing devices 1024*a-c*. For example, subscribing client A 1004, subscribing client B 1006, and subscribing client C 1008 may send the received event block object to event subscription device A 1024*a*, event subscription device B 1024*b*, and event subscription device C 1024*c*, respectively.

ESPE 800 maintains the event block containership aspect of the received event blocks from when the event block is published into a source window and works its way through the directed graph defined by the one or more continuous queries 804 with the various event translations before being output to subscribers. Subscribers can correlate a group of subscribed events back to a group of published events by comparing the unique ID of the event block object that a publisher, such as publishing device 1022, attached to the event block object with the event block ID received by the subscriber.

In an operation 916, a determination is made concerning whether or not processing is stopped. If processing is not stopped, processing continues in operation 910 to continue receiving the one or more event streams containing event block objects from the, for example, one or more network devices. If processing is stopped, processing continues in an operation 918. In operation 918, the started projects are stopped. In operation 920, the ESPE is shutdown.

As noted, in some embodiments, big data is processed for an analytics project after the data is received and stored. In other embodiments, distributed applications process continuously flowing data in real-time from distributed sources by applying queries to the data before distributing the data to geographically distributed recipients. As noted, an event stream processing engine (ESPE) may continuously apply the queries to the data as it is received and determines which entities receive the processed data. This allows for large amounts of data being received and/or collected in a variety of environments to be processed and distributed in real time. For example, as shown with respect to FIG. 2, data may be collected from network devices that may include devices within the internet of things, such as devices within a home automation network. However, such data may be collected from a variety of different resources in a variety of different environments. In any such situation, embodiments of the present technology allow for real-time processing of such data.

Aspects of the current disclosure provide technical solutions to technical problems, such as computing problems that arise when an ESP device fails which results in a complete service interruption and potentially significant data loss. The data loss can be catastrophic when the streamed data is supporting mission critical operations such as those in support of an ongoing manufacturing or drilling operation. An embodiment of an ESP system achieves a rapid and seamless failover of ESPE running at the plurality of ESP devices without service interruption or data loss, thus significantly improving the reliability of an operational system that relies on the live or real-time processing of the data streams. The event publishing systems, the event subscribing systems, and each ESPE not executing at a failed ESP device are not aware of or effected by the failed ESP device. The ESP system may include thousands of event publishing systems and event subscribing systems. The ESP system keeps the failover logic and awareness within the boundaries of out-messaging network connector and out-messaging network device.

In one example embodiment, a system is provided to support a failover when event stream processing (ESP) event blocks. The system includes, but is not limited to, an out-messaging network device and a computing device. The computing device includes, but is not limited to, a processor and a computer-readable medium operably coupled to the processor. The processor is configured to execute an ESP engine (ESPE). The computer-readable medium has instructions stored thereon that, when executed by the processor, cause the computing device to support the failover. An event block object is received from the ESPE that includes a unique identifier. A first status of the computing device as active or standby is determined. When the first status is active, a second status of the computing device as newly active or not newly active is determined. Newly active is determined when the computing device is switched from a standby status to an active status. When the second status is newly active, a last published event block object identifier that uniquely identifies a last published event block object is determined. A next event block object is selected from a non-transitory computer-readable medium accessible by the computing device. The next event block object has an event block object identifier that is greater than the determined last published event block object identifier. The selected next event block object is published to an out-messaging network device. When the second status of the computing device is not newly active, the received event block object is published to the out-messaging network device. When the first status of the computing device is standby, the received event block object is stored in the non-transitory computer-readable medium.

Figure 11:
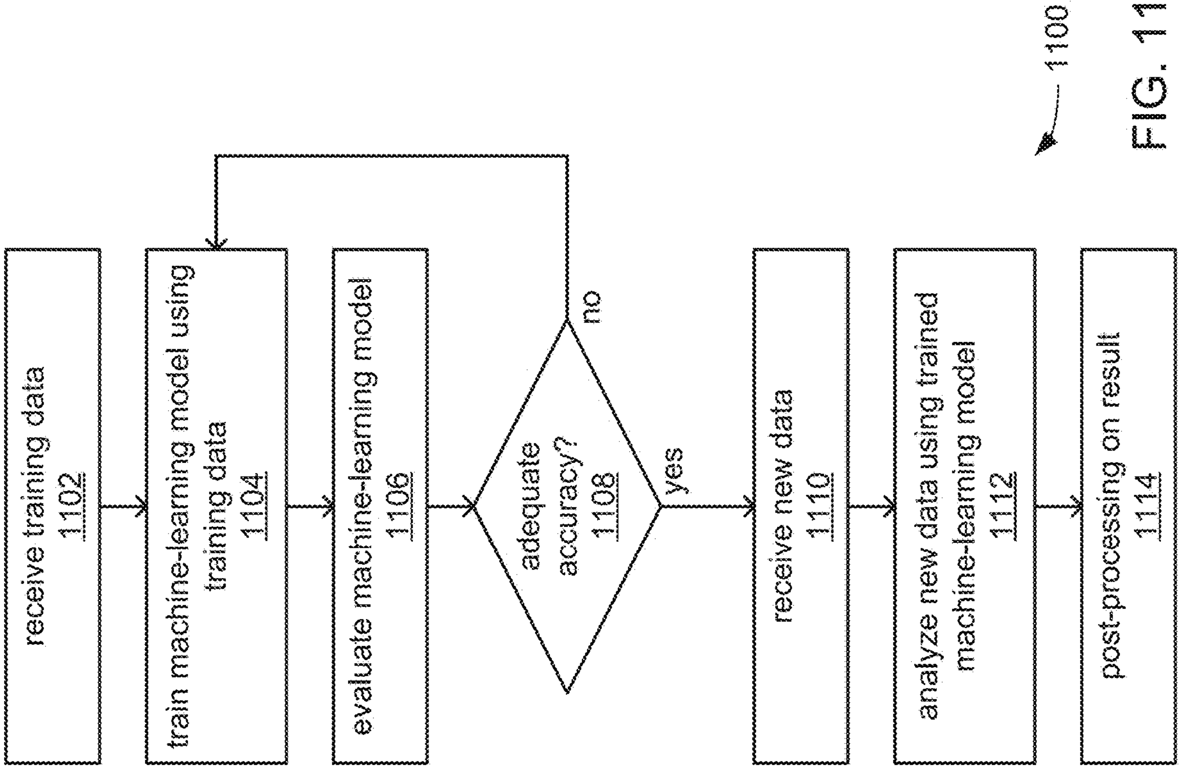
FIG. 11 illustrates a flow chart of an example of a process for generating and using a machine-learning model according to some aspects, according to embodiments of the present technology.

FIG. 11 is a flow chart of an example of a process for generating and using a machine-learning model according to some aspects. Machine learning is a branch of artificial intelligence that relates to mathematical models that can learn from, categorize, and make predictions about data. Such mathematical models, which can be referred to as machine-learning models, can classify input data among two or more classes; cluster input data among two or more groups; predict a result based on input data; identify patterns or trends in input data; identify a distribution of input data in a space; or any combination of these. Examples of machine-learning models can include (i) neural networks; (ii) decision trees, such as classification trees and regression trees; (iii) classifiers, such as Naïve bias classifiers, logistic regression classifiers, ridge regression classifiers, random forest classifiers, least absolute shrinkage and selector (LASSO) classifiers, and support vector machines; (iv) clusterers, such as k-means clusterers, mean-shift clusterers, and spectral clusterers; (v) factorizers, such as factorization machines, principal component analyzers and kernel principal component analyzers; and (vi) ensembles or other combinations of machine-learning models. In some examples, neural networks can include deep neural networks, feed-forward neural networks, recurrent neural networks, convolutional neural networks, radial basis function (RBF) neural networks, echo state neural networks, long short-term memory neural networks, bi-directional recurrent neural networks, gated neural networks, hierarchical recurrent neural networks, stochastic neural networks, modular neural networks, spiking neural networks, dynamic neural networks, cascading neural networks, neuro-fuzzy neural networks, or any combination of these.

Different machine-learning models may be used interchangeably to perform a task. Examples of tasks that can be performed at least partially using machine-learning models include various types of scoring; bioinformatics; cheminformatics; software engineering; fraud detection; customer segmentation; generating online recommendations; adaptive websites; determining customer lifetime value; search engines; placing advertisements in real time or near real time; classifying DNA sequences; affective computing; performing natural language processing and understanding; object recognition and computer vision; robotic locomotion; playing games; optimization and metaheuristics; detecting network intrusions; medical diagnosis and monitoring; or predicting when an asset, such as a machine, will need maintenance.

Any number and combination of tools can be used to create machine-learning models. Examples of tools for creating and managing machine-learning models can include SAS® Enterprise Miner, SAS® Rapid Predictive Modeler, and SAS® Model Manager, SAS Cloud Analytic Services (CAS)®, SAS Viya® of all which are by SAS Institute Inc. of Cary, North Carolina.

Machine-learning models can be constructed through an at least partially automated (e.g., with little or no human involvement) process called training. During training, input data can be iteratively supplied to a machine-learning model to enable the machine-learning model to identify patterns related to the input data or to identify relationships between the input data and output data. With training, the machine-learning model can be transformed from an untrained state to a trained state. Input data can be split into one or more training sets and one or more validation sets, and the training process may be repeated multiple times. The splitting may follow a k-fold cross-validation rule, a leave-one-out-rule, a leave-p-out rule, or a holdout rule. An overview of training and using a machine-learning model is described below with respect to the flow chart of FIG. 11.

In block 1102, training data is received. In some examples, the training data is received from a remote database or a local database, constructed from various subsets of data, or input by a user. The training data can be used in its raw form for training a machine-learning model or pre-processed into another form, which can then be used for training the machine-learning model. For example, the raw form of the training data can be smoothed, truncated, aggregated, clustered, or otherwise manipulated into another form, which can then be used for training the machine-learning model.

In block 1104, a machine-learning model is trained using the training data. The machine-learning model can be trained in a supervised, unsupervised, or semi-supervised manner. In supervised training, each input in the training data is correlated to a desired output. This desired output may be a scalar, a vector, or a different type of data structure such as text or an image. This may enable the machine-learning model to learn a mapping between the inputs and desired outputs. In unsupervised training, the training data includes inputs, but not desired outputs, so that the machine-learning model has to find structure in the inputs on its own. In semi-supervised training, only some of the inputs in the training data are correlated to desired outputs.

In block 1106, the machine-learning model is evaluated. For example, an evaluation dataset can be obtained, for example, via user input or from a database. The evaluation dataset can include inputs correlated to desired outputs. The inputs can be provided to the machine-learning model and the outputs from the machine-learning model can be compared to the desired outputs. If the outputs from the machine-learning model closely correspond with the desired outputs, the machine-learning model may have a high degree of accuracy. For example, if 90% or more of the outputs from the machine-learning model are the same as the desired outputs in the evaluation dataset, the machine-learning model may have a high degree of accuracy. Otherwise, the machine-learning model may have a low degree of accuracy. The 90% number is an example only. A realistic and desirable accuracy percentage is dependent on the problem and the data.

In some examples, if, at 1108, the machine-learning model has an inadequate degree of accuracy for a particular task, the process can return to block 1104, where the machine-learning model can be further trained using additional training data or otherwise modified to improve accuracy. However, if, at 1108. the machine-learning model has an adequate degree of accuracy for the particular task, the process can continue to block 1110.

In block 1110, new data is received. In some examples, the new data is received from a remote database or a local database, constructed from various subsets of data, or input by a user. The new data may be unknown to the machine-learning model. For example, the machine-learning model may not have previously processed or analyzed the new data.

In block 1112, the trained machine-learning model is used to analyze the new data and provide a result. For example, the new data can be provided as input to the trained machine-learning model. The trained machine-learning model can analyze the new data and provide a result that includes a classification of the new data into a particular class, a clustering of the new data into a particular group, a prediction based on the new data, or any combination of these.

In block 1114, the result is post-processed. For example, the result can be added to, multiplied with, or otherwise combined with other data as part of a job. As another example, the result can be transformed from a first format, such as a time series format, into another format, such as a count series format. Any number and combination of operations can be performed on the result during post-processing.

Figure 12:
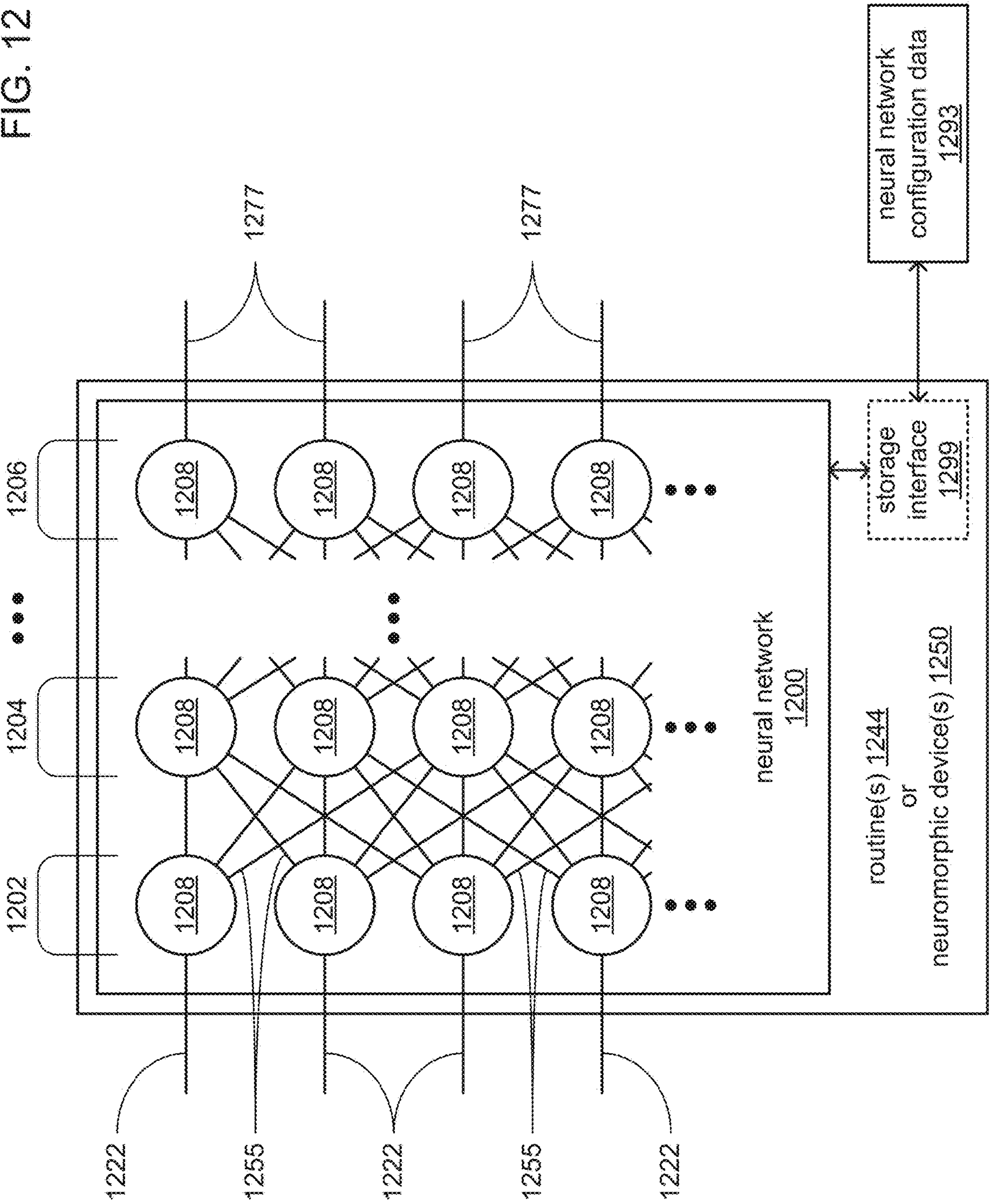
FIG. 12 illustrates an example of a machine-learning model as a neural network, according to embodiments of the present technology.

A more specific example of a machine-learning model is the neural network 1200 shown in FIG. 12. The neural network 1200 is represented as multiple layers of neurons 1208 that can exchange data between one another via connections 1255 that may be selectively instantiated thereamong. The layers include an input layer 1202 for receiving input data provided at inputs 1222, one or more hidden layers 1204, and an output layer 1206 for providing a result at outputs 1277. The hidden layer(s) 1204 are referred to as hidden because they may not be directly observable or have their inputs or outputs directly accessible during the normal functioning of the neural network 1200. Although the neural network 1200 is shown as having a specific number of layers and neurons for exemplary purposes, the neural network 1200 can have any number and combination of layers, and each layer can have any number and combination of neurons.

The neurons 1208 and connections 1255 thereamong may have numeric weights, which can be tuned during training of the neural network 1200. For example, training data can be provided to at least the inputs 1222 to the input layer 1202 of the neural network 1200, and the neural network 1200 can use the training data to tune one or more numeric weights of the neural network 1200. In some examples, the neural network 1200 can be trained using backpropagation. Backpropagation can include determining a gradient of a particular numeric weight based on a difference between an actual output of the neural network 1200 at the outputs 1277 and a desired output of the neural network 1200. Based on the gradient, one or more numeric weights of the neural network 1200 can be updated to reduce the difference therebetween, thereby increasing the accuracy of the neural network 1200. This process can be repeated multiple times to train the neural network 1200. For example, this process can be repeated hundreds or thousands of times to train the neural network 1200.

In some examples, the neural network 1200 is a feed-forward neural network. In a feed-forward neural network, the connections 1255 are instantiated and/or weighted so that every neuron 1208 only propagates an output value to a subsequent layer of the neural network 1200. For example, data may only move one direction (forward) from one neuron 1208 to the next neuron 1208 in a feed-forward neural network. Such a "forward" direction may be defined as proceeding from the input layer 1202 through the one or more hidden layers 1204, and toward the output layer 1206.

In other examples, the neural network 1200 may be a recurrent neural network. A recurrent neural network can include one or more feedback loops among the connections 1255, thereby allowing data to propagate in both forward and backward through the neural network 1200. Such a "backward" direction may be defined as proceeding in the opposite direction of forward, such as from the output layer 1206 through the one or more hidden layers 1204, and toward the input layer 1202. This can allow for information to persist within the recurrent neural network. For example, a recurrent neural network can determine an output based at least partially on information that the recurrent neural network has seen before, giving the recurrent neural network the ability to use previous input to inform the output.

In some examples, the neural network 1200 operates by receiving a vector of numbers from one layer; transforming the vector of numbers into a new vector of numbers using a matrix of numeric weights, a nonlinearity, or both; and providing the new vector of numbers to a subsequent layer ("subsequent" in the sense of moving "forward") of the neural network 1200. Each subsequent layer of the neural network 1200 can repeat this process until the neural network 1200 outputs a final result at the outputs 1277 of the output layer 1206. For example, the neural network 1200 can receive a vector of numbers at the inputs 1222 of the input layer 1202. The neural network 1200 can multiply the vector of numbers by a matrix of numeric weights to determine a weighted vector. The matrix of numeric weights can be tuned during the training of the neural network 1200. The neural network 1200 can transform the weighted vector using a nonlinearity, such as a sigmoid tangent or the hyperbolic tangent. In some examples, the nonlinearity can include a rectified linear unit, which can be expressed using the equation $y=\max(x, 0)$ where y is the output and x is an input value from the weighted vector. The transformed output can be supplied to a subsequent layer (e.g., a hidden layer 1204) of the neural network 1200. The subsequent layer of the neural network 1200 can receive the transformed output, multiply the transformed output by a matrix of numeric weights and a nonlinearity, and provide the result to yet another layer of the neural network 1200 (e.g., another, subsequent, hidden layer 1204). This process continues until the neural network 1200 outputs a final result at the outputs 1277 of the output layer 1206.

As also depicted in FIG. 12, the neural network 1200 may be implemented either through the execution of the instructions of one or more routines 1244 by central processing units (CPUs), or through the use of one or more neuromorphic devices 1250 that incorporate a set of memristors (or other similar components) that each function to implement one of the neurons 1208 in hardware. Where multiple neuromorphic devices 1250 are used, they may be interconnected in a depth-wise manner to enable implementing neural networks with greater quantities of layers, and/or in a width-wise manner to enable implementing neural networks having greater quantities of neurons 1208 per layer.

The neuromorphic device 1250 may incorporate a storage interface 1299 by which neural network configuration data 1293 that is descriptive of various parameters and hyper parameters of the neural network 1200 may be stored and/or retrieved. More specifically, the neural network configuration data 1293 may include such parameters as weighting and/or biasing values derived through the training of the neural network 1200, as has been described. Alternatively, or additionally, the neural network configuration data 1293 may include such hyperparameters as the manner in which the neurons 1208 are to be interconnected (e.g., feed-forward or recurrent), the trigger function to be implemented within the neurons 1208, the quantity of layers and/or the overall quantity of the neurons 1208. The neural network configuration data 1293 may provide such information for more than one neuromorphic device 1250 where multiple ones have been interconnected to support larger neural networks.

Other examples of the present disclosure may include any number and combination of machine-learning models having any number and combination of characteristics. The machine-learning model(s) can be trained in a supervised, semi-supervised, or unsupervised manner, or any combination of these. The machine-learning model(s) can be implemented using a single computing device or multiple computing devices, such as the communications grid computing system 400 discussed above.

Implementing some examples of the present disclosure at least in part by using machine-learning models can reduce the total number of processing iterations, time, memory, electrical power, or any combination of these consumed by a computing device when analyzing data. For example, a neural network may more readily identify patterns in data than other approaches. This may enable the neural network and/or a transformer model to analyze the data using fewer processing cycles and less memory than other approaches, while obtaining a similar or greater level of accuracy.

Some machine-learning approaches may be more efficiently and speedily executed and processed with machine-learning specific processors (e.g., not a generic CPU). Such processors may also provide an energy savings when compared to generic CPUs. For example, some of these processors can include a graphical processing unit (GPU), an application-specific integrated circuit (ASIC), a field-programmable gate array (FPGA), an artificial intelligence (AI) accelerator, a neural computing core, a neural computing engine, a neural processing unit, a purpose-built chip architecture for deep learning, and/or some other machine-learning specific processor that implements a machine learning approach or one or more neural networks using semiconductor (e.g., silicon (Si), gallium arsenide (GaAs)) devices. These processors may also be employed in heterogeneous computing architectures with a number of and/or a variety of different types of cores, engines, nodes, and/or layers to achieve various energy efficiencies, processing speed improvements, data communication speed improvements, and/or data efficiency targets and improvements throughout various parts of the system when compared to a homogeneous computing architecture that employs CPUs for general purpose computing.

Figure 13:
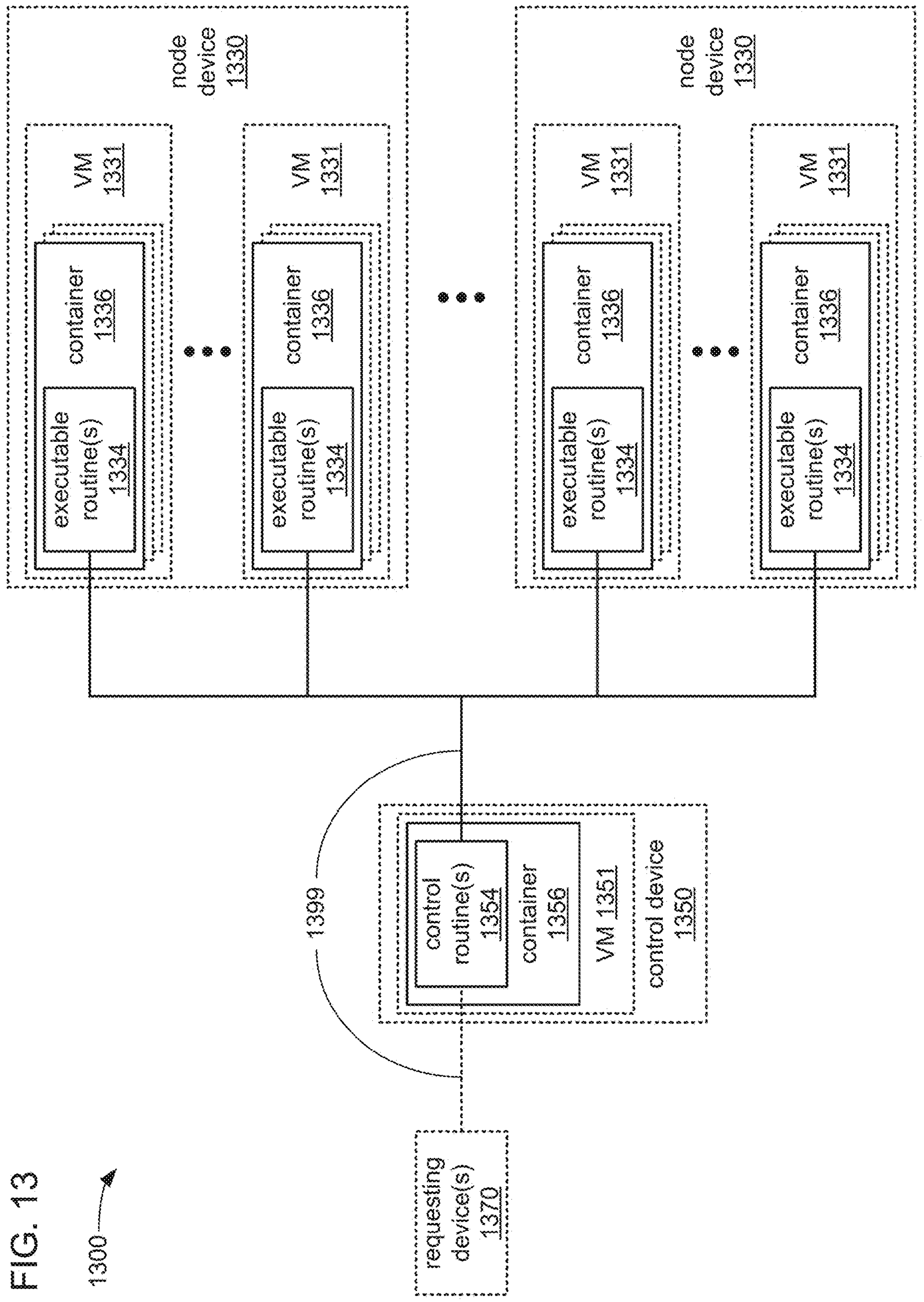
FIG. 13 illustrates various aspects of the use of containers as a mechanism to allocate processing, storage and/or other resources of a processing system to the performance of various analyses, according to embodiments of the present technology.

FIG. 13 illustrates various aspects of the use of containers 1336 as a mechanism to allocate processing, storage and/or other resources of a processing system 1300 to the performance of various analyses. More specifically, in a processing system 1300 that includes one or more node devices 1330 (e.g., the aforedescribed grid system 400), the processing, storage and/or other resources of each node device 1330 may be allocated through the instantiation and/or maintenance of multiple containers 1336 within the node devices 1330 to support the performance(s) of one or more analyses. As each container 1336 is instantiated, predetermined amounts of processing, storage and/or other resources may be allocated thereto as part of creating an execution environment therein in which one or more executable routines 1334 may be executed to cause the performance of part or all of each analysis that is requested to be performed.

It may be that at least a subset of the containers 1336 are each allocated a similar combination and amounts of resources so that each is of a similar configuration with a similar range of capabilities, and therefore, are interchangeable. This may be done in embodiments in which it is desired to have at least such a subset of the containers 1336 already instantiated prior to the receipt of requests to perform analyses, and thus, prior to the specific resource requirements of each of those analyses being known.

Alternatively, or additionally, it may be that at least a subset of the containers 1336 are not instantiated until after the processing system 1300 receives requests to perform analyses where each request may include indications of the resources required for one of those analyses. Such information concerning resource requirements may then be used to guide the selection of resources and/or the amount of each resource allocated to each such container 1336. As a result, it may be that one or more of the containers 1336 are caused to have somewhat specialized configurations such that there may be differing types of containers to support the performance of different analyses and/or different portions of analyses.

It may be that the entirety of the logic of a requested analysis is implemented within a single executable routine 1334. In such embodiments, it may be that the entirety of that analysis is performed within a single container 1336 as that single executable routine 1334 is executed therein. However, it may be that such a single executable routine 1334, when executed, is at least intended to cause the instantiation of multiple instances of itself that are intended to be executed at least partially in parallel. This may result in the execution of multiple instances of such an executable routine 1334 within a single container 1336 and/or across multiple containers 1336.

Alternatively, or additionally, it may be that the logic of a requested analysis is implemented with multiple differing executable routines 1334. In such embodiments, it may be that at least a subset of such differing executable routines 1334 are executed within a single container 1336. However, it may be that the execution of at least a subset of such differing executable routines 1334 is distributed across multiple containers 1336.

Where an executable routine 1334 of an analysis is under development, and/or is under scrutiny to confirm its functionality, it may be that the container 1336 within which that executable routine 1334 is to be executed is additionally configured assist in limiting and/or monitoring aspects of the functionality of that executable routine 1334. More specifically, the execution environment provided by such a container 1336 may be configured to enforce limitations on accesses that are allowed to be made to memory and/or I/O addresses to control what storage locations and/or I/O devices may be accessible to that executable routine 1334. Such limitations may be derived based on comments within the programming code of the executable routine 1334 and/or other information that describes what functionality the executable routine 1334 is expected to have, including what memory and/or I/O accesses are expected to be made when the executable routine 1334 is executed. Then, when the executable routine 1334 is executed within such a container 1336, the accesses that are attempted to be made by the executable routine 1334 may be monitored to identify any behavior that deviates from what is expected.

Where the possibility exists that different executable routines 1334 may be written in different programming languages, it may be that different subsets of containers 1336 are configured to support different programming languages. In such embodiments, it may be that each executable routine 1334 is analyzed to identify what programming language it is written in, and then what container 1336 is assigned to support the execution of that executable routine 1334 may be at least partially based on the identified programming language. Where the possibility exists that a single requested analysis may be based on the execution of multiple executable routines 1334 that may each be written in a different programming language, it may be that at least a subset of the containers 1336 are configured to support the performance of various data structure and/or data format conversion operations to enable a data object output by one executable routine 1334 written in one programming language to be accepted as an input to another executable routine 1334 written in another programming language.

As depicted, at least a subset of the containers 1336 may be instantiated within one or more VMs 1331 that may be instantiated within one or more node devices 1330. Thus, in some embodiments, it may be that the processing, storage and/or other resources of at least one node device 1330 may be partially allocated through the instantiation of one or more VMs 1331, and then in turn, may be further allocated within at least one VM 1331 through the instantiation of one or more containers 1336.

In some embodiments, it may be that such a nested allocation of resources may be carried out to affect an allocation of resources based on two differing criteria. By way of example, it may be that the instantiation of VMs 1331 is used to allocate the resources of a node device 1330 to multiple users or groups of users in accordance with any of a variety of service agreements by which amounts of processing, storage and/or other resources are paid for each such user or group of users. Then, within each VM 1331 or set of VMs 1331 that is allocated to a particular user or group of users, containers 1336 may be allocated to distribute the resources allocated to each VM 1331 among various analyses that are requested to be performed by that particular user or group of users.

As depicted, where the processing system 1300 includes more than one node device 1330, the processing system 1300 may also include at least one control device 1350 within which one or more control routines 1354 may be executed to control various aspects of the use of the node device(s) 1330 to perform requested analyses. By way of example, it may be that at least one control routine 1354 implements logic to control the allocation of the processing, storage and/or other resources of each node device 1300 to each VM 1331 and/or container 1336 that is instantiated therein. Thus, it may be the control device(s) 1350 that effects a nested allocation of resources, such as the aforedescribed example allocation of resources based on two differing criteria.

As also depicted, the processing system 1300 may also include one or more distinct requesting devices 1370 from which requests to perform analyses may be received by the control device(s) 1350. Thus, and by way of example, it may be that at least one control routine 1354 implements logic to monitor for the receipt of requests from authorized users and/or groups of users for various analyses to be performed using the processing, storage and/or other resources of the node device(s) 1330 of the processing system 1300. The control device(s) 1350 may receive indications of the availability of resources, the status of the performances of analyses that are already underway, and/or still other status information from the node device(s) 1330 in response to polling, at a recurring interval of time, and/or in response to the occurrence of various preselected events. More specifically, the control device(s) 1350 may receive indications of status for each container 1336, each VM 1331 and/or each node device 1330. At least one control routine 1354 may implement logic that may use such information to select container(s) 1336, VM(s) 1331 and/or node device(s) 1330 that are to be used in the execution of the executable routine(s) 1334 associated with each requested analysis.

As further depicted, in some embodiments, the one or more control routines 1354 may be executed within one or more containers 1356 and/or within one or more VMs 1351 that may be instantiated within the one or more control devices 1350. It may be that multiple instances of one or more varieties of control routine 1354 may be executed within separate containers 1356, within separate VMs 1351 and/or within separate control devices 1350 to better enable parallelized control over parallel performances of requested analyses, to provide improved redundancy against failures for such control functions, and/or to separate differing ones of the control routines 1354 that perform different functions. By way of example, it may be that multiple instances of a first variety of control routine 1354 that communicate with the requesting device(s) 1370 are executed in a first set of containers 1356 instantiated within a first VM 1351, while multiple instances of a second variety of control routine 1354 that control the allocation of resources of the node device(s) 1330 are executed in a second set of containers 1356 instantiated within a second VM 1351. It may be that the control of the allocation of resources for performing requested analyses may include deriving an order of performance of portions of each requested analysis based on such factors as data dependencies thereamong, as well as allocating the use of containers 1336 in a manner that effectuates such a derived order of performance.

Where multiple instances of control routine 1354 are used to control the allocation of resources for performing requested analyses, such as the assignment of individual ones of the containers 1336 to be used in executing executable routines 1334 of each of multiple requested analyses, it may be that each requested analysis is assigned to be controlled by just one of the instances of control routine 1354. This may be done as part of treating each requested analysis as one or more "ACID transactions" that each have the four properties of atomicity, consistency, isolation and durability such that a single instance of control routine 1354 is given full control over the entirety of each such transaction to better ensure that either all of each such transaction is either entirely performed or is entirely not performed. As will be familiar to those skilled in the art, allowing partial performances to occur may cause cache incoherencies and/or data corruption issues.

As additionally depicted, the control device(s) 1350 may communicate with the requesting device(s) 1370 and with the node device(s) 1330 through portions of a network 1399 extending thereamong. Again, such a network as the depicted network 1399 may be based on any of a variety of wired and/or wireless technologies and may employ any of a variety of protocols by which commands, status, data and/or still other varieties of information may be exchanged. It may be that one or more instances of a control routine 1354 cause the instantiation and maintenance of a web portal or other variety of portal that is based on any of a variety of communication protocols, etc. (e.g., a restful API). Through such a portal, requests for the performance of various analyses may be received from requesting device(s) 1370, and/or the results of such requested analyses may be provided thereto. Alternatively, or additionally, it may be that one or more instances of a control routine 1354 cause the instantiation of and maintenance of a message passing interface and/or message queues. Through such an interface and/or queues, individual containers 1336 may each be assigned to execute at least one executable routine 1334 associated with a requested analysis to cause the performance of at least a portion of that analysis.

Although not specifically depicted, it may be that at least one control routine 1354 may include logic to implement a form of management of the containers 1336 based on the Kubernetes container management platform promulgated by Could Native Computing Foundation of San Francisco, CA, USA. In such embodiments, containers 1336 in which executable routines 1334 of requested analyses may be instantiated within "pods" (not specifically shown) in which other containers may also be instantiated for the execution of other supporting routines. Such supporting routines may cooperate with control routine(s) 1354 to implement a communications protocol with the control device(s) 1350 via the network 1399 (e.g., a message passing interface, one or more message queues, etc.). Alternatively, or additionally, such supporting routines may serve to provide access to one or more storage repositories (not specifically shown) in which at least data objects may be stored for use in performing the requested analyses.

Experiments are often set up to control settings for factors and see how the settings will affect a response or result in the experiment. Screening designs for an experiment can be used for computer modeling or simulations to find the vital few factors that have a substantial effect on the response of an experiment. Screening designs are classically generated for factors that have only two levels (e.g., for a continuous factor, the screening design can take a high and low value).

Engineers and scientists are often uncomfortable using designs for continuous factors that have only two levels for each factor. This discomfort is due to concern that the levels selected are often at the ends of the range of input options for that continuous factor, and in many physical processes a factor's effect on a response is not linear and levels at the ends of the factor cannot capture effects for inputs in the middle of a factor's range. A computing system can compensate for this 2-level limitation by shortening the range of allowable inputs (i.e., computing system can place the levels of continuous factors close together to avoid excessive bias from nonlinear factor effects and perform repeated experiments for each close range). However, embodiments herein instead can create a design for factors with three or more levels in a single design (e.g., continuous factors). Having at least three levels allows for fitting a quadratic effect if warranted, which should substantially reduce concern about missing the curvature in a factor's effect on a response.

Where there are some factors with different numbers of levels in a design for the experiment (e.g., some factors with only two levels and some with three levels), these screening designs are considered mixed-level screening designs. Screening designs provide improved screening when they can account for implications of interactions between factors such as bias and error. Definitive screening designs are a special design type in which multiple factors are not aliased with a two-way interaction between given factors. Definitive screening designs estimate main and quadratic effects and can also estimate some interaction effects. However, where there are k factors and those factors have at least two levels, definitive screening designs would typically require 2*k+1 runs or experiment trials. Experimenters can be limited on a quantity of runs or experiment trials they can have. Embodiments herein can produce screening designs and mixed-level screening designs with good screening properties with more or fewer runs than definitive screening designs (e.g., between 2k runs to k−1 runs).

Figure 14:
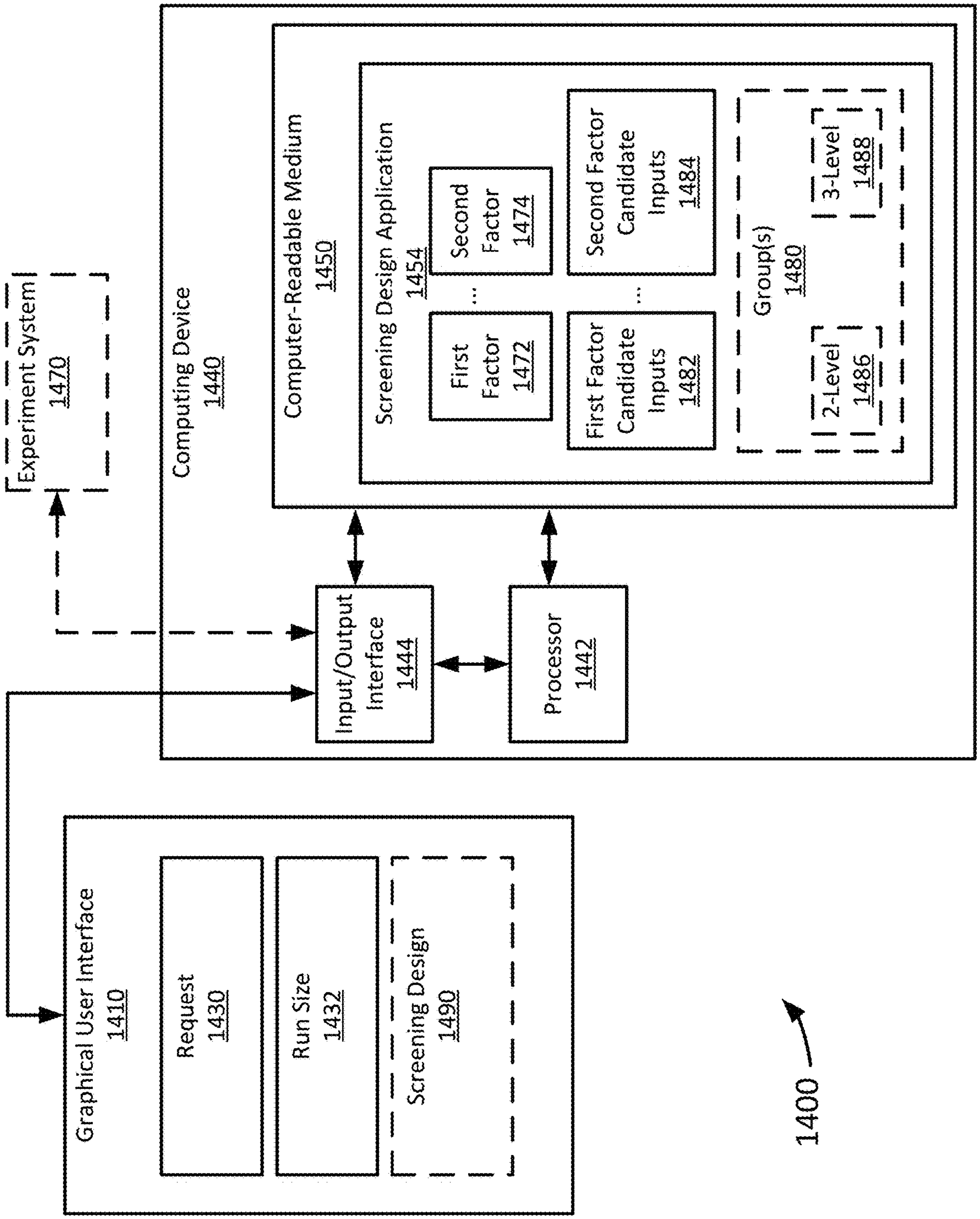
FIG. 14 illustrates a block diagram of a system for outputting a screening design according to at least one embodiment of the present technology.

FIG. 14 illustrates a block diagram of a system for outputting a screening design. System 1400 is a computing system that includes a computing device 1440. In one or more embodiments, the system 1400 includes a graphical user interface 1410 for receiving user information (e.g., input information such as request 1430 and/or run size 1432) and displaying information received from computing device 1440 (e.g., output information such as screening design 1490).

In one or more embodiments, the computing device 1440 includes one or more input and/or output interface(s) 1444 for receiving input and/or sending output. For instance, an input interface can in some embodiments be used to receive a request requesting a screening design for an experiment (e.g., based on input from a user of graphical user interface 1410). Alternatively, or additionally, an input interface can in some embodiments be used to receive a run size 1432 for the experiment. The run size 1432 can be an initial run size that is a user-requested quantity of runs for the screening design. An output interface can be used to display a screening design 1490 such as one generated responsive to the request 1430 and run size 1432. Alternatively, or additionally, the run size 1432 could be an updated run size updating an initial run size. The screening design 1490 can be dynamically updated in accordance with the updated run size. In some embodiments the screening design 1490 is additionally or alternatively output to another computing system (e.g., experiment system 1470).

An input interface can in some embodiments be used to receive or obtain other information pertaining to the screening design 1490. For instance, an input interface can be used to receive factors for an experiment. Alternatively, or additionally, input and/or output interface(s) 1444 can be used to identify factors that are available at the computing device 1440 (e.g., first factor 1472 and second factor 1474 stored in computer-readable medium 1450). Alternatively, or additionally, input and/or output interface(s) 1444 can be used to retrieve factors stored in a computing system not shown. For example, an experiment could pertain to a test system of software or hardware, and the factors and their candidate inputs could be extracted from system components or design specifications for the system.

The computing device 1440 has a computer-readable medium 1450 and a processor 1442. Computer-readable medium 1450 is an electronic holding place or storage for information so the information can be accessed by processor 1442. Computer-readable medium 1450 can include, but is not limited to, any type of random access memory (RAM), any type of read only memory (ROM), any type of flash memory, etc. such as magnetic storage devices (e.g., hard disk, floppy disk, magnetic strips), optical disks (e.g., compact disc (CD), digital versatile disc (DVD)), smart cards, flash memory devices, etc.

Processor 1442 executes instructions (e.g., stored at the computer-readable medium 1450). The instructions can be carried out by a special purpose computer, logic circuits, or hardware circuits. In one or more embodiments, processor 1442 is implemented in hardware and/or firmware. Processor 1442 executes an instruction, meaning it performs or controls the operations called for by that instruction. The term "execution" is the process of running an application or the carrying out of the operation called for by an instruction. The instructions can be written using one or more programming language, scripting language, assembly language, etc. Processor 1442 in one or more embodiments can retrieve a set of instructions from a permanent memory device and copy the instructions in an executable form to a temporary memory device that is generally some form of RAM, for example. Processor 1442 operably couples with components of computing device 1440 (e.g., input and/or output interface(s) 1444 and with computer-readable medium 1450) to receive, to send, and to process information.

In one or more embodiments, computer-readable medium 1450 stores instructions for execution by processor 1442. In one or more embodiments, one or more applications stored on computer-readable medium 1450 are implemented in software (e.g., computer-readable and/or computer-executable instructions) stored in computer-readable medium 1450 and accessible by processor 1442 for execution of the instructions. Accordingly, computing device 1440 can itself be considered a computing system.

In one or more embodiments, the computer-readable medium 1450 comprises instructions for generating the screening design 1490. For example, the computer-readable medium 1450 can include a screening design application 1454 for generating a screening design. For instance, the screening design application 1454 can obtain, for the screening design 1490, multiple factors for screening in the experiment according to the screening design 1490. A first factor 1472 can be a factor with a first set of candidate inputs 1482 for allowable inputs in the experiment. A second factor 1474 can have a second set of candidate inputs 1484 for allowable inputs in the experiment. More factors could be obtained than shown here. Further, the factors can have different or the same levels of candidate options for an experiment. For example, first factor 1472 can have a set of candidate inputs that includes at least two options while second factor 1474 can have a set of candidate options that includes at last three options. As another example, first factor 1472 and second factor 1474 can each be continuous factors with infinite options within range(s) for an experiment. The set of candidate inputs can be this range or values taken from the range such as a high, low, and/or medium option. Factors can also be of different types such as continuous, categorical, or discrete numeric factors. One or more factors can have specific levels associated with different options. For instance, if the experiment related to the strength test of a box, a categorical factor for the experiment could be the box material and levels could be associated with different materials such as cardboard (e.g., L1) or plywood (e.g., L2), and a discrete numeric factor could be pressure applied to the box with associated levels corresponding to a high, medium and low pressure values.

In some embodiments, the screening design application 1452 can generate the screening design 1490 by optionally assigning factors to group(s) 1480 based on the initial run size and number of factors. For instance, where there are k factors and a requested run size is less than 2k+1 size, screening design application 1454 can assign the first factor 1472 to a two-level group 1486 that only allows at most two allowable inputs for the first factor in the experiment, and the second factor 1474 to a three-level group 1488 that only allows at most three allowable inputs for the first factor in the experiment. In other embodiments, all the factors could be assigned to a particular group or different groups (e.g., a four-level group). In some examples, the computing device 1440 can assign both first factor 1472 and second factor 1474 to two-level groups (e.g., when the run size is restrictive). In other examples, the computing device 1440 can assign both first factor 1472 and second factor 1474 to three-level groups (e.g., when the run size is permissive). Accordingly, the screening design application 1454 can be used to selectively assign factors to level groups based on both a number of candidate options available for that factor and a requested run size. The screening design application 1454 can be used to output the screening design which provides candidate runs according to the run size 1432. In some cases, an output screening design can be a mixed-level screening design (e.g., one with different quantity of options for factors in the design such as at most two input options for the first factor 1472 and at most three input options for the second factor 1474). Embodiments herein advantageously generate mixed-level screening designs that satisfy user constraints (e.g., run size and/or factor constraints).

The system 1400 is configured to exchange information (e.g., information related to the screening design 1490) between devices in the system (e.g., via wired and/or wireless transmission). For example, a network (not shown) can connect one or more devices of system 1400 to one or more other devices of system 1400. Alternatively, or additionally, the system is integrated into one device (e.g., entering information and display information at graphical user interface 1410), or computing device 1440 is itself considered a computing system.

In one or more embodiments, fewer, different, and additional components can be incorporated into computing device 1440. For instance, in one or more embodiments, there can be other systems or devices not shown for obtaining information pertaining to a screening design (e.g., factors, run size, candidate inputs). As another example there can be fewer or more applications. For instance, the screening design application 1454 can be integrated with other analytic tools. Merely for illustration, one or more applications are implemented using or integrated with one or more software tools such as JMP®, Base SAS, SAS® Enterprise Miner™, SAS/STAT®, SAS® High Performance Analytics Server, SAS® Visual Data Mining and Machine Learning, SAS® LASR™ SAS® In-Database Products, SAS® Scalable Performance Data Engine, SAS® Cloud Analytic Services, SAS/OR®, SAS/ETS®, SAS® Inventory Optimization, SAS® Inventory Optimization Workbench, SAS® Visual Analytics, SAS® Viya™, SAS In-Memory Statistics for Hadoop®, SAS® Forecast Server, and SAS/IML® all of which are developed and provided by SAS Institute Inc., or JMP Statistical Discovery LLC, of Cary, N.C., USA.

As another example, the input and/or output interface(s) 1444 can support one or more input interfaces and output interfaces. For example, a touch screen provides a mechanism for user input and for presentation of output to the user. Alternatively, or additionally the input and/or output interface(s) 1444 has more than one input interface that uses the same or different interface technology. Alternatively, or additionally, the input and/or output interface(s) 1444 has more than one output interface that uses the same or different interface technology.

As another example, in one or more embodiments, the computing device 1440 or the computing system 1400 further includes an experiment system implementing or controlling the experiment according to the screening design 1490. The screening design 1490 can be used by computing device 1440, or an experiment system 1470, implementing an experiment according to the screening design 1490. For example, the computing device 1440 can be used to access, control, and/or configure software, hardware, or machines implementing the experiment. Candidate inputs for the experiment can pertain to settings for a device that comprises one or more of a machine, software, or hardware. The experiment system 1470 can be a test system and the screening design 1490 can include candidate runs for an experiment testing a test system comprising the device. The input and/or output interface(s) 1444 can be used to output the screening design 1490 to the experiment system 1470 for controlling the device according to the settings. For example, if the experiment pertained to an automobile, the screening design 1490 could be used to control parameters for radio devices, navigation systems, lighting systems, engine systems, etc. used in the experiment. If the experiment pertains to a chemical process, the screening design 1490 can be used, for example, to control pressures, temperatures, and durations within the chemical process.

In one or more embodiments, the computing device 1440 may receive and store feedback from these experiments. For example, sensors may collect data to inform how individual devices or systems are functioning in response to the test conditions according to the screening design 1490. As another example, image data can be taken of the experiment to determine a response. For example, in a semiconductor manufacturing experiment, images can be used to track, for example, process points (e.g., movement from a bonding site to a packaging site), and sensors can collect data on process parameters (e.g., bonding force, electrical properties across a bond of an integrated circuit). The computing device 1440 can receive feedback from the experiment system 1470 via input and/or output interface(s) 1444.

Figure 15A:
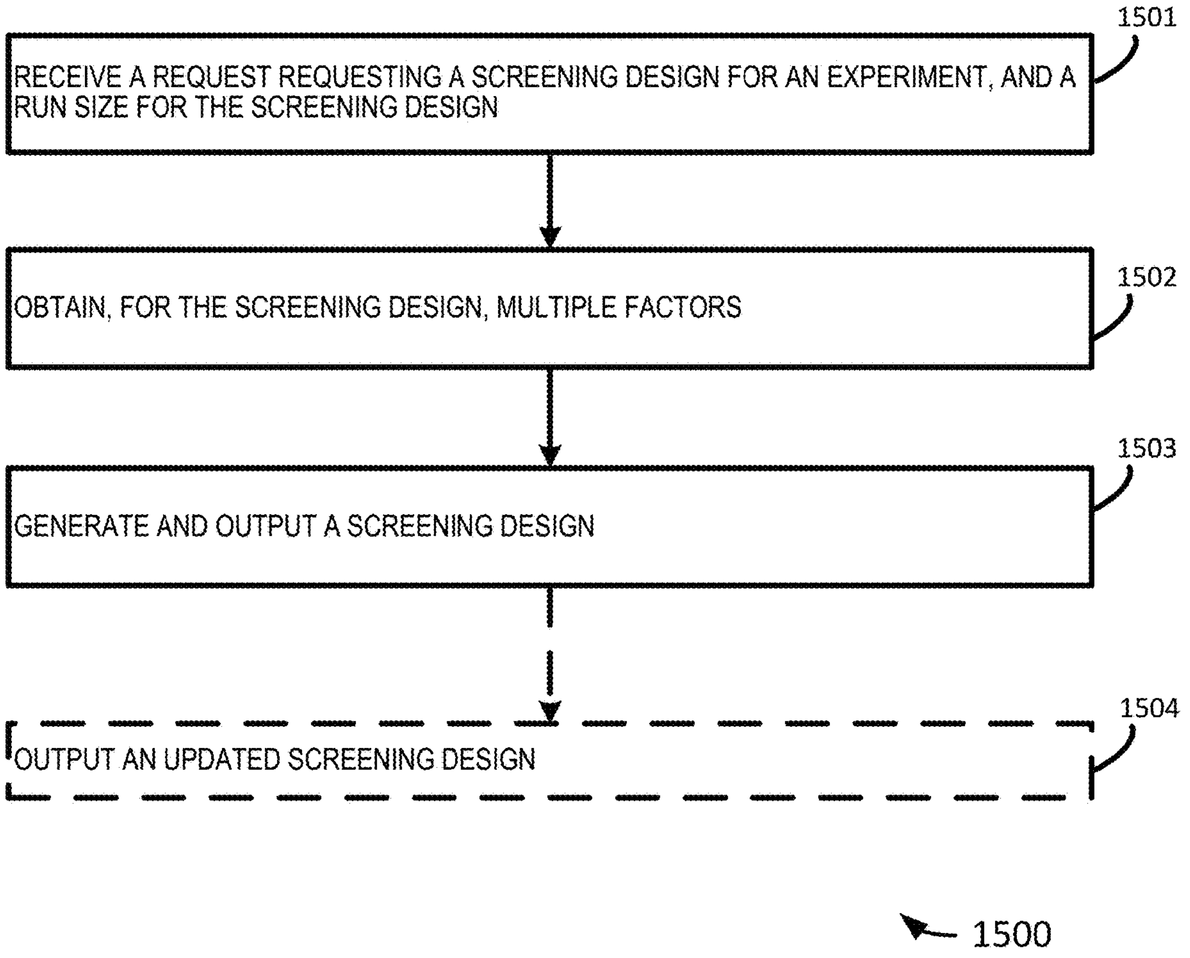
FIG. 15A illustrates a flow diagram for outputting a screening design according to at least one embodiment of the present technology.
Figure 15B:
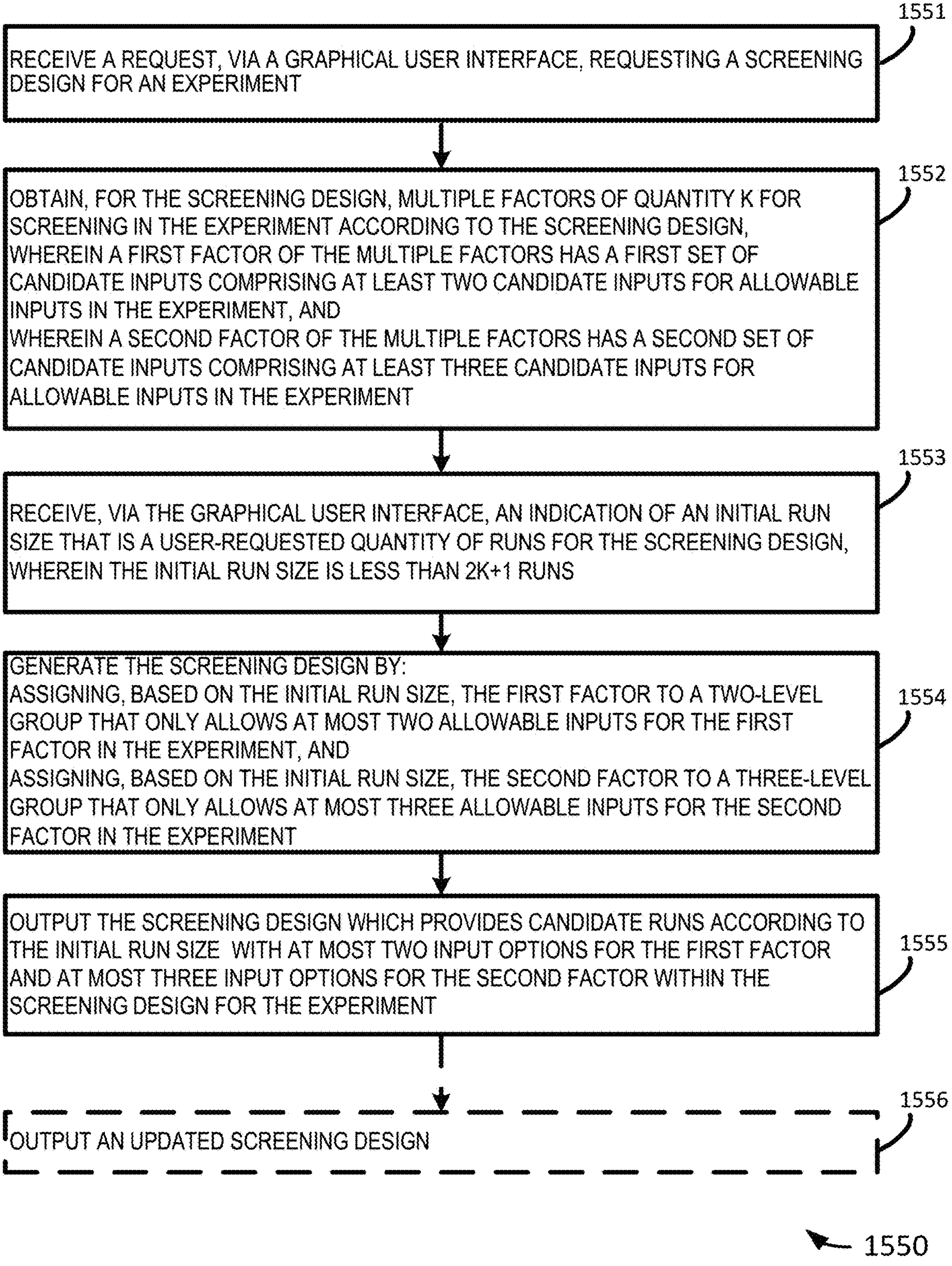
FIG. 15B illustrates a flow diagram for outputting a mixed-level screening design according to at least one embodiment of the present technology.

In one or more embodiments, the system 1400 implements a method as described herein (e.g., a method 1500 shown in FIG. 15A or a method 1550 shown in FIG. 15B). The method 1500 and the method 1550 can be implemented by a computing device (e.g., computing device 1440) or a computing system (e.g., system 1400).

FIG. 15A illustrates a flow diagram for outputting a screening design. The method 1500 comprises an operation 1501 that includes receiving a request requesting a screening design for an experiment and a run size for the screening design. For example, the request and run size can be received via a graphical user interface (e.g., graphical user interface 1410).

The method 1500 comprises an operation 1502 that includes obtaining, for the screening design, multiple factors. For example, one or more factors could be a categorical factor with one or more category options for a screening design. One or more factors could be discrete numeric factors with one or more candidate numeric values for a screening design. One or more factors could be continuous with one or more numeric values within one or more ranges.

The method 1500 comprises an operation 1503 that includes generating and outputting a screening design. For example, the screening design can include runs that satisfy the requested run size. Each run of the screening design can specify an option for each of the multiple factors from the candidate options for that factor.

The method 1500 comprises an operation 1504 that includes outputting an updated screening design. For example, the screening design can be updated responsive to changes to the run size, or changes in the number or type of factors.

In some embodiments, the method 1500 can be used to generate screening designs or updated screening designs that are mixed-level screening designs in that individual factors may have different quantities of specified options or levels in the screening design. For instance, FIG. 15B illustrates a flow diagram for outputting a mixed-level screening design. The method 1550 comprises an operation 1551 that includes receiving a request, via a graphical user interface (e.g., graphical user interface 1410), requesting a screening design for an experiment.

The method 1550 comprises an operation 1552 that includes obtaining, for the screening design, multiple factors of quantity k for screening in the experiment according to the screening design. In this example, a first factor of the multiple factors has a first set of candidate inputs comprising at least two candidate inputs for allowable inputs in the experiment. For example, a first factor could be a categorical factor with two different category options, or a discrete numeric factor with two different possible numeric values, or a continuous factor with a high and low value. A second factor of the multiple factors has a second set of candidate inputs comprising at least three candidate inputs for allowable inputs in the experiment. For example, the factor could be a continuous factor with a high, middle, and low value. However, more factors could be included with different allowable quantities of candidate inputs.

The method 1550 comprises an operation 1553 that includes receiving, via the graphical user interface, an indication of an initial run size that is a user-requested quantity of runs for the screening design. The run size could be received as part of a request for a screening design, or responsive to different selections in a graphical user interface. In this example, the initial run size is less than 2k+1 runs because a definitive screening design typically has at least 2k+1 runs, and embodiments can advantageously have fewer runs than a definitive screening design. However, 2k+1 runs or more could be requested.

The method comprises an operation 1554 that includes generating the screening design by assigning, based on the initial run size, the first factor to a two-level group that only allows at most two allowable inputs for the first factor in the experiment, and assigning, based on the initial run size, the second factor to a three-level group that only allows at most three allowable inputs for the second factor in the experiment. Depending on the run size different assignments could be made. For example, if there are fewer runs available given the requested run size, more factors could be assigned to a two-level group. By selectively assigning factors to various groups, different subdesigns can be generated around these different groups as discussed in more detail herein. For instance, the method 1550 can include generating one or more subdesigns for factors assigned to the two-level group and generating one or more subdesign for factors assigned to the three-level group. Subdesigns generated for respective groups can be different.

The method 1550 comprises an operation 1555 that includes outputting the screening design which provides candidate runs according to the initial run size. The screening design in this example has at most two input options for the first factor and at most three input options for the second factor. For instance, a design for the experiment can be a composite of these different subdesigns. In other examples, and depending on the group assignment, each of the factors could have three input options or two input options.

The method 1550 optionally comprises an operation 1556 for outputting an updated design (e.g., responsive to changes to the run size, or changes in the number or type of factors). Embodiments can provide computer-generated evaluations of design properties associated with different designs. A user can make changes to user-specified criteria based on those computer-generated evaluations.

FIG. 16 illustrates a definitive screening design 1600. In this example, there are 6 continuous factor (X1-X5) and 6 categorical factors (X7-X12). The continuous factors can have three levels represented in the design as "−1", "0", and "1". For simplicity, the categorical factors in this example have two levels represented as "L1" and "L2". A definitive screening design usually has more than twice the number of runs as factors. Runs can be, for example, different experiment tests in the experiment. This example has even more runs than 24 runs. Depending on the experiment a run could be extensive in processing time or materials. While a definitive screening design has a large number of runs, this design type has certain advantages.

Figure 17:
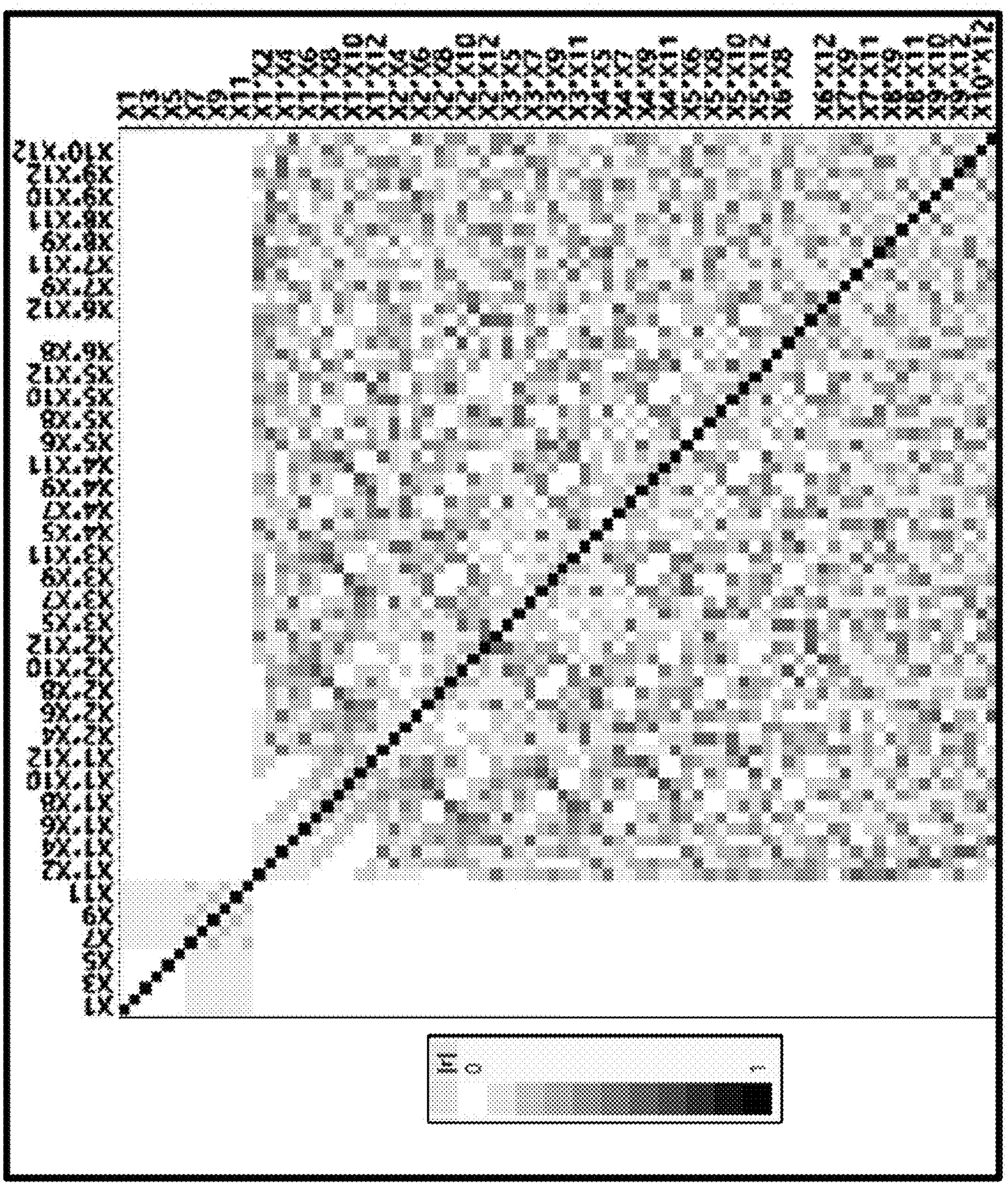
FIG. 17 illustrates a design evaluation of the definitive screening design according to at least one embodiment of the present technology.

FIG. 17 illustrates a design evaluation 1700 of the definitive screening design showing some advantages of the definitive screening design. It is an advantage of definitive screening designs to be able to estimate the effects of factors well. Ideally factors would be isolated so that experiments could reveal their influence on the outcome of an experiment. A color map can show how affected a variable is by another variable (e.g., X2's effect on X1) or an interaction between variables (e.g., X2*X3's effect on X1).

In design evaluation 1700 a color map on correlations is shown. It is preferred to have a design that is at $|r|=0$ (in this example, white blocks). Where $|r|=0$ the evaluated design has orthogonality and a correlation between the variables of zero. The closer to 0, the better the design is at estimating the effects of factors. When $|r|$ is close to one, effects are highly correlated, and it is difficult to determine which variable is responsible for an effect in an experiment. While this design has advantages, a user can want to have fewer runs or a design that takes into account secondary considerations. The user can be willing to reduce the three levels for continuous factors to two levels to accomplish these other objectives, but the complexity involved with making these choices with even a few factors is very difficult. Most experiments would have significantly more than a few factors. Embodiments provide a computing system approach to be able to provide a mixed-level screening design with the user needing only specify the amount of factors and runs.

Figure 18:
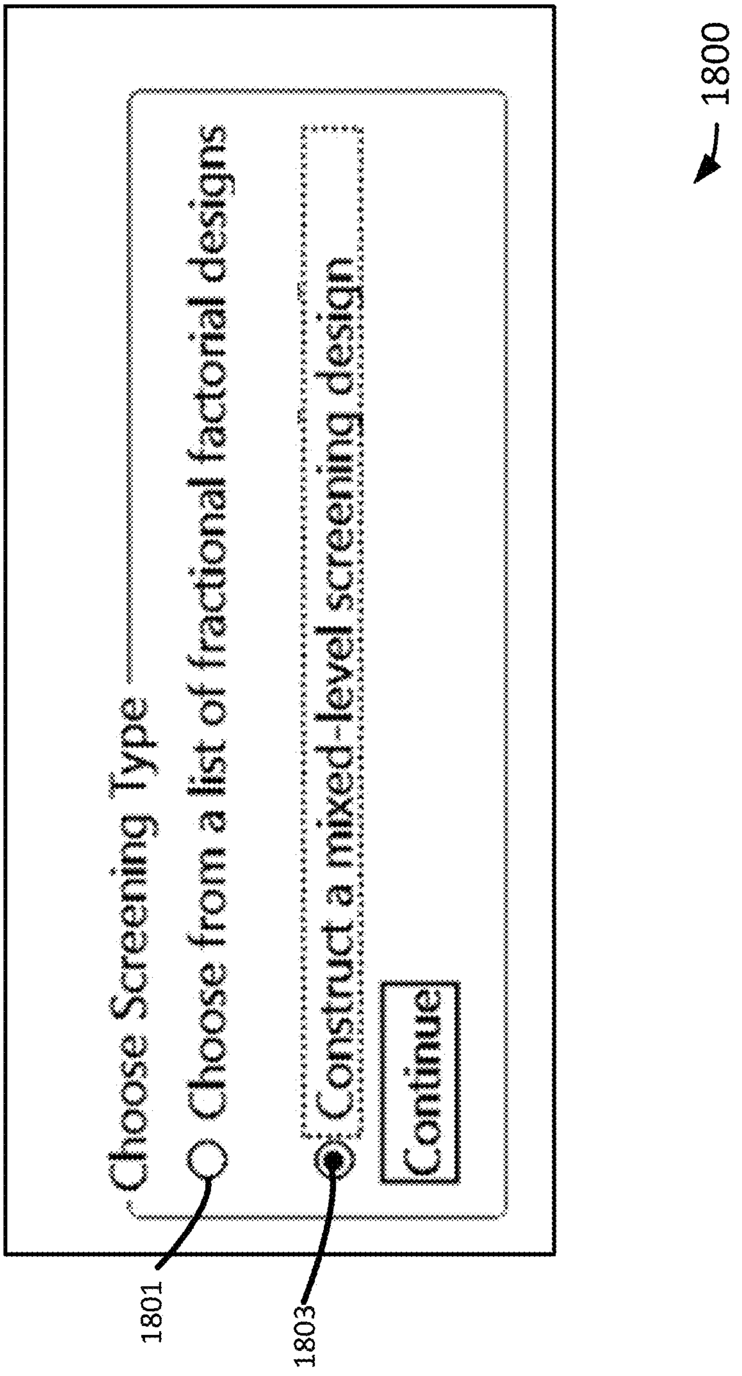
FIG. 18 illustrates a graphical user interface for selecting a mixed-level screening design according to at least one embodiment of the present technology.

FIG. 18 illustrates a graphical user interface 1800 for selecting a construction of a screening design where there may be multiple options. In other embodiments, the user may simply select to generate a screening design and the computing system may select a construction method for the user. In this example, FIG. 18 allows the user to select construction for a mixed-level screening design. This graphical user interface 1800 displays an option 1803 to request a computing system to construct a mixed-level screening design. In some platforms, a computing system can selectively provide this option (or automatically request) such as when factors are continuous or mixed in nature such as two-level or three-level discrete numeric, or two-level categorical with continuous factors. This allows the continuous or three-level discrete numeric factors to have a few values at a central value (i.e., three-levels). For instance, it can be used for the 6 continuous and 6 categorical factors of FIG. 16. Upon selecting the option 1803 (i.e., "construct a mixed-level screening design"), the user can be given choices to select a construction type based on their run size, or a construction type may automatically be selected for the user (e.g., based on a requested run size). Even with selecting option 1803, an output design may provide factors all of the same level of options, but by selecting this construction technique the user is permitting the computing system to be able to generate a mixed-level screening design by selectively assigning factors to various level groups.

One or more embodiments optionally provide alternative design options to the user such as option 1801 which allows a user to select from a list of fractional factorial designs. A full factorial design would provide all possible combinations of factor settings. The run size is the product of the number of levels of all the factors. For example, a factorial design for an experiment with a two-level factor, a three-level factor and a four-level factor has 24 runs (2×3×4). A fractional factorial design would have a subset of these runs, and some pre-constructed ones may have good properties that can be presented to the user for selection rather than ad hoc generating a screening design as discussed for option 1803. In some embodiments, a fractional factorial design may not be applicable to the specifications requested by the user for the screening design and option 1801 may not be presented. Where there are not multiple options for constructing a screening design, a computing system may simply automatically select the only construction method available.

Figure 19:
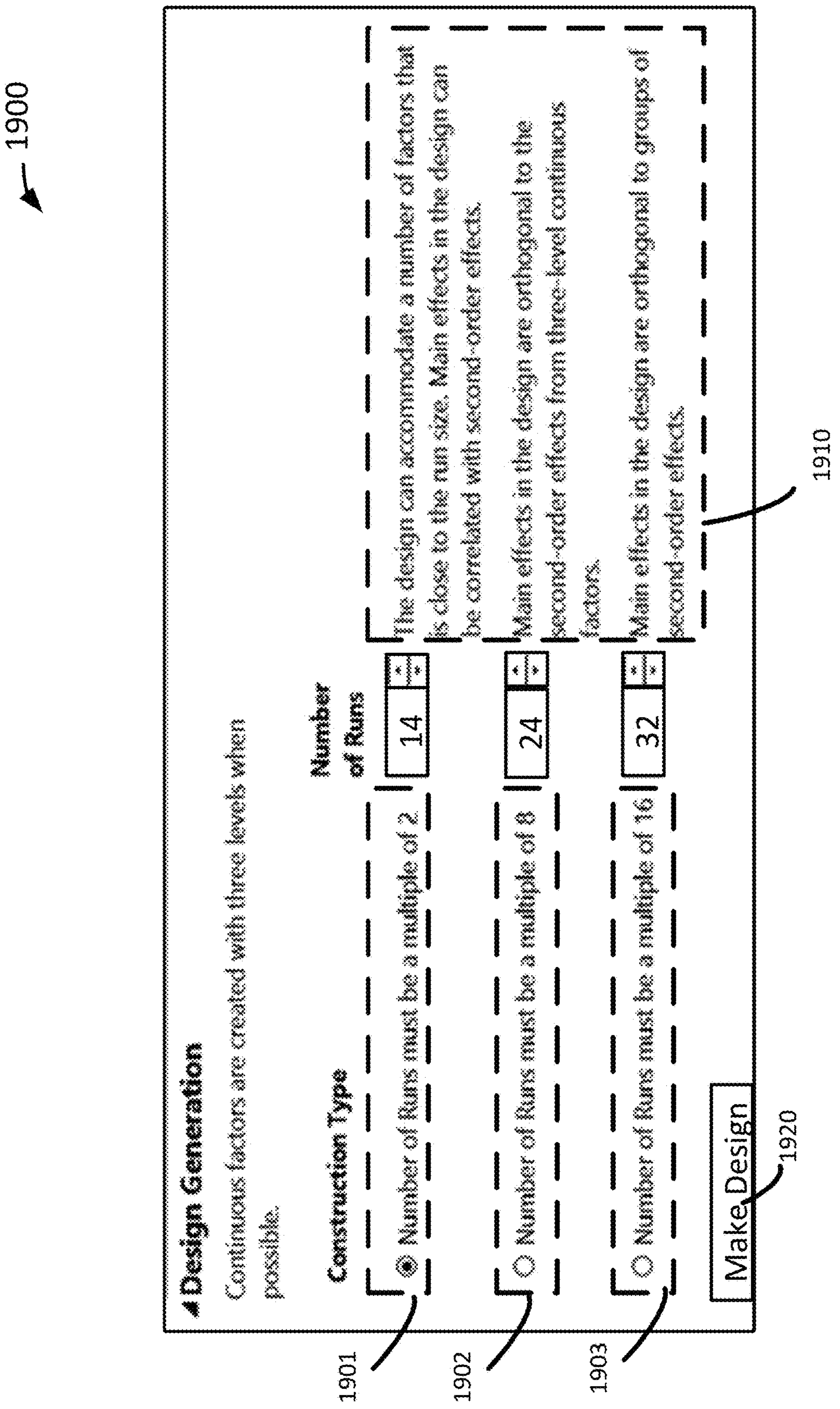
FIG. 19 illustrates a graphical user interface for specifying mixed-level screening design generation options according to at least one embodiment of the present technology.

FIG. 19 illustrates a graphical user interface 1900 for specifying mixed-level screening design generation options. As shown in graphical user interface 1900, a computing system (e.g., computing device 1440 or computing system 1400) can construct a design with a much smaller quantity of runs than a definitive screening design. The definitive screening design for this number of factors had 30 runs as shown in FIG. 16, and typically definitive screening designs usually have runs twice the number of factors. In embodiments, the user could instead select a number of rows as small as two. In this case the user has input 14 rows, which is still substantially smaller, but will still have good design properties akin to a definitive screening design. The computing system can generate a design by generating a matrix of order m corresponding to the initial run size (e.g., order 14).

Some designs are constructed using a combination of blocks, subdesigns, or combinatorial objects (e.g., matrices lower than m combined to form a matrix of order m). For instance, some designs generate a conference matrix, or a matrix based on a conference matrix such as a pseudo-conference matrix, as a block in a resulting screening design. A conference matrix is a square matrix with one level (i.e. a 0) on the diagonal and two other levels off the diagonal (i.e., −1 and 1). A conference matrix $C_m$ of order m, with entries plus and minus 1 with 0's on the diagonal has the property:

$$C_m^T C_m = (m-1) I_m$$

Where $I_m$ is the identity matrix, which is an m×m matrix with 1's on the diagonal and 0's elsewhere. For example, a conference matrix of order 6:

$$\begin{pmatrix} 0 & +1 & +1 & +1 & +1 & +1 \\ +1 & 0 & +1 & -1 & -1 & +1 \\ +1 & +1 & 0 & +1 & -1 & -1 \\ +1 & -1 & +1 & 0 & +1 & -1 \\ +1 & -1 & -1 & +1 & 0 & +1 \\ +1 & +1 & -1 & -1 & +1 & 0 \end{pmatrix}$$

Conference matrices can be used in construction of definitive screening designs for factors that are all three levels by using a conference matrix combined with its "foldover", denoted by $-C_m$. In the foldover design, the values of plus and minus 1 are reversed. However, embodiments provide for construction of designs when conference matrices do not exist or when using this technique would produce too many or too few runs. Conference matrices exist for most orders that are a multiple of 2.

As another example of a subdesign, Hadamard matrices and D-optimal designs can be used. A Hadamard matrix is a square matrix whose entries represent two levels and whose rows and columns are mutually orthogonal. A Hadamard matrix, H, of order n has the property:

$$HH^T-nI_n$$

U.S. Pat. No. 10,535,422 outlines example computer system construction methods for Hadamard matrices. The graphical user interface 1900 takes the work out of a practitioner's hands for having to determine how and which constructions to apply. For instance, portion 1910 shows descriptions to guide a user in selecting a construction type and number of runs. Graphical user interface 1900 also allows flexibility in adjusting the design to meet user specifications by how some of the factors might be treated. Control 1920 allows a user to send a construction request to a computing system to output a design constructed according to the settings made in graphical user interface 1900. A computing device will determine how to assign factors to satisfy the user request. The computing system can generate a screening design according to the request (e.g., construction selections). The design can be constructed based on a combination of subdesigns, blocks, or matrixes for multiple factors (e.g., a subdesign for two factors and a different subdesign for another two different factors of an experiment for an experiment comprising at least four factors).

FIG. 20 illustrates a mixed-level screening design 2000 where main effects in the design can be correlated with second-order effects (i.e., two-factor interactions and/or quadratic effects). The mixed-level screening design 2000 in this example is generated according to the user selecting the first option 1901 of FIG. 19.

The mixed-level screening design 2000 specifies 14 runs (runs 2002) responsive to selecting first option 1901 in FIG. 19. The factors 2004 are assigned to a three-level group such that values of −1, 0, and 1 are provided for these factors in the mixed-level screening design 2000 to denote different options, e.g., end values, and a middle value of a range for a continuous factor. The factors 2006 are assigned to a two-level group such that L1 or L2 is assigned to these factors in the mixed-level screening design 2000 to denote two different options (e.g., different categorical options or end points of a range). The factors 2004 and the factors 2006 are disjoint sets in that they have no factors in common.

The mixed-level screening design 2000 is constructed using a general construction that uses a combination of a matrices. A first type of the matrices is a conference matrix, or based on the conference matrix such as a pseudo-conference matrix, of an order based on a quantity of a first subset of the multiple factors assigned to the three-level group (e.g., factors 2004). A second type of matrices is for a second subset of the multiple factors assigned to the two-level group (e.g., factors 2006) with order generated based on the quantity of the multiple factors assigned to the two-level group.

For example, a conference matrix (or pseudo-conference matrix) with m rows, is denoted by C, and a D-optimal or Bayesian D-optimal design with m rows denoted by T. A D-optimal design is one generated that maximizes the determinant of a matrix X'X. C is constructed via an algorithm that allows for construction given any order or run size. If a conference matrix exists, then the algorithm constructs it directly. Otherwise, it uses an optimized search algorithm to construct a pseudo-conference matrix. Whereas a conference matrix C means that $C^TC=(m-1)I_m$ as described in more detail with respect to FIG. 19, the optimized search algorithm ensures that for pseudo-conference matrices, off-diagonal entries for $C^TC$ will be close to 0, while ensuring that diagonal entries are m−1. Similarly, the matrix T can be constructed for any order and run size. For instance, for D-optimal designs, methods outlined in U.S. Pat. No. 10,535,422 provide for direct construction of T by a computing system. Some computing systems such as JMP® provided by JMP Statistical Discovery LLC of Cary, NC can define two-factor interactions as "If Possible", which in embodiments can ensure that T provides better protection against second-order effects.

Using these blocks, the general construction is then:

$$\begin{bmatrix} C & T \\ -C & T \end{bmatrix}$$

As shown in mixed-level screening design 2000, the first m columns of the design are for 3-level factors (from C). The remaining m−1 columns are for 2-level factors (from T). In this case, m=6, and factors 2004 (i.e., X1-X6), are shown as 3-level factors. Subdesign 2010 shows a pseudo-conference matrix with a conference matrix 2030 and an additional row added to form a pseudo-conference matrix for the subdesign 2010. The additional row can be added based on random assignment or in consideration of assignments made in the conference matrix 2030 or other subdesigns. Subdesign 2012 shows its foldover such that where values are −1 in subdesign 2010, they are 1 in subdesign 2012; and where they are 1 in subdesign 2010, they are −1 in subdesign 2012. Subdesign 2020 corresponds to T. It is repeated twice in the design such that only one design was constructed for factors 2006 (i.e., X7-X12).

In one or more embodiments, the generating a screening design (e.g., mixed-level screening design 2000) comprises generating an array representing the screening design. For instance, the array can include an ordering of multiple groups. In this example, the two groups could comprise a first group for inputs for factors assigned to the three-level group (e.g., subdesign 2010 and subdesign 2012 come first in the organization of factors) and a second group for inputs for factors assigned to the two-level group (e.g., subdesigns 2020 come second in the organization of factors). Organizing the factors can be useful for practitioners making decisions on the number of factors and/or runs. For instance, the user can return to the graphical user interface 1900 in FIG. 19 and change the run size to change the balance of factors in each group. The user can also change the particular factors in each group discussed in more detail with respect to FIG. 24. In other embodiments, the array could include a different ordering, such as alphabetizing the factors. The ordering could be based on user preferences and/or default settings.

FIG. 21 illustrates a mixed-level screening design 2100 where main effects in the design are orthogonal to the second-order effects from three-level continuous factors. The mixed-level screening design 2100 in this example is generated according to the user selecting the second option 1902 of FIG. 19. This construction is a special case of the general construction according to the first option 1901. The run size comprises at least eight runs in the experiment.

The second option replicates a definitive screening design without the center point ($D_{2k}$), combined with a foldover of a Hadamard matrix ($H_{2k}$). The first k columns are at three levels, and the remaining columns are at two levels. As both blocks are a multiple of 4, the final run size is a multiple of 8. The construction is as follows:

$$\begin{bmatrix} D_{2k} & H_{2k} \\ D_{2k} & -H_{2k} \end{bmatrix}$$

Subdesign 2120 corresponds to $D_{2k}$ with up to 2k columns. Subdesign 2110 shows $H_{2k}$ with up to 2k columns and subdesign 2112 shows its foldover such that where values are −1 in subdesign 2110 they are 1 in subdesign 2112; and where they are 1 in subdesign 2110, they are −1 in subdesign 2112.

FIG. 22A illustrates a mixed-level screening design 2200 where main effects in the design are orthogonal to groups of second-order effects. The mixed-level screening design 2200 in this example is generated according to the user selecting the third option 1903 of FIG. 19. This option corresponds to a run size of at least sixteen runs in the experiment.

For the third option, a constructed array (A) includes a conference matrix (or pseudo-conference matrix) of order k, and a corresponding Hadamard matrix of order k. To construct:

$$A_{4k}^{k,2k} = \begin{bmatrix} C_k & H_k & H_k \\ -C_k & H_k & -H_k \\ C_k & -H_k & -H_k \\ -C_k & -H_k & H_k \end{bmatrix} = [\,G_1 \;\; G_2 \;\; G_3\,]$$

$C_k$ is a pseudo conference matrix of order k where the number of requested runs is m=4k. $H_k$ is a Hadamard matrix of order k. Subdesigns can be rearranged within the resulting design (e.g., as shown in FIG. 22A). In this example, the resulting screening design can group the factors into groups with different properties such that all main effects are orthogonal, interactions in $G_i \times G_i$ are orthogonal to all main effects. For i≠j, interactions in $G_i \times G_j$ are orthogonal to main effects and two-factor interactions in $G_i$.

The run size is a multiple of 16 because there are 4 Hadamard matrices row concatenated:

$$H_{2k} = \begin{bmatrix} H_k & H_k \\ H_k & -H_k \end{bmatrix}$$

In the example in FIG. 22A, there are 32 runs specified in runs column 2210. In this example, there are eight continuous factors (X1-X8) and 16 two-level categorical factors (X9-X24). Subdesign 2230 corresponds to a conference matrix. Subdesign 2232 is the foldover of subdesign 2230 such that where values are −1 in subdesign 2230 they are 1 in subdesign 2232; and where they are 1 in subdesign 2230, they are −1 in subdesign 2232. Subdesign 2240 is a Hadamard matrix. Subdesign 2242 is the foldover of subdesign 2240 such that where values are −1 in subdesign 2240 they are 1 in subdesign 2242; and where they are 1 in subdesign 2240, they are −1 in subdesign 2242.

If the factors were instead, or changed to specify, 6 continuous factors (X1-X6) and 6 two-level categorical factors (X7-X16) as in examples FIG. 20 and FIG. 31 the third option could still be used using subdesigns based on conference and Hadamard matrices shown in FIG. 22A.

For example, FIG. 22B shows a subdesign 2234 corresponds to a pseudo conference matrix that has had two columns removed of the square matrix corresponding to subdesign 2230 of FIG. 22A to accommodate only 6 factors in the three-level group for the eight runs. Subdesign 2236 is the foldover of subdesign 2234 such that where values are −1 in subdesign 2234 they are 1 in subdesign 2236; and where they are 1 in subdesign 2234, they are −1 in subdesign 2236. Subdesign 2244 is a Hadamard matrix also with columns removed from the subdesign 2240 of FIG. 22A to accommodate only 6 factors in the two-level group. Subdesign 2246 is the foldover of subdesign 2244 such that where values are −1 in subdesign 2244 they are 1 in subdesign 2246; and where they are 1 in subdesign 2244, they are −1 in subdesign 2246.

In one or more embodiments, constructions could instead of conference matrices use Hadamard matrices to create designs where all the factors are at two-levels. Alternatively, the Hadamard matrices could be replaced by conference matrices to accommodate more three-level factors. Because of the Kronecker product construction, such designs would supply more protection against aliasing from active two-factor interactions than other nonregular orthogonal arrays. Another option is to replace either the conference matrices or the Hadamard matrices in construction with weighing designs with an appropriate number of runs.

In any of the constructions once a design is created the rows can be rearranged before output or display. For example, FIG. 22C shows a run order for a mixed-level screening design 2250 that has been randomized from the mixed-level screening design 2200 constructed in FIG. 22B.

Figure 23A:
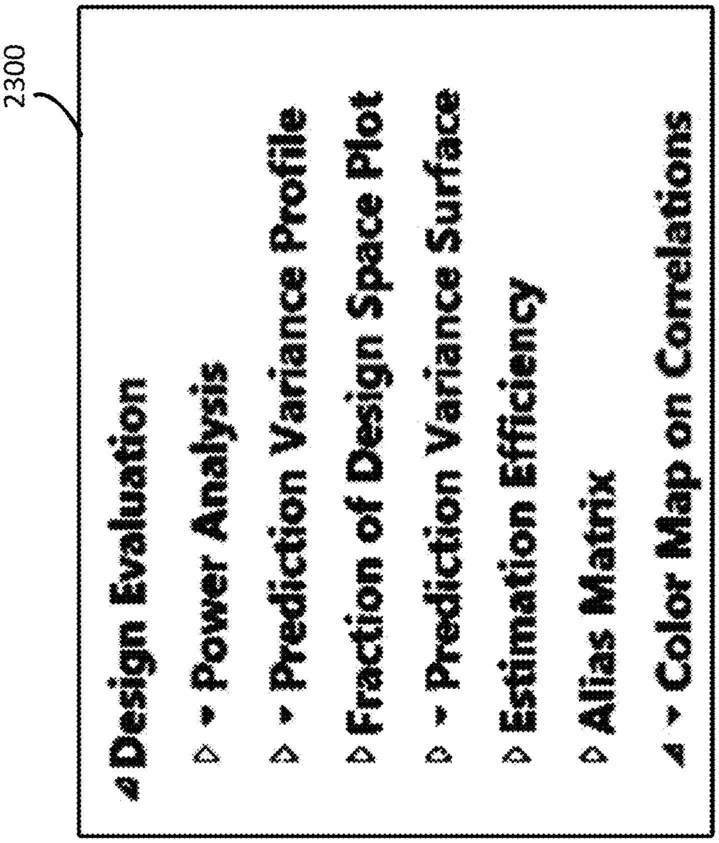
FIGS. 23A-23D illustrate graphical user interfaces for evaluating a design according to at least one embodiment of the present technology.

Once a design is generated that design can be evaluated. FIGS. 23A-23D illustrate graphical user interfaces for evaluating a design. For instance, FIG. 23A shows a graphical user interface 2300 for selecting various design evaluation tools such as power analysis, prediction variance profile, fraction of design space plot, prediction variance surface, estimation efficiency, alias matrix and color map on correlations.

Figure 23B:
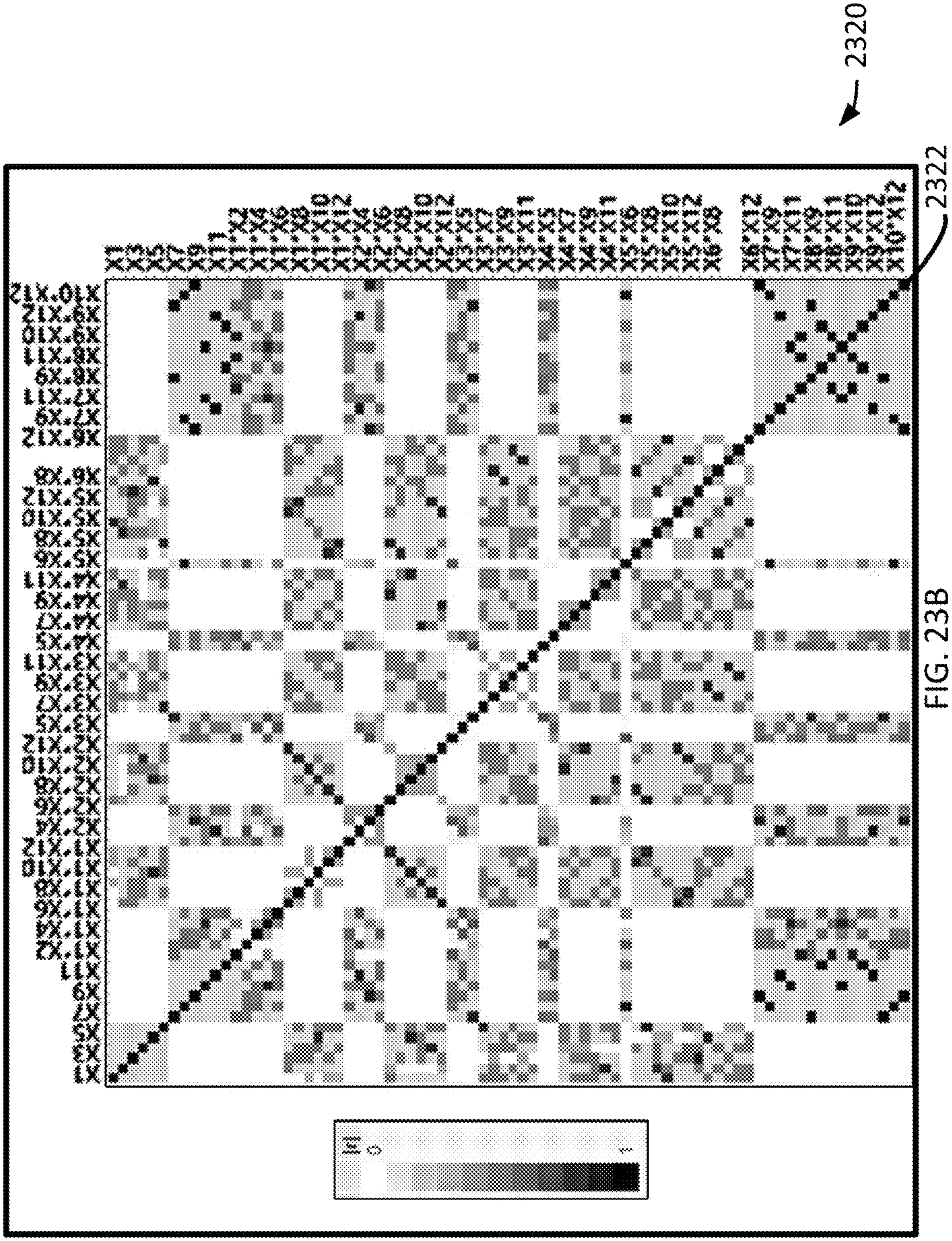
Figure 23C:
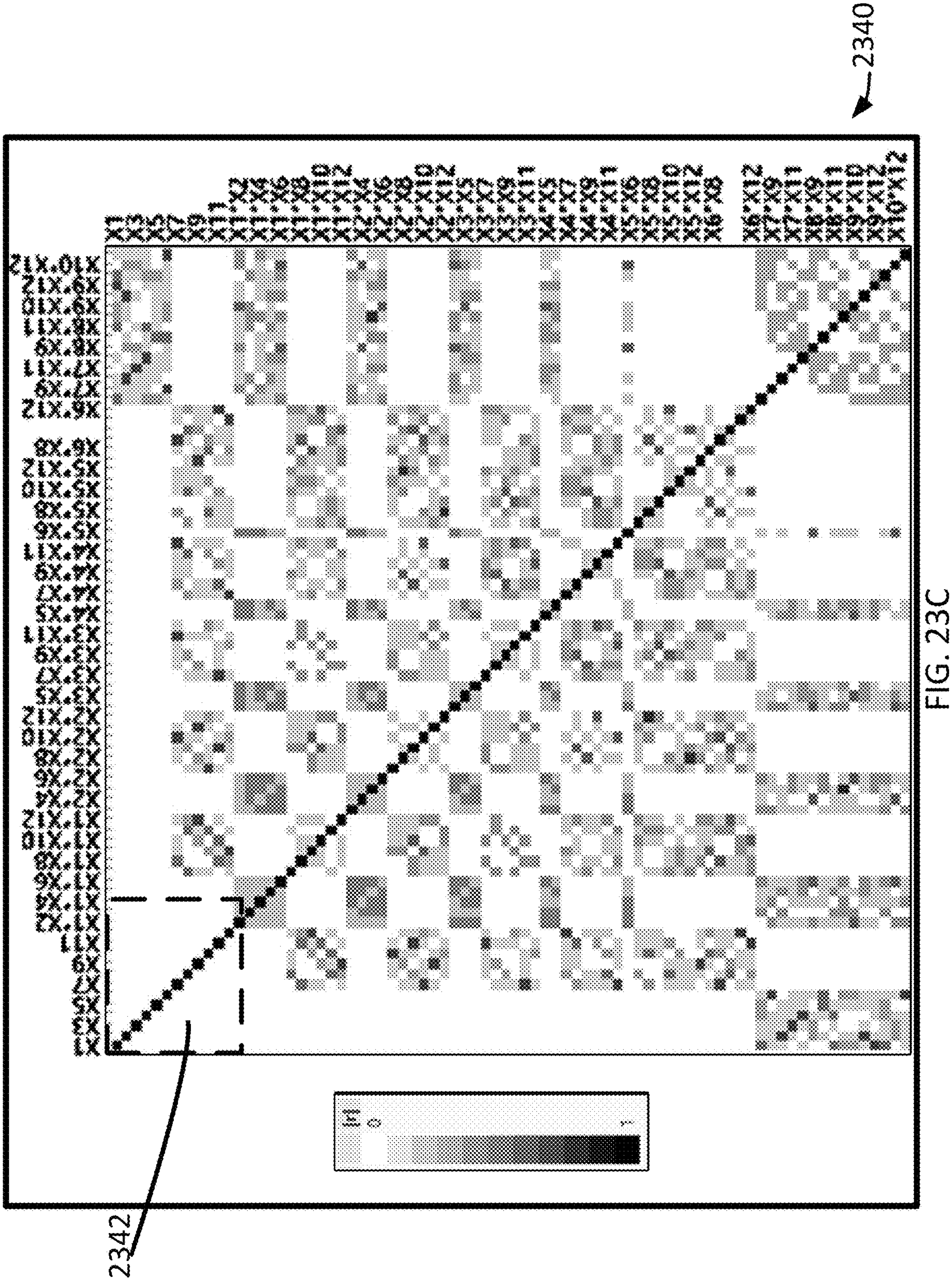
Figure 23D:
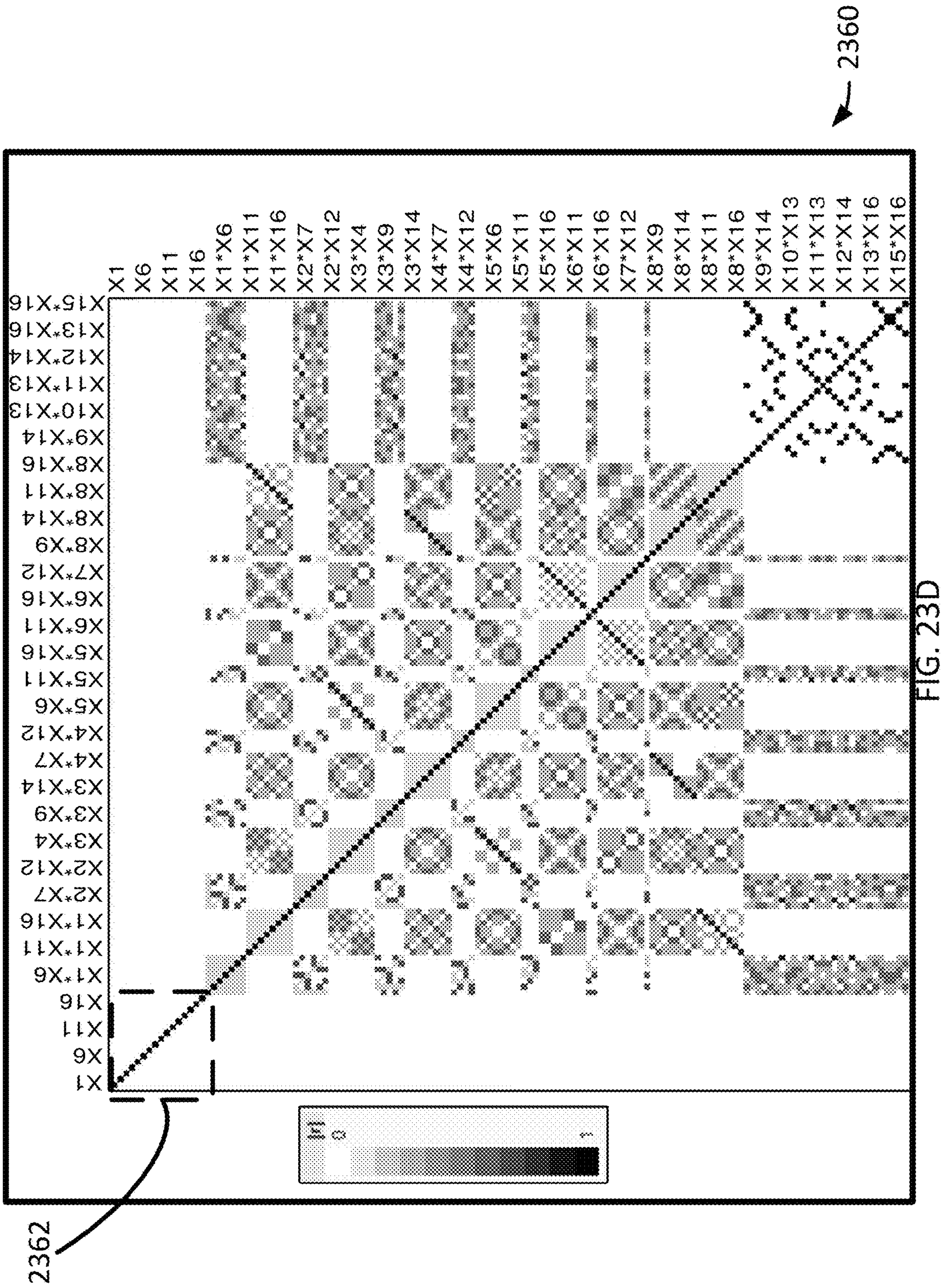

FIGS. 23B-23D illustrate color map on correlations for designs in FIGS. 20, 21, 22A, respectively. Color map correlations can provide an evaluation as to how distinguishable effects are in an experiment (e.g., discussed with respect to FIG. 17). The black coloring indicates absolute correlations of one. As with other screening design evaluations shown herein, there are black cells on the diagonal, showing correlations of model terms with themselves. For instance, FIG. 23B shows a diagonal 2322 of black cells in graph 2320. All other cells though will appear on a spectrum from white to black with the white cells indicating a correlation of zero. The gray cells correspond to correlations between quadratic terms. A design with good screening value would have mostly white off this diagonal. This graph 2320 corresponds to only a run size of 14, but still has a substantial number of cells with white to light gray cells indicating an experiment according to this design would have good screening capabilities. Further, it has a different pattern of orthogonality than the design evaluation 1700 in FIG. 17. Therefore, depending on experiment objectives, the mixed-level screening design may provide a preferred design over a definitive screening design.

FIG. 23C corresponds to a color map on correlations for the design shown in FIG. 21. FIG. 23C shows an improvement in cell color in graph 2340 over both the evaluations in FIGS. 17 and 23A. For example, zone 2342, pertaining to graphing the correlation between individual variables, shows all white cells off the diagonal indicating no correlation. In this case, the composite design formed from combining subdesigns according to the second option 1902 shows orthogonality in zone 2342 for main effects of multiple factors. FIG. 23C design uses only a run size of 24, and still has good coverage over other zones of graph 2340 even compared to the definitive screen design coverage with more runs in FIG. 17 (showing 30 runs).

FIG. 23D shows a graph 2360 of a color map on correlations for the design shown in FIG. 22A. The graph 2360 shows good coverage using an increased run size of 32 according to third option 1903. Zone 2362 corresponds to the main effects for two-factor interactions and all main effects between two-factor interactions are orthogonal as shown by the white cells in graph 2360. A color map on correlations for the design shown in FIG. 22B would have similar features but less data points since the subdesigns are based on the matrices of FIG. 22A. For instance, main effects for two-factor interactions would be orthogonal.

Embodiments allow computing systems to accommodate various run sizes given a factor specification and, depending on objectives, can provide a better design than a definitive screening design. For instance, a computing system can partition factors into groups, such as a three-level group, and a two-level group, and dynamically move factors from one group to the other depending on the required run size and nature of the factors. A computing system can have default rules for assigning factors to different groups.

For instance, example default rules can include that continuous factors can belong to the three-level group (preferred) or two-level group (if needed). Categorical factors can belong to the two-level group. Discrete Numeric factors at three levels can belong to the three-level group (preferred) or two-level group (if needed). Factors with two levels would be in the two-level group only. One of ordinary skill in the art will appreciate other or different default rules that can be useful. For instance, in some embodiments, categorical factors can always be assigned to a group that reflects their number of candidate options. For example, if there are four candidate options, the categorical factor can be assigned to a four-level group. Embodiments also allow user control over factors or default rules.

Figure 24:
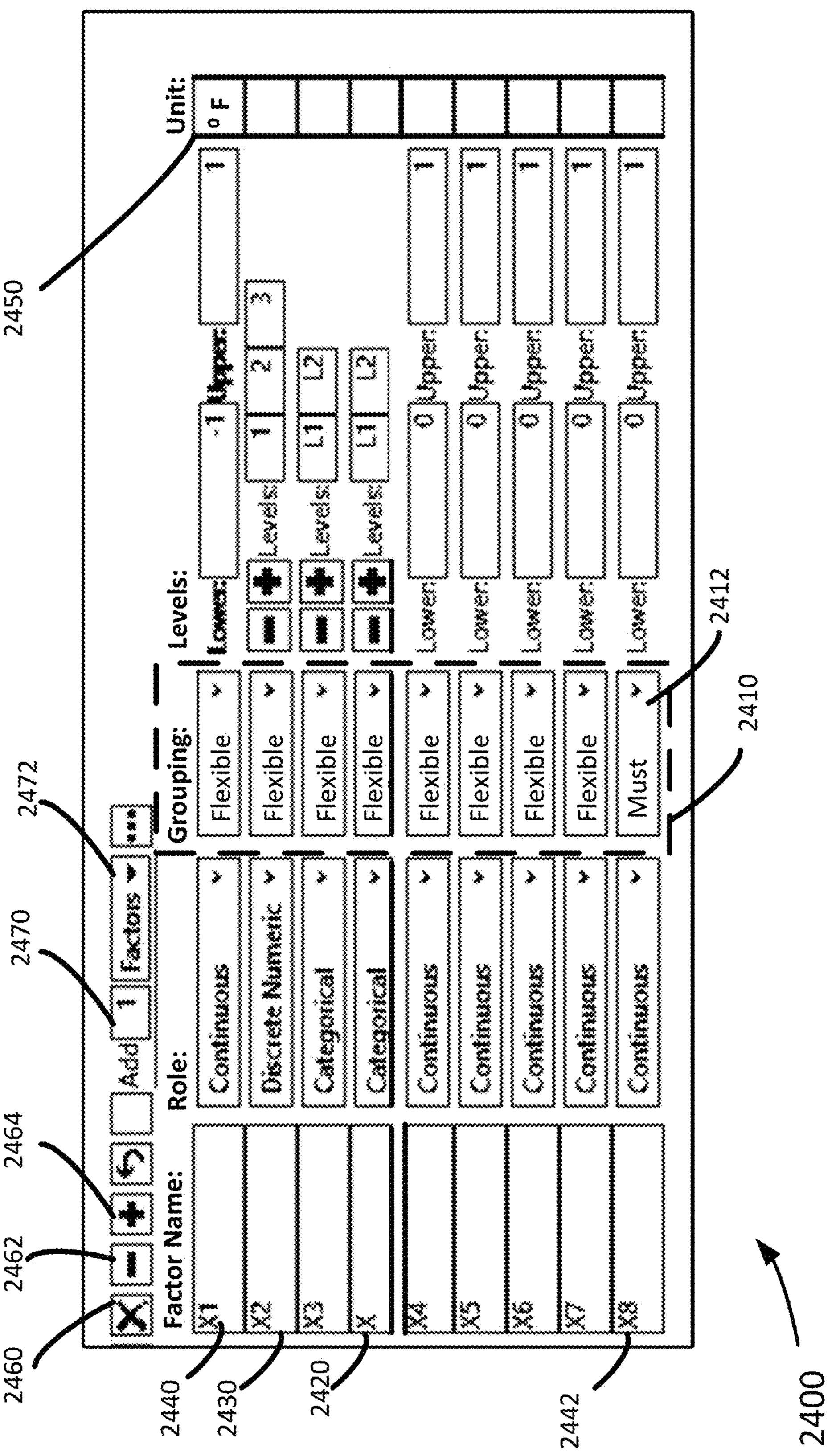
FIG. 24 illustrates a graphical user interface for specifying factors for mixed-level screening design generation according to at least one embodiment of the present technology.

FIG. 24 illustrates a graphical user interface 2400 for specifying factors for mixed-level screening design generation. For instance, the graphical user interface 2400 can be used to specify one or more categorical factors (e.g., categorical factor 2420 specifies two allowable inputs L1 and L2). Alternatively, or additionally, the graphical user interface 2400 can be used to specify one or more discrete numeric factors with two or more allowable inputs (e.g., factor 2430 specifies Levels 1, 2 and 3). Alternatively, or additionally, the graphical user interface 2400 can be used to specify one or more continuous factors with respective inputs within one or more ranges. For example, continuous factor 2440 specifies a continuous factor with a range between −1 and 1, and continuous factor 2442 specifies a continuous factor with a range between 0 and 1. Other distinguishing features can be added to describe the factors. For instance, unit column 2450 allows for the user to specify optional measurement units. In this example, continuous factor 2440 is a temperature factor and the unit specified is degrees fahrenheit ("° F."). Other units could be specified depending on the type of factor such as meter, liter, ampere, to name a few.

Furthermore, grouping control 2410 allows the users to specify the preferred group that factors should be assigned to. For instance, "Flexible" could be changed to "Preferred Type" to indicate whether a factor should be in the three- or two-level group. With this setting, the computing system (e.g., computing device 1440 or computing system 1400) could still change a continuous factor to a two-level group depending on the run size but would give preferential treatment to include it in the three-level group if there was room given the run size. As another example "Flexible" could be changed to a "Must" type as shown in dropdown box 2412 such that the computing system would include a factor in a particular group (e.g., increasing the user specified run size to meet the required three level group requirement). One of ordinary skill in the art will appreciate other grouping controls.

Embodiments can also have additional or alternative controls for further manipulating what factors to include in a screening design and their treatment. For example, delete control 2460 allows a user to delete a factor for a screening design. Option 2462 also allows a user to delete a factor (e.g., the last displayed factor). Add control 2470 allows a user to specify a quantity of factors to add and their factor type or role using factor drop-down 2472. Option 2464 also allows a user to add a factor (e.g., to the bottom of the displayed factors). The user can also change the factor order by selecting a factor and dragging it to a preferred location. Changing the factor order can in some embodiments influence how factors are displayed or assigned to groups in an output screening design. The user can also select factors to change their name, role, grouping, level and/or unit.

Figure 25A:
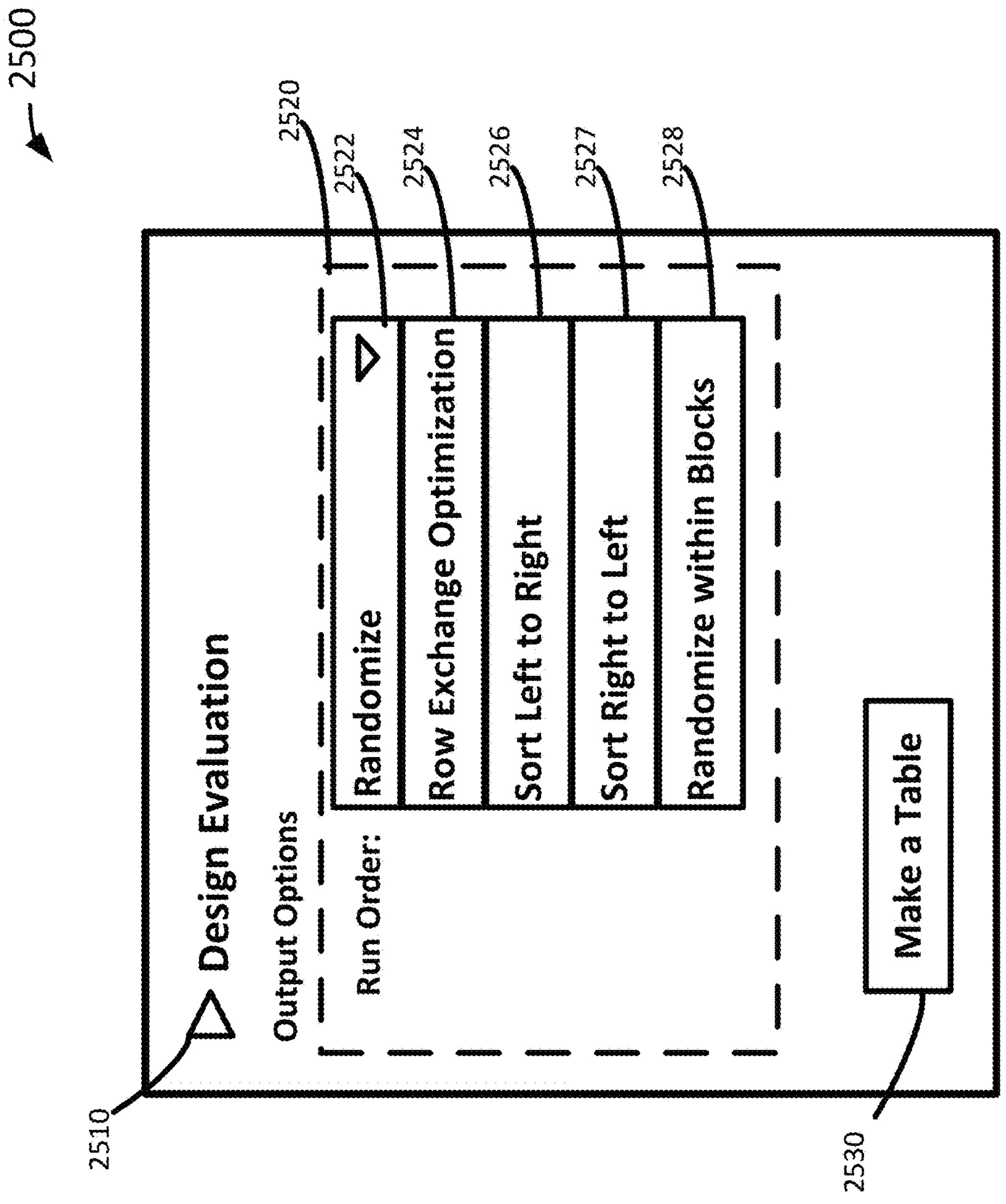

FIGS. 25A-25B illustrate a design evaluation of a screening design. FIG. 25A shows a graphical user interface 2500 for selecting options for further evaluating a design (e.g., a screening design generated according to embodiments herein). Design Evaluation control 2510 can be used to evaluate the design for secondary considerations (e.g., Bayesian D-optimality or aliasing between main effects and two-factor interactions). In one or more embodiments, a computing (e.g., computing device 1440 or computing system 1400) can control the order of runs displayed in an output design to see if this will improve those properties. For instance, a computing system could output a screening design according to a first run order (e.g., the run order displayed in FIG. 21) and then the computing system could receive an indication to change the order of runs in the screening design (e.g., using run order controls 2520). The computing system could output an updated screening design according to a second run order different from the first run order. For example, run order control 2520 provides the users options for how runs will be displayed. Selection of a Randomize option 2522 requests the computing system to display the run order in a random order. Randomize within Blocks option 2528 allows the computing system to display components of a subdesign in a random order. Selection of Sort Left to Right option 2526 and Sort Right to Left option 2527 allows a user to group rows with similar levels. For example, with sort left to right, if the first factor listed can be L1 or L2, all the beginning rows for a first factor in the output screening design would be L1 and all the ending rows for a first factor in the output screening design would be L2. Selection of a Row Exchange Optimization option 2524 allows the computing system to switch rows in consideration of secondary criteria.

Figure 26A:
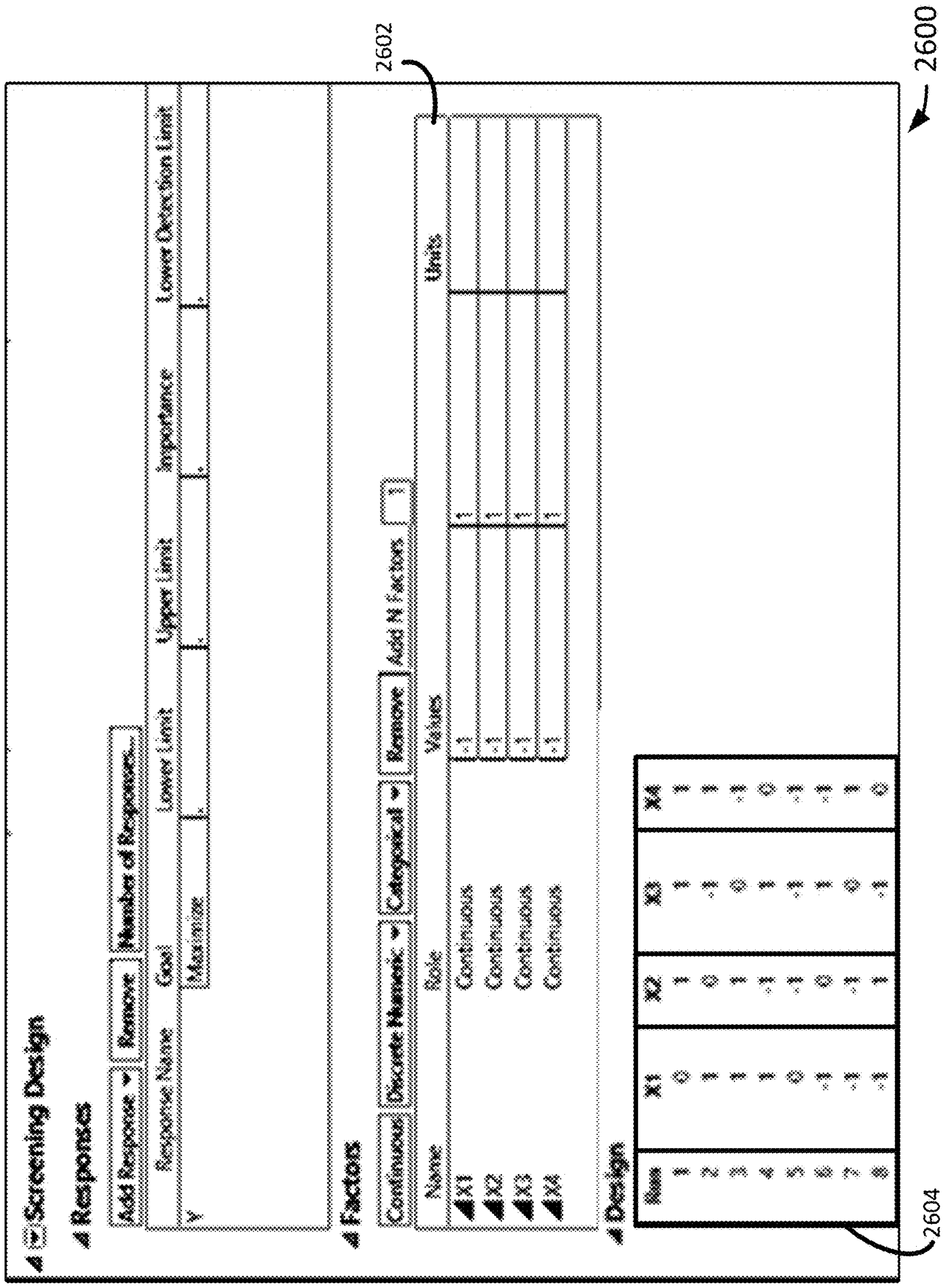
FIGS. 26A-26B illustrate graphical user interfaces for updating run size according to at least one embodiment of the present technology.
Figure 26B:
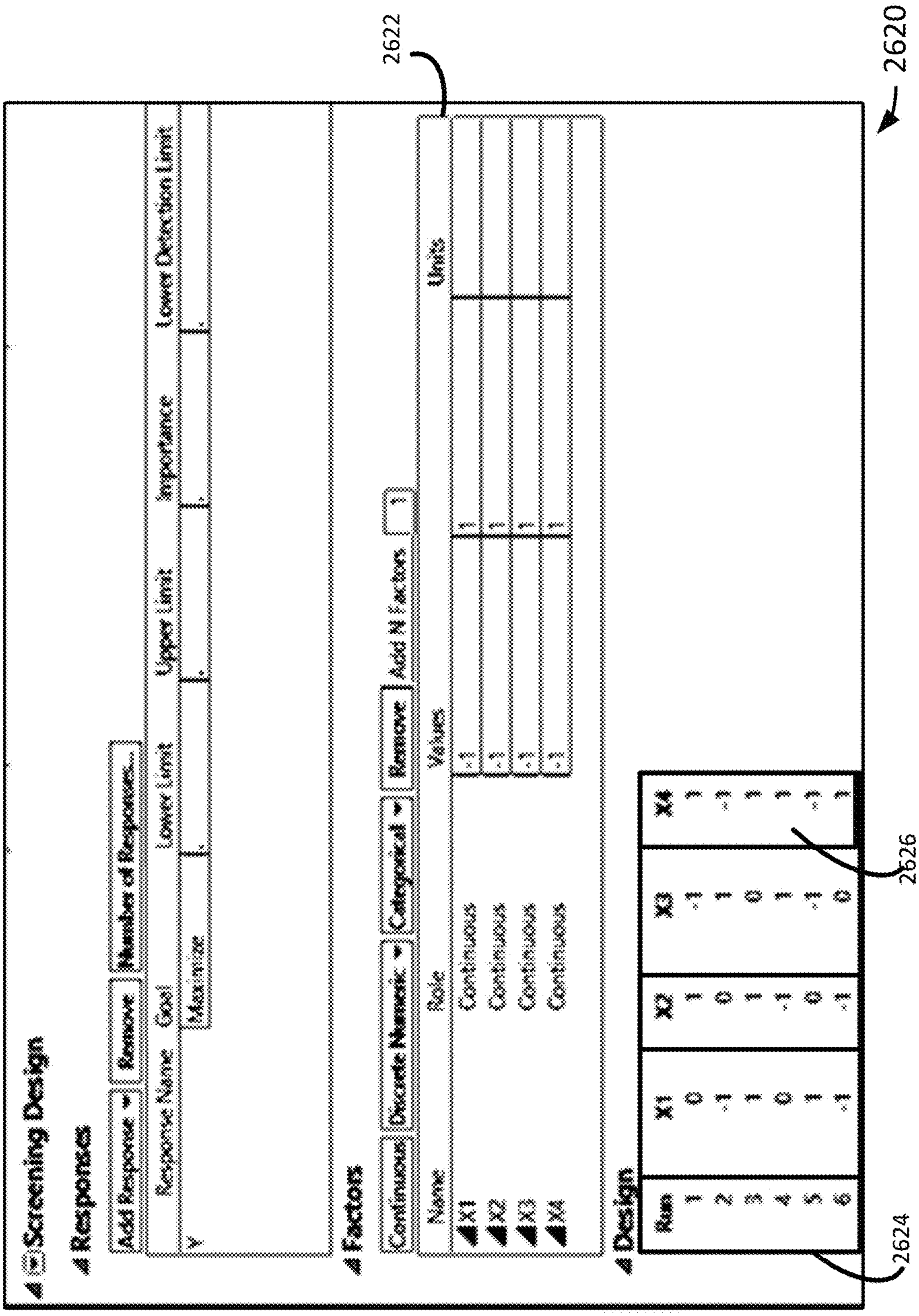

FIG. 26B shows an example of a computing system using a row exchange technique to improve the design of FIG. 21 while maintaining the desirable orthogonal properties of the design. In some embodiments, the computing system can take these orthogonal properties into account, and consider changing the ordering of the rows, which can even further improve the properties regarding the possibility of estimating two-factor interactions or reducing aliasing between main effects and two-factor interactions. As such, the computing system can use this technique to iteratively consider swaps of pairs of rows, making the switch if the computing system observes an improvement in secondary considerations (e.g., Bayesian D-optimality or aliasing between main effects and two-factor interactions). For example, in FIG. 26B run 4 in portion 2550 can be switched with run 11 in portion 2552 of mixed-level screening design 2100.

In some embodiments, after the design is constructed, a computing system can swap rows in a block or subdesign described herein to improve other criteria without changing the desirable properties of the design using a block optimized row exchange method, which is an improvement to whole row-swapping or row exchange techniques. Row-exchange techniques typically focus on the entire design, but embodiments can take advantage of being able to look at the subdesigns used for construction of a design according to embodiments herein. For instance, a computing system has generated a subdesign 2112. The computing system can generate a second subdesign option for the screening design option by changing an order of runs in the subdesign 2112. For example, portion 2560 can be switched with portion 2562 in subdesign 2112 without changing other aspects of rows 14 and 21.

The computing system can score each of the subdesign options according to the construction criteria and output, based on the scoring, at most one of the subdesign options as a component of the mixed-level screening design 2100. This approach is applicable to any of the subdesigns. As another example, portion 2570 can be swapped with portion 2572 in subdesign 2120B without changing other aspects of rows 19 and 22. This portion swapping within different subdesigns and scoring can be carried out in parallel or at different points of time.

For instance, a computing system implementing a block optimized row exchange method could for instance select a block and row within a block and consider changing its position with all other rows within the block. If one of those swaps improves the specified criterion, the computing system makes the swap with the greatest improvement. The computing system can iterate through each row and/or block until no improvement can be found or a processing constraint is reached. In some embodiments, blocks and/or rows of blocks can be randomly indexed for selecting rows to consider swapping. In some embodiments, criterion can include the correlations between effects criteria, such as main effects and second order effects, or correlations between pairs second order effects criteria. Criterion could be based on optimality criteria such as A-optimality, or I-optimality.

In one or more embodiments, the computing system can output, to the graphical user interface, an evaluation for screening capabilities of the mixed-level screening design according to a first construction criteria (e.g., according to a construction approach selected in FIG. 19). A computing system can receive secondary construction criteria. For instance, a computing system can receive secondary construction criteria in response to the user selecting to change the run order according to Row Exchange Optimization option 2524. The secondary criteria could be a default criteria such as one related to one or more of correlations, estimation, and aliasing in effects criteria. Alternatively, or additionally, the user can select a particular secondary criteria or a prioritization of secondary criteria. The computing system can output, to the graphical user interface, an updated mixed-level screening design according to the secondary construction criteria without changing the evaluation (e.g., in response to selecting make-a-table option 2530 in FIG. 25A).

Options shown in FIG. 25A could be presented to the user differently. For example, optimization options could be presented separately in a drop-down box allowing the user to select the type of optimization and/or secondary criteria. The user could separately change how the run order is displayed for conducting the experiment (e.g., using Sort Left to Right option 2526 to allow a computing system to make less changes from the previous inputs to conduct a new experiment trial according to a run).

Once a design is generated a user can also change the run size. FIGS. 26A-26B illustrate a graphical user interface for updating run size according to at least one embodiment of the present technology. FIG. 26A shows a graphical user interface 2600 with four continuous factors defined for the experiment in factor table 2602. A generated design 2604 is generated for a user requested eight runs according to construction type of first option 1901 in FIG. 19 where the design can accommodate a number of factors close to the run size and main effects in the design can be correlated with second-order effects.

In some example default preferences can be set. For example, by default, a computing system can assign continuous factors and discrete numeric factors to the three-level group when possible given run size. In FIG. 26A, each of the factors was assigned to a 3-level group and the resulting design assigns three levels to each factor (−1, 0, 1) across the runs of the design. These levels were selected to show that the values selected were from ends and the middle of available options for the continuous factors, but other values or representations could have been displayed in factor table 2602 and/or design 2604 such as L1, L2, and L3 or specific values within the continuous range.

In one or more embodiments, the users can still reduce the run size (e.g., if there are more factors in the three-level group than the two-level group). The computing system can accomplish this by swapping factors from the three-level group to the two-level group. This size reduction can continue with the resulting design maintaining good properties as long as there are not more factors in the two-level group than the three-level group or until there are no factors in the three-level group that can be treated as two level factors. This partitioning and swapping mechanism allows the computing system to automatically accommodate a wide variety of run sizes for a given factor specification.

In FIG. 26B for instance, the user has four continuous factors in table 2622. This is the same four continuous factors as shown in table 2603 of FIG. 26A. However, in this case the user has requested a design of six runs according to construction type of first option 1901 of FIG. 19. The computing system has received an updated run size that changes a number of runs for the experiment from the initial run size. In this case it reduces a number of runs for the experiment from the initial run size of eight down to six runs. The computing system can output a mixed-level screening design according to the updated run size. For instance, design 2624 shows the resulting design is a mixed-level screening design because some factors are only assigned two levels and some three levels in the experiment. For instance, column 2626 shows factor X4 was assigned to a two-level group because there are only 1 and −1 levels assigned to this factor in the design whereas the other factors in the design are assigned levels from −1, 0, and 1. The computing system can execute stored computer instructions for generating a screening design according to a quantity of factors in the two-level group; a quantity of factors in the three-level group; and the initial run size such that a design 2624 is generated in graphical user interface 2620.

A computing system can receive an updated run size to further reduce a quantity of runs for the experiment to generate an updated mixed-level screening design by assigning another factor (e.g., X3) that has at least three candidate options from a three-level group to the two-level group; and output the updated mixed-level screening design which provides candidate runs for the experiment with at most two input options for the X4 and at most two input options for the second factor (e.g., X3). As another example, a computing system receives an updated run size that increases a number of runs for the experiment from the initial run size. The computing system can generate an updated mixed-level screening design by assigning a factor assigned to a two-level group (e.g., X4) to the three-level group (e.g., if the run size were increased back up to eight runs). The computing system can output the updated mixed-level screening design which provides candidate runs for the experiment with at most three input options for the X4 and at most three input options for other factors such as X1-X3.

In one or more embodiments, a computing system can receive a request indicating a user preference to prioritize a factor for assignment to the three-level group For example, a user could use a graphical user interface (e.g., graphical user interface 2400 in FIG. 24) to change a preference for X4 to "Preferred Type" or "Must" and the computing system could generate an updated mixed-level screening design by assigning the X4 to the three-level group; and one of X1-X3 to the two-level group. Design 2624 could be updated to show the output updated mixed-level screening design.

Figure 27A:
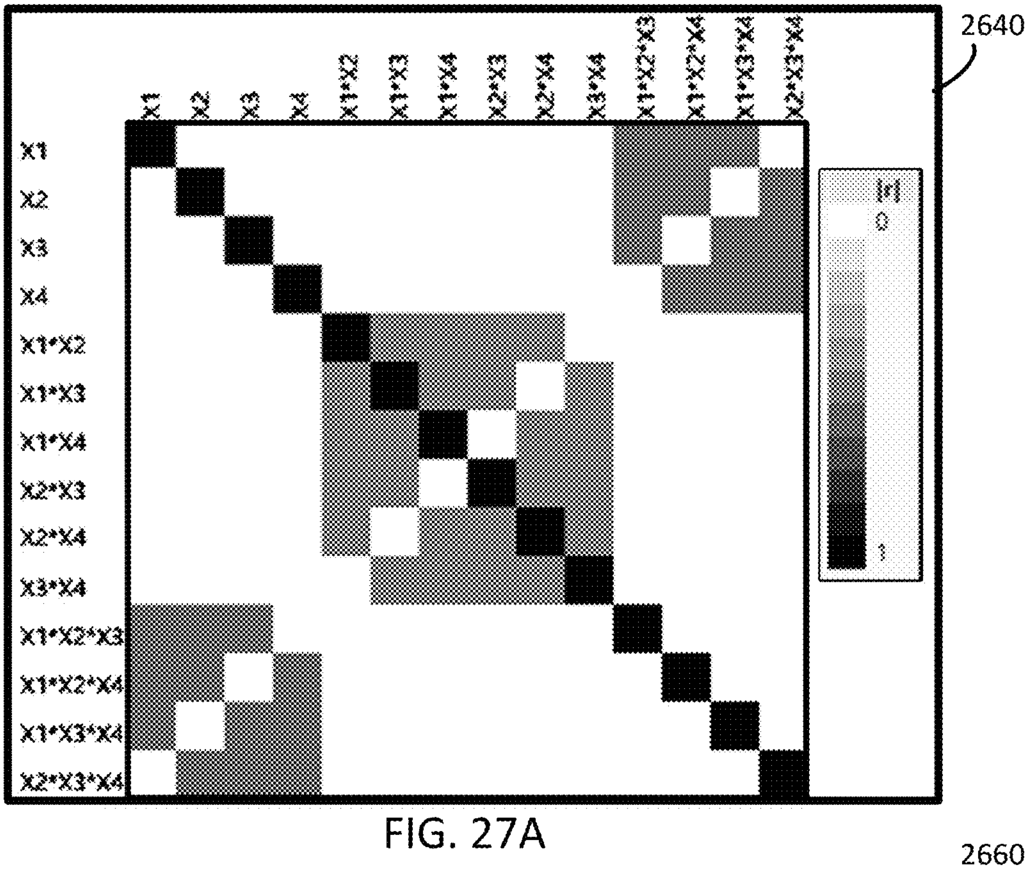
FIGS. 27A-27B illustrate design evaluations for different run sizes according to at least one embodiment of the present technology.
Figure 27B:
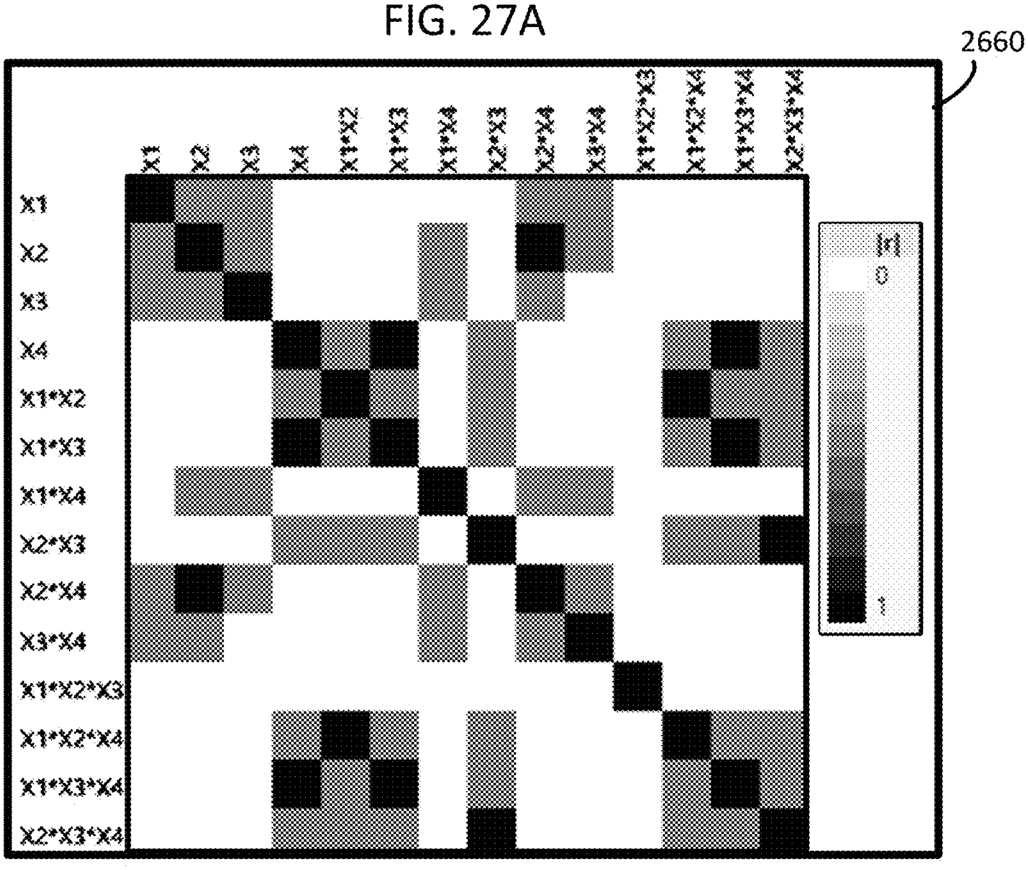

FIG. 27A shows the design evaluation 2640 for the design with eight runs and FIG. 27B shows a design evaluation 2660 for six runs. Both designs, with runs less than a definitive screening design, still show good coverage with respect to orthogonality (i.e., there is a lot of white space indicating |r|=0).

Embodiments improve approaches to generating a screening design that allow for runs less than definitive screening designs or response surface designs that could have more runs than definitive screening designs. However, embodiments can also accommodate runs equal to or greater than definitive screening designs or response surface designs providing a flexible tool for generating a design for conducting an experiment.

One or more embodiments can construct screening designs with factors at any level for a given run size (e.g., a screening design including categorical factor(s) that may have three or more levels). Where there are factors with many discrete levels, screening designs can have better properties when the run size is a multiple of two times the largest number of level combinations given any pair of columns, but embodiments can generate a screening design with a user-specified run size that may be different. With categorical factors it can preferable that each level occur in a balanced manner such as equally often or close to equally often as opposed to continuous factors or discrete numeric factors where it can be preferable to have a greater quantity of end values over middle values.

As with other examples a computing system (e.g., computing system 1400 or computing device 1440 shown in FIG. 14) can generate a screening design by generating a matrix of order m corresponding to the initial run size by generating, according to stored computer instructions, subdesigns and combining the subdesigns to form the matrix of order m. Each subdesign can correspond to a matrix of a lower order than order m.

In this case, a computing system can construct a screening design as:

$$\begin{pmatrix} D & C \\ D & -C \end{pmatrix}$$

Where D is a matrix that is an orthogonal or near orthogonal array and C is a conference matrix or based on a conference matrix (e.g., a pseudo conference matrix) and –C is its foldover.

In one example construction, a computing system (e.g., computing device 1440 or computing system 1400 shown in FIG. 14) can construct a screening design given a run size (e.g., a 2N run size) with N continuous factors and the remaining k factors are categorical with various levels, s_1, . . . , s_k. The computing system can construct or generate a conference matrix C, or matrix based on a conference matrix such as a pseudo-conference matrix, labeling the runs 1, . . . , N. The computing system can construct a matrix D that is an orthogonal array (OA) and/or near-orthogonal array (NOA) where the OA/NOA (N, s_1 . . . s_k). In some embodiments, for each row of C and its foldover, a computing system can assign categorical factors according to the labels in the conference or matrix based on a conference matrix. That is, for row 1 of D, assign the categorical factors with row 1 of C and then a second row with row 1 of D and the mirror image of row 1 of C (i.e. multiply that row by −1).

In one or more embodiments, a computing system can generate an orthogonal or near-orthogonal array such that the array has n columns, corresponding to factors in the experiment. Denoting the array by $n_{kl}(a, b)$ the number of rows with column k at level a 2 {0, . . . , sk−1} and column l at level b 2 {0, . . . , sl−1}. That is, $n_{kl}(a, b)$ is the number of times the combination (a, b) appears in columns k and l. A combinatorial definition of orthogonality provides columns k and l to be orthogonal if nkl(a, b) has the same value for all possible pairs a and b. Near can be, for instance using this definition, a difference of at most one.

Figure 28:
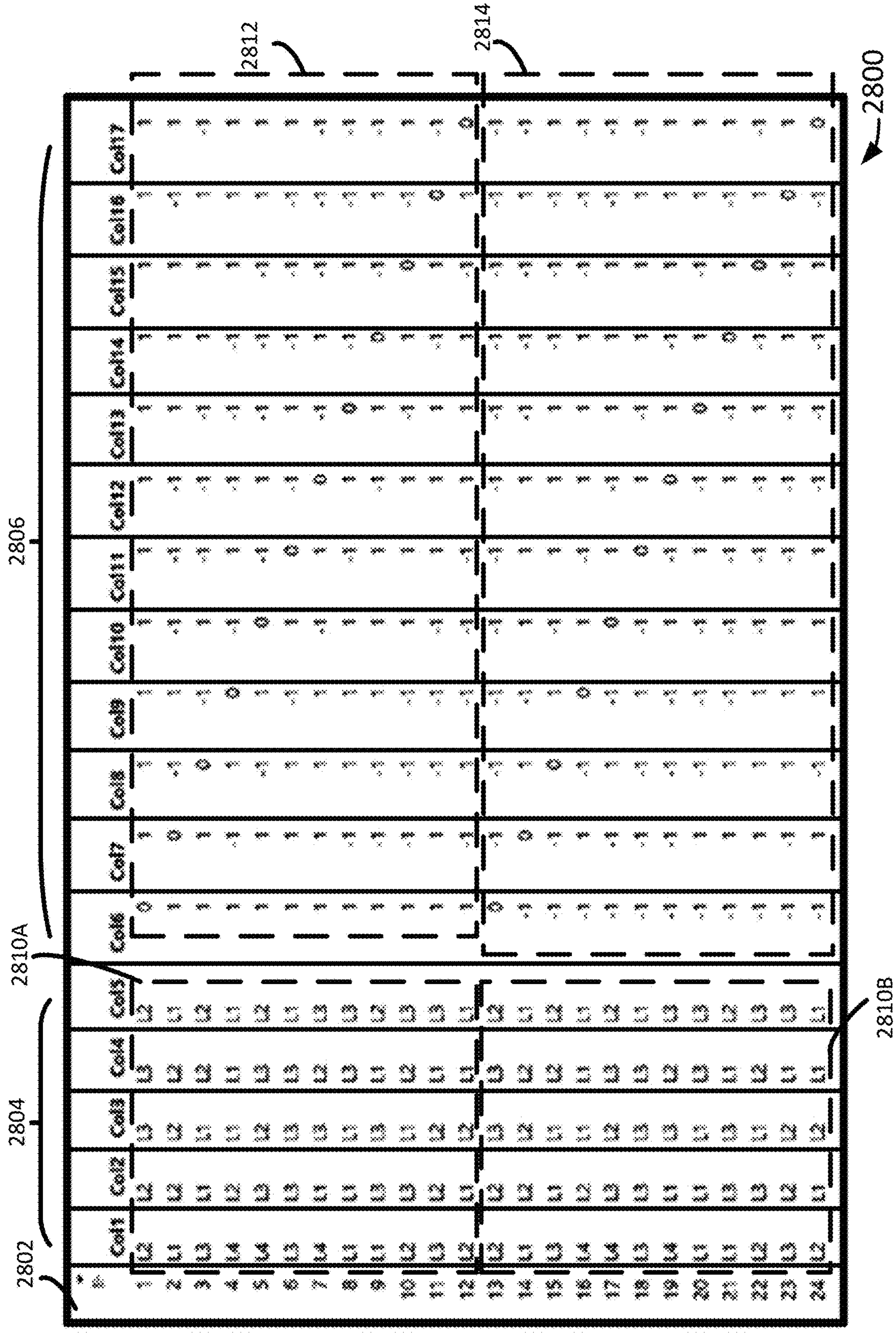

FIG. 28 illustrates a design 2800 constructed according to embodiments herein with factors with discrete levels that are at three or more levels. FIG. 28 shows a design 2800 with 24 runs. The columns 2804 include factors with discrete levels such as a 4-level categorical factor and four 3-level categorical factors. The columns 2806 include 12 continuous factors with −1, 0, and 1 assigned to represent low, medium, and high values, respectively, within one or more ranges for a respective factor. Having a center value on the continuous factors allows a computing system to detect large quadratic effects. Subdesigns 2810 correspond to a matrix D that is a near-orthogonal array. Subdesigns 2810 are repeated twice in the design (subdesign 2812A and subdesign 2812B). Subdesign 2812 corresponds to a conference matrix. Subdesign 2814 corresponds to the foldover of subdesign 2812 such that where values are −1 in subdesign 2812, they are 1 in subdesign 2814; and where they are 1 in subdesign 2812, they are −1 in subdesign 2814.

In the resulting design, continuous factors are orthogonal to the categorical effects. If a conference matrix exists, all continuous factors are orthogonal to all other factors (continuous or categorical). If an orthogonal array exists, categorical factors are orthogonal to all other factors.

To see the advantage of the design 2800 in FIG. 28, FIG. 29 shows a design 2900 using a coordinate exchange, D-optimality approach such as one performed by Custom Design provided by JMP Statistical Discovery LLC. A default of 15 seconds was used for optimizing for D-efficiency. Columns 2904 include factors with discrete levels such as a 4-level categorical factor and four 3-level factors. The columns 2906 include 12 continuous factors, but in this case, there are only two levels for continuous factors with no center values so −1 and 1 are assigned to represent low and high values within one or more ranges for a respective factor. Accordingly, the factors have similar initial properties, but have different naming conventions with factors being referred to as "Col" in FIG. 28 and "X" in FIG. 29 for distinguishing in design evaluations.

Figure 30A:
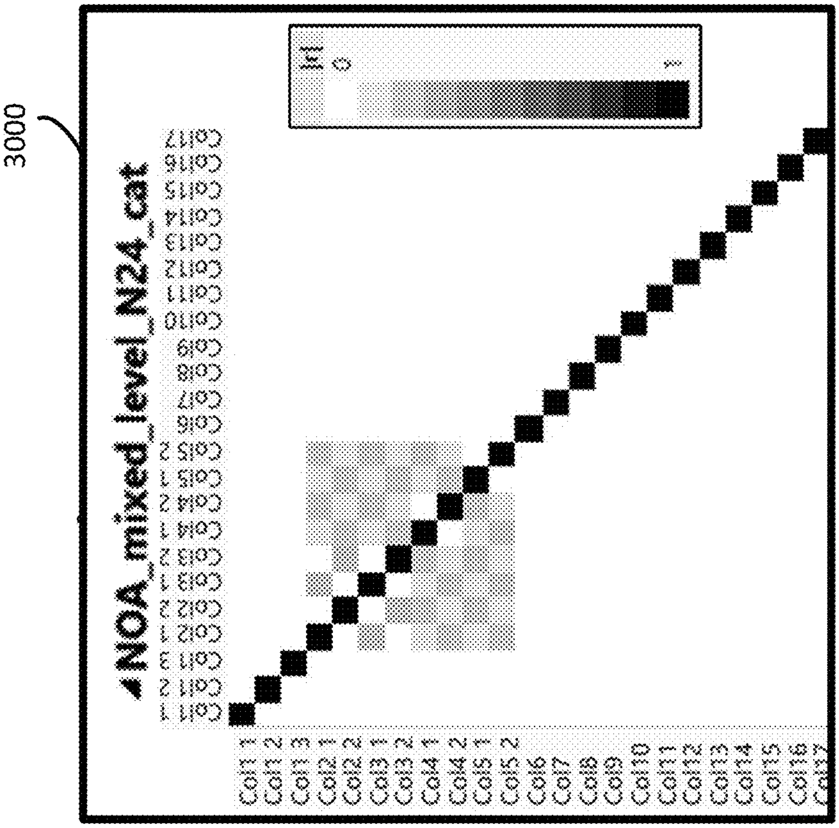
FIGS. 30A-30B show design evaluations for a 24-run design with categorical and continuous factors according to at least one embodiment of the present technology.
Figure 30B:
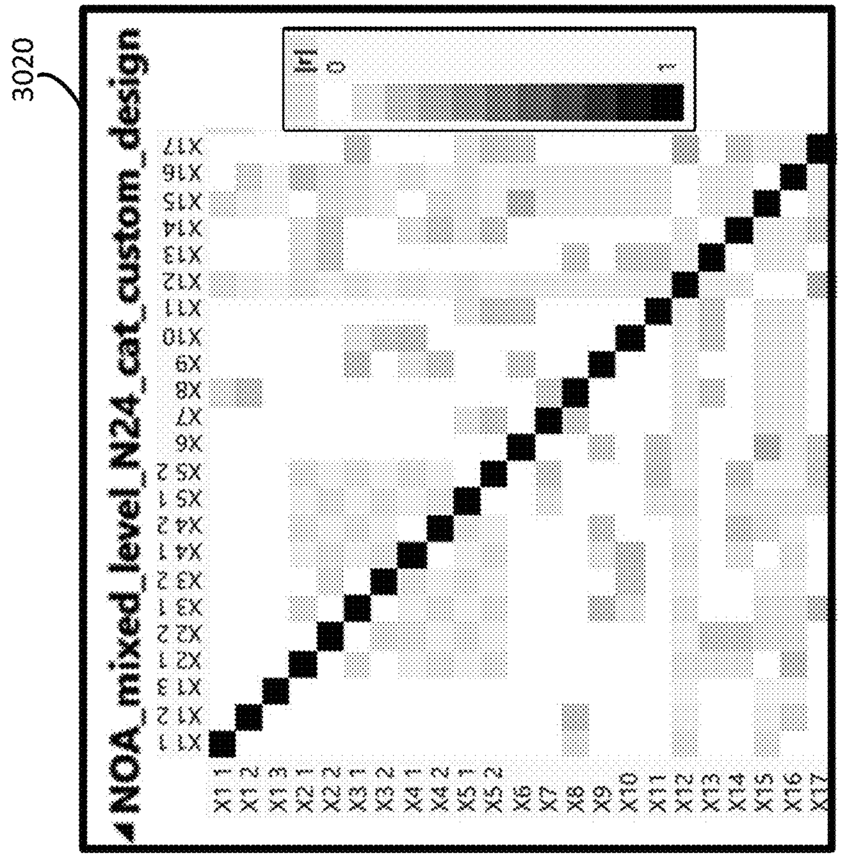

FIGS. 30A-30B show design evaluations for the designs in FIGS. 28 and 29, respectively. FIG. 30A shows a color map 3000 with mostly white cells indicating good orthogonality for main effects. In contrast, FIG. 30B had a color map 3020 with fewer white cells.

In one or more embodiments, a computing system can generate a design diagnostic indicating, for example, a D-efficiency, G-efficiency, A-efficiency, or I-efficiency of a screening design.

FIG. 31A show design diagnostics comparison for the designs in FIGS. 28 and 29, respectively. A computing system can compute relative efficiencies of a reference design $Eff_{Ref}$ to a comparison design $Eff_{comp}$ according to:

$$Eff_{Ref}/Eff_{comp}$$

$Eff_{Ref}$ and $Eff_{comp}$ are dependent on the efficiency type. For example, a computing system can compute D-efficiency according to:

$$Eff=|X'X|^{1/p}$$

where X is the design or model given p parameters. A computing system can compute A-efficiency based on the sum of variances of estimated parameters for a model, which is the sum of diagonal elements or trace of $(X'X)^{-1}$.

A computing system can compute G-efficiency based on the larger of prediction variance from Monte Carlo sampling and the largest predicted variance:

$$Var(\hat{y}|x)_{max}$$

of design points x in a design.

A computing system can compute I efficiency according to:

$$Eff=\frac{\int x'(X'X)-1xdx}{\int dx}$$

where x is the design points and X is the design or model matrix.

The design diagnostics table 3100 show that for the 24-run approach the design in FIG. 28 had greater D-efficiency, and outperforms on the other diagnostic criteria. FIG. 31B shows design diagnostic comparison for a 48-run design not shown, with a 6-level categorical factor, a 4-level categorical factor, 11 2-level categorical factors, and 24 continuous factors. The resulting design according to embodiments is orthogonal whereas Custom Design is not. The efficiency metrics in this example are all superior compared to Custom Design and produce results faster. Custom Design takes eight seconds just for a single random start, and typically is stopped after 15 to 20 seconds of improving from the random start.

Figure 32A:
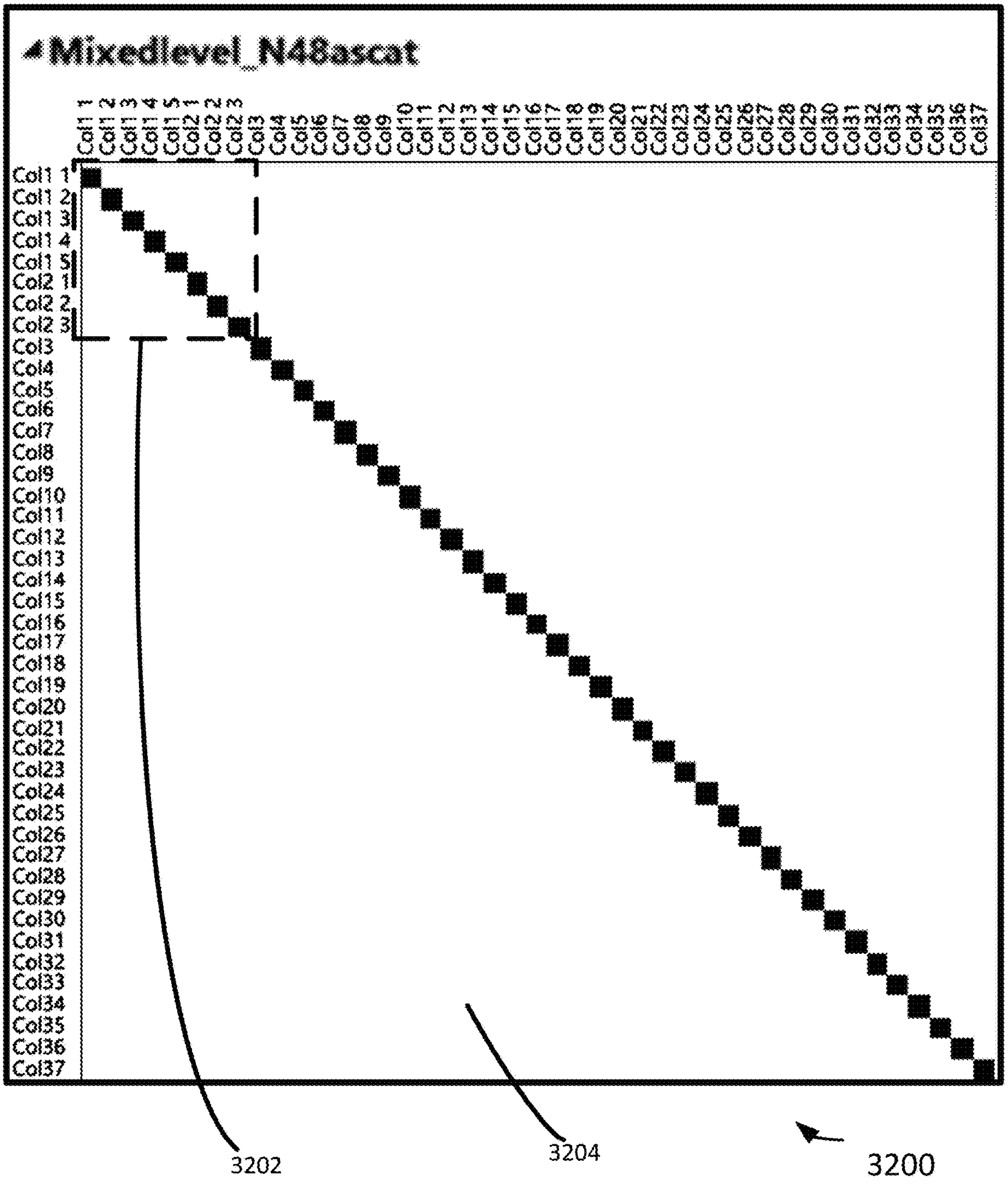
FIGS. 32A-32B illustrate design evaluations for a 48-run design with categorical and continuous factors according to at least one embodiment of the present technology.
Figure 32B:
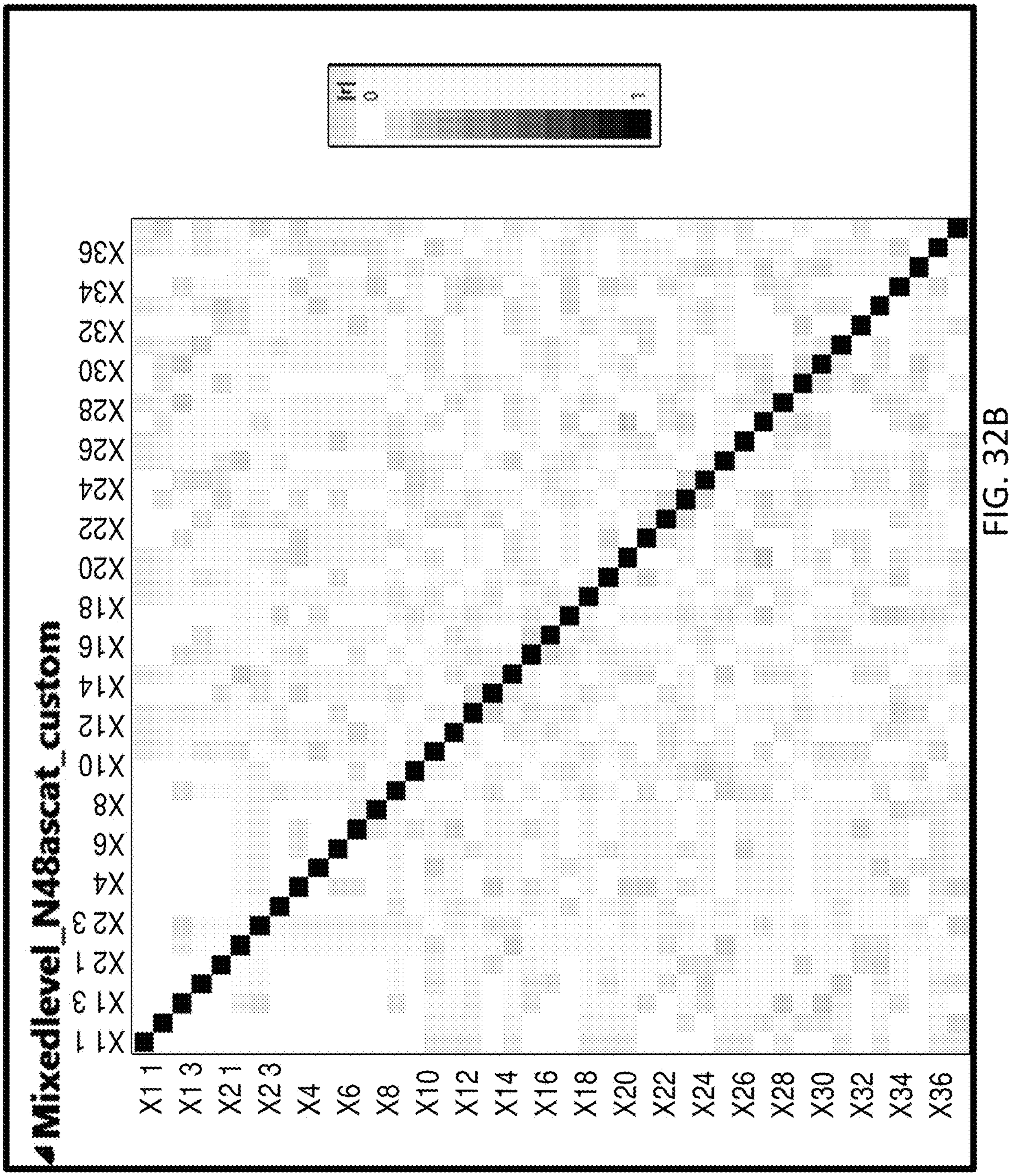

FIGS. 32A and 32B show color map design evaluations of a 48-run design with 2 categorical factors (one 6 level and one four level), 24 continuous factors, and 11 two-level factors that could be of a variable type such as continuous, discrete, or categorical. The graph 3200 in FIG. 32A evaluates a design generated using the approach in embodiments. The graph 3250 in FIG. 32B evaluates a design generated by Custom Design. Graph 3200 had significantly more white cells than graph 3250. Indeed graph 3200 had zero correlation with main effects and categorical factor contrasts.

Graph 3200 displays contrasts for the multiple factors. The graph 3200 in the design evaluation has zero correlation in zone 3202 (i.e., cells off the diagonal within zone 3202 are white indicating orthogonality). The contrasts are in a quantity equal to the number of degrees of freedom for a respective categorical factor. For instance, factor Col 1 had six candidate options, so five degrees of freedom. Factor Col. 2 had four candidate options, so three degrees of freedom.

This graph 3200 also shows that main effects for the continuous factors have zero correlation with other main effects for the continuous factors in zone 3204 (i.e., cells off the diagonal within zone 3204 are white indicating orthogonality).

Embodiments herein generate designs that can accommodate experiments with categorical factors and continuous factors at three levels, with most continuous options at a high and low value, with a few values at the center. Further they have better diagnostic properties than that of Custom Design. In other words, even if one were to ignore the ability to detect curvature for continuous effects, a practitioner would prefer the designs generated herein based on the diagnostic properties.

Figure 33:
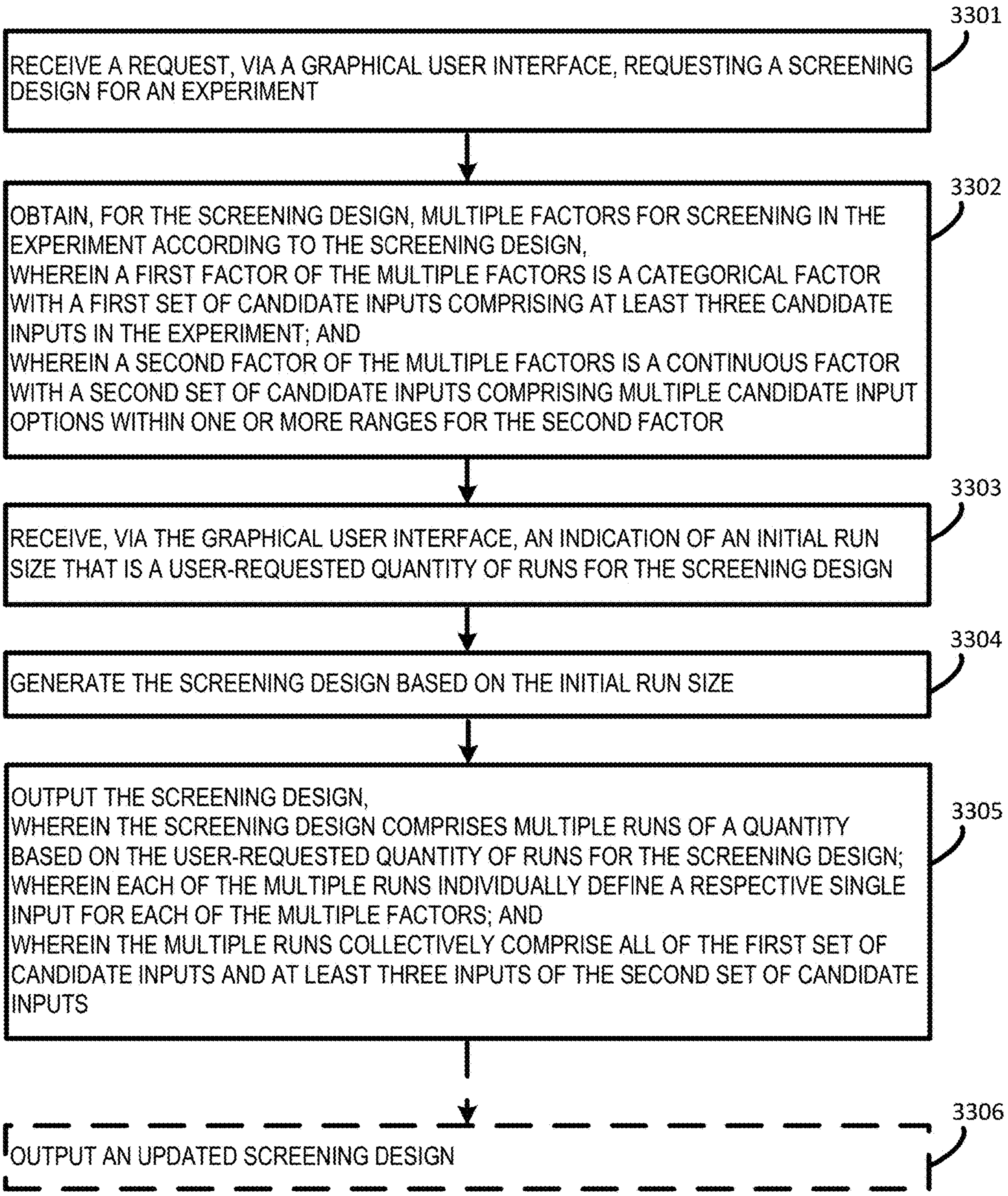
FIG. 33 illustrates a flow diagram for outputting a mixed-level screening design for categorical and continuous factors according to at least one embodiment of the present technology.

FIG. 33 illustrates a flow diagram of a method 3300 for outputting a mixed-level screening design for categorical and continuous factors according to at least one embodiment of the present technology.

The method 3300 comprises an operation 3301 that includes receiving a request, via a graphical user interface, requesting a screening design for an experiment.

The method 3300 comprises an operation 3302 that includes obtaining, for the screening design, multiple factors for screening in the experiment according to the screening design. In this example, a first factor of the multiple factors is a categorical factor with a first set of candidate inputs comprising at least three candidate inputs in the experiment. A second factor of the multiple factors is a continuous factor with a second set of candidate inputs comprising multiple candidate input options within one or more ranges for the second factor. The operation 3302 can include receiving more than the first factor and the second factor. For example, the multiple factors can include at least three or four factors with multiple continuous factors with respective candidate inputs within one or more ranges and/or multiple categorical factors having at least three candidate inputs for each of the multiple categorical factors. In some cases, a categorical factor can have more than three candidate inputs as shown in FIG. 28.

The method 3300 comprises an operation 3303 that includes receiving, via the graphical user interface, an indication of an initial run size that is a user-requested quantity of runs for the screening design. The method 3300 comprises an operation 3304 that includes generating the screening design based on the initial run size. For example, the computing system can generate one or more subdesigns representing categorical factors in the screening design and can generate one or more subdesigns representing continuous factors in the screening design and can combine the multiple factors into a composite design. For example, as shown in FIG. 28, a subdesign for one or more categorical factors of the screening design can be based on an orthogonal array or a near orthogonal array and a subdesign for one or more continuous factors can be based on a conference matrix.

The method 3300 comprises an operation 3305 that includes outputting the screening design. The screening design comprises multiple runs of a quantity based on the user-requested quantity of runs for the screening design. For instance, if the user-requested quantity of runs is fifty, the screening design can have fifty runs equal to the user-requested quantity. Each of the multiple runs individually define a respective single input for each of the multiple factors. In this way the screening design can be a computer-generated approach to specifying or controlling what inputs to use for a given run. The multiple runs collectively comprise all of the first set of candidate inputs and at least three inputs of the second set of candidate inputs. This way the screening design can account for all the categorical options of the first set of candidate inputs and representative samples of the continuous factor options of the second set of candidate inputs.

In one or more embodiments, the method 3300 optionally includes an operation 3306 for outputting an updated screening design (e.g., responsive to an indication to change a quantity of requested runs, and/or an indication to change a quantity, type, or options for factors).

Figure 34:
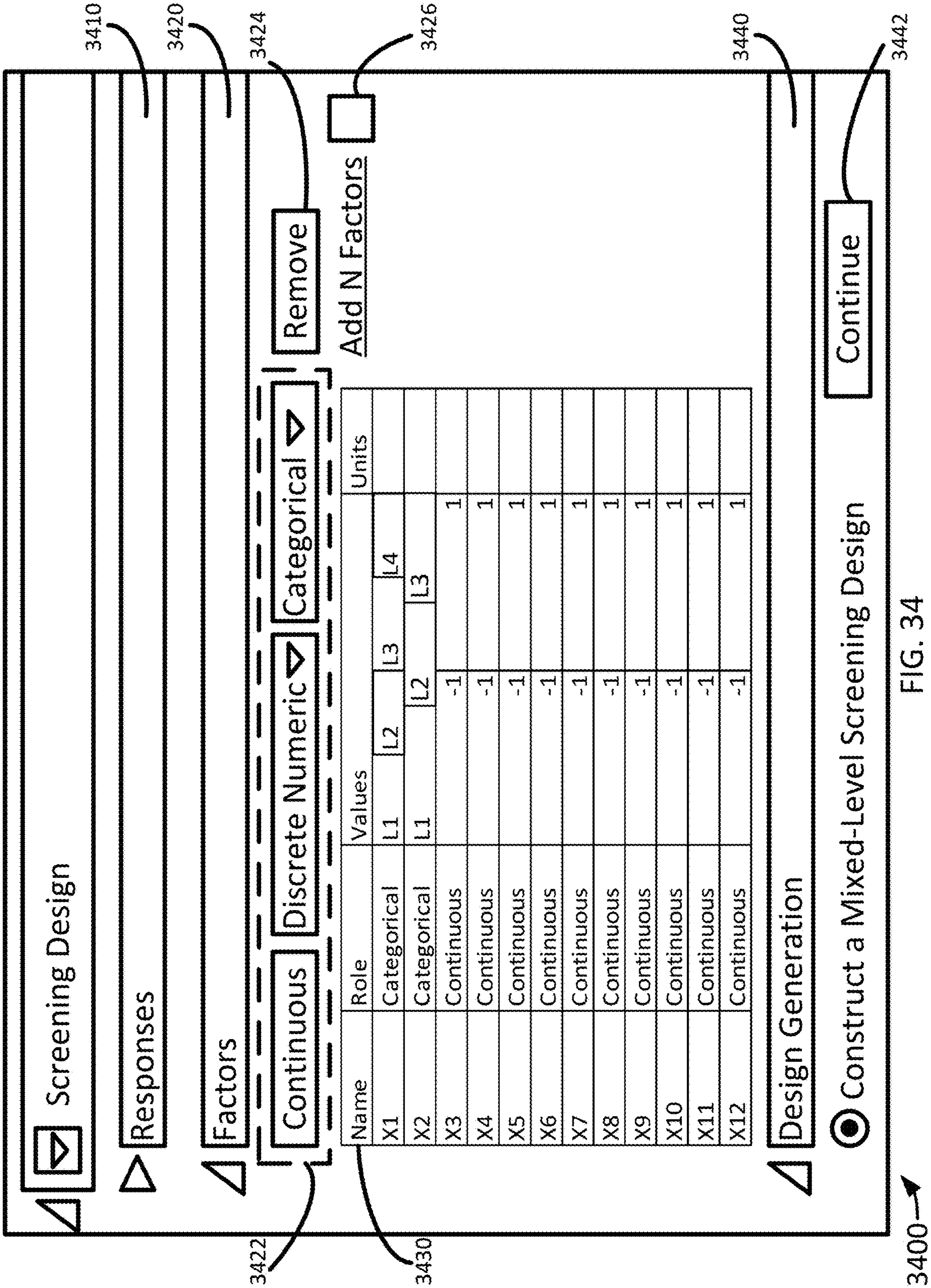
FIG. 34 illustrates a graphical user interface for requesting a screening design for categorical and continuous factors according to at least one embodiment of the present technology.

FIG. 34 illustrates a graphical user interface 3400 for requesting a screening design for categorical and continuous factors according to at least one embodiment of the present technology. Graphical user interface 3400 allows a user to control responses and factors for a screening design generated by a computing system. Graphical user interface 3400 is interactive such that a user can select response control 3410, and it will expand in response to provide options for specifying responses. Response can be, for example, outcomes or outcome goals for an experiment conducted according to the screening design. FIG. 26A shows example response controls in more detail. Factor control 3420 is shown in FIG. 34 to allow a user to specify factors, their type (e.g., continuous, discrete numeric, and categorical), options or levels for each of those factors, and any applicable units. Factor table 3430 shows factors selected by a user for a screening design. Factor table 3430 is interactive in that a user can change names, roles, values, and units for factors specified in the table. For example, a user could input into factor table 3430 units of measurement for continuous factor X3 such as meter, ampere, kilogram, etc. If a factor is selected in factor table 3430, remove control 3424 can be engaged to remove this factor in the factor table 3430.

Alternatively, or additionally, a computing system can add one or more factors to factor table 3430. For example, textbox 2426 allows the addition of factors of an unspecified or default type to factor table 3430. A user can then indicate to update the factor table 3430 to specify roles or options for these additional factors (e.g., by changing the "role" value). Type controls 3422 allow a user to add factors of specific types such as continuous, discrete numeric and categorical. Where the computing system is aware of existing factors accessible by the computing system, the computing system can provide drop down options that allow a user to pick specific factors or options. For example, if the screening design was for an experiment involving a chemical process with different chemical additives, the drop-down options for categorical may specify "chemical additives" and selection of this factor can import all known options already for that factor accessible by a computing system. Alternatively, or additionally, a drop-down menu for a specific factor type can allow a user to specify a quantity of options, so that enough value cells are added to the table. For example, categorical factor X1 has four value spots in the table whereas continuous factors may have a default quantity of two for specifying ends of a range for that factor. One of ordinary skill in the art will appreciate other techniques or controls for specifying features of factors for a screening design to a computing system.

Design generation control 3440 allows a user to select options for design generation. In this example, given the factors selected, a computing system can automatically select "construct a mixed-level screening design" responsive to the user selection of factors according to factor control 3420. The user can generate a design by selecting continue control 3442.

Figure 35A:
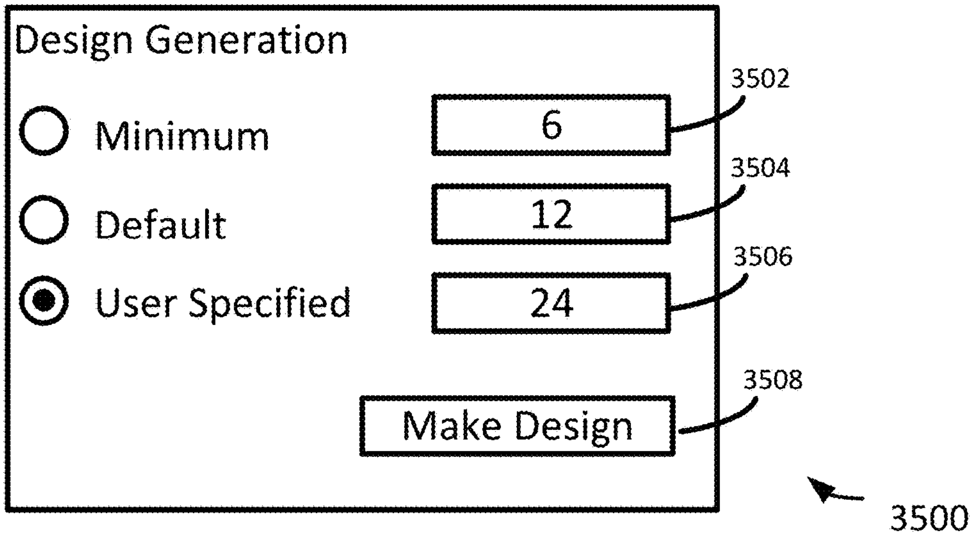
FIGS. 35A-35C illustrate graphical user interfaces for generating a screening design for categorical and continuous factors with a user-specified 24 runs.
Figure 35B:
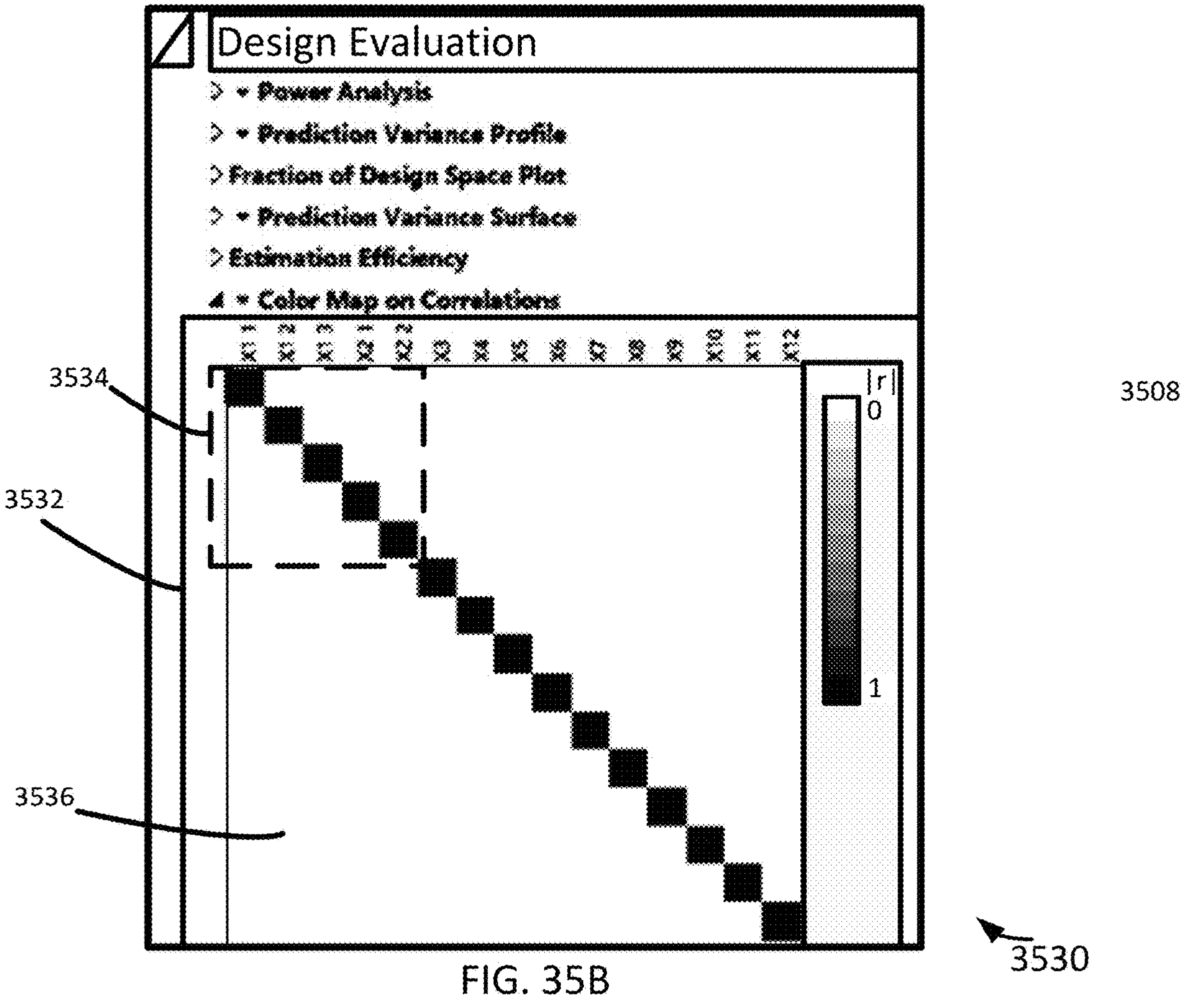
Figure 35C:
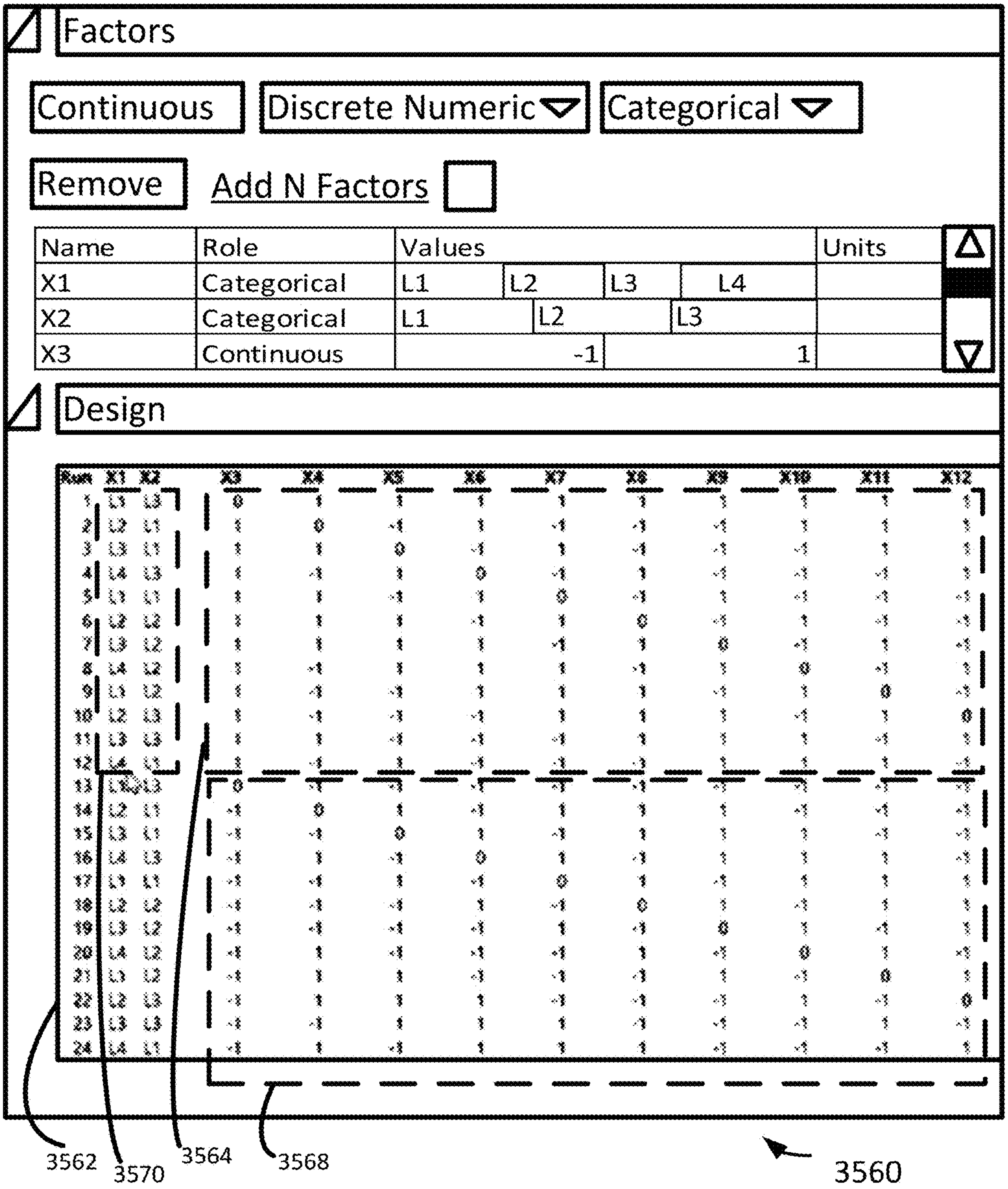

FIGS. 35A-35C illustrate graphical user interfaces for generating a screening design for categorical and continuous factors with a user-specified 24 runs. FIG. 35A shows a graphical user interface 3500 for design generation such as providing a user-specified run size for the selections in FIG. 34.

In one or more embodiments, a computing system can specify a default or minimum number of runs (e.g., to guide a user's selection). For example, the computing system can generate a default or minimum number of runs based on a construction method, system constraints, the quantity factors, the type of factors and/or candidate options for the factors. For instance, in FIG. 35A the computing system generated a minimum number of runs in field 3502 based on the minimum even number of runs for estimating the effects for specified factors (e.g., based on degrees of freedom for categorical factors). The computing system generated a default number of runs in field 3504 accounting for the candidate options. For instance, the computing system can compute a product of all factor pairs of categorical factors. The default number can be the product of factor pairs such as the highest or a smallest of these products. It could also be a multiplier of these products. For instance, in this example, there are only two factor pairs for factors X1 and X2 with respective quantities of levels of 4 and 3. A product of these quantities of levels is 12 and that is the default number of runs. In other examples, the default can be twice the highest product or 24 runs in this case. As another example in certain cases it could be a multiple of the smallest pair where an orthogonal array exists. In other examples, the default value may be preconfigured (e.g., based on processing constraints of the system) or determined based on design features. For example, a displayed option or a default could be a multiple of the smallest pair when an orthogonal array exists or otherwise a multiplier of the largest pair.

Alternatively, or additionally, a computing system (e.g., computing device 1440 or computing system 1400 shown in FIG. 14) can display a textbox 3506 for the user to specify a quantity of runs for the design. In this example, the user has selected twice the highest product or 24 runs.

The computing system can receive, via graphical user interface 3500, an indication of a run size that is a user-requested quantity of runs for the screening design such as when the user selects an option, or enters a number of runs, and selects make-design control 3308.

One or more embodiments can cause a computing system to generate a design evaluation (e.g., indicating an orthogonality of factors in the screening design). FIG. 35B shows a graphical user interface 3530 indicating a design evaluation 3532 for the design generated in response to graphical user interface selections in FIGS. 34 and 35A. As shown in this design evaluation 3532 there were multiple categorical factors (X1 and X2). Design evaluation 3532 shows a color map on correlations indicating an orthogonality of factors specified in the graphical user interface 3400. Design evaluation 3532 displays contrasts for the multiple categorical factors in the design evaluation that have zero correlation in zone 3534 (i.e., cells off the diagonal within zone 3534 are white indicating orthogonality). The contrasts are in a quantity equal to the number of degrees of freedom for a respective categorical factor. For instance, factor X1 has four candidate options as shown in FIG. 34, so three degrees of freedom. Factor X2 has three candidate options as shown in FIG. 34, so two degrees of freedom.

This design also advantageously has main effects for the continuous factors in the design evaluation 3532 that have zero correlation with other main effects for the continuous factors in zone 3536 (i.e., cells off the diagonal within zone 3536 are white indicating orthogonality). This evaluation indicates this can be a very useful screening design.

FIG. 35C shows a graphical user interface 3560 indicating the screening design 3562 for the selections made in FIGS. 34 and 35A. As shown the screening design 3562 has 24 runs and represents all the factors and levels for those factors specified in FIG. 34. A computing system can generate the screening design 3562 using a construction method described with respect to FIG. 28. For instance, a subdesign 3564 represents a pseudo conference matrix for continuous factors with two rows added to a conference matrix and subdesign 3568 represents a foldover of the subdesign 3564. This design advantageously allows for candidate options for the continuous variables to be represented by three options in the screening design 3562 (−1, 0, and 1). Subdesign 3570 represents a near orthogonal array for the categorical factors, whose selected options are repeated below it in the screening design 3562.

In this example, since there are 24 runs, the runs have an equal quantity of each element of the candidate inputs for respective categorical factors. Another words, each of levels L1-L4 for factor X1 is represented six times in the screening design 3562 and each of levels L1-L3 for factor X2 is represented eight times in the screening design 3562. In some embodiments, run sizes could be restricted or suggestions displayed to ensure that a user selects run sizes that would allow for equal quantities of each element for categorical factors or allowable run sizes can allow for unequal quantities for categorical factors.

In some embodiments, a computing system can have continuous factors according to this construction approach that have unequal quantities of each element of candidate inputs. For example, in certain circumstances it may be ideal to have fewer representation at a midpoint in a continuous range. Screening design 3562 shows fewer “0” values than 1 or −1 for each of the continuous factors X3-X12. Embodiments in constructing subdesigns based on the type of factor can generate screening designs that have different features selectively based on user specified factor types or group assignment.

In this example, the number of requested runs was based on a multiple of products of factor quantity pairs. For instance, the factors specified two categorical factors with different quantities of levels for respective factors (i.e., X1 had four options and X2 had three options). A product of those different quantities of levels is m (i.e., 12). This product m is the most of any product of quantities of levels for factor quantity pairs of the multiple factors. In this case since there were only two categorical factors it was the only factor quantity pair. The requested runs are 2m. However, embodiments can construct screening designs with factors different than a multiple of factor quantity pairs (e.g., user-requested runs that are less than twice m and/or that are not a multiple of m).

Figure 36A:
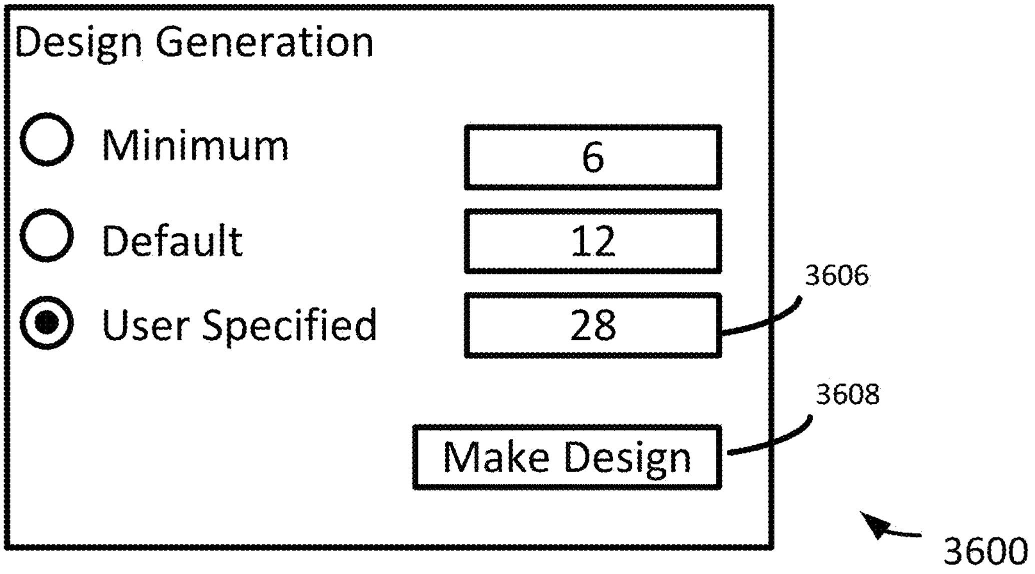
FIGS. 36A-36C illustrate graphical user interfaces for generating an updated screening design for categorical and continuous factors with for a user-specified 28 runs.
Figure 36B:
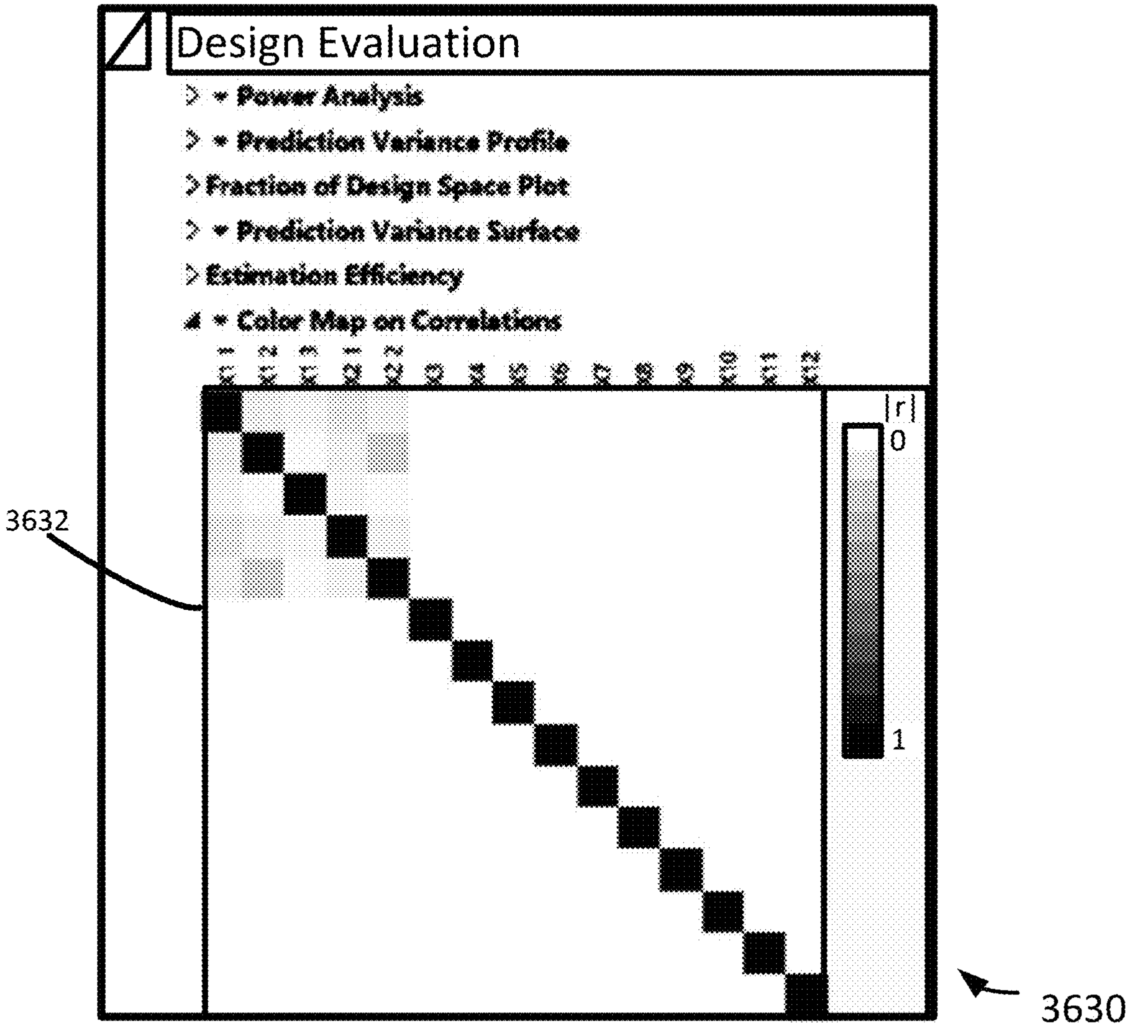
Figure 36C:
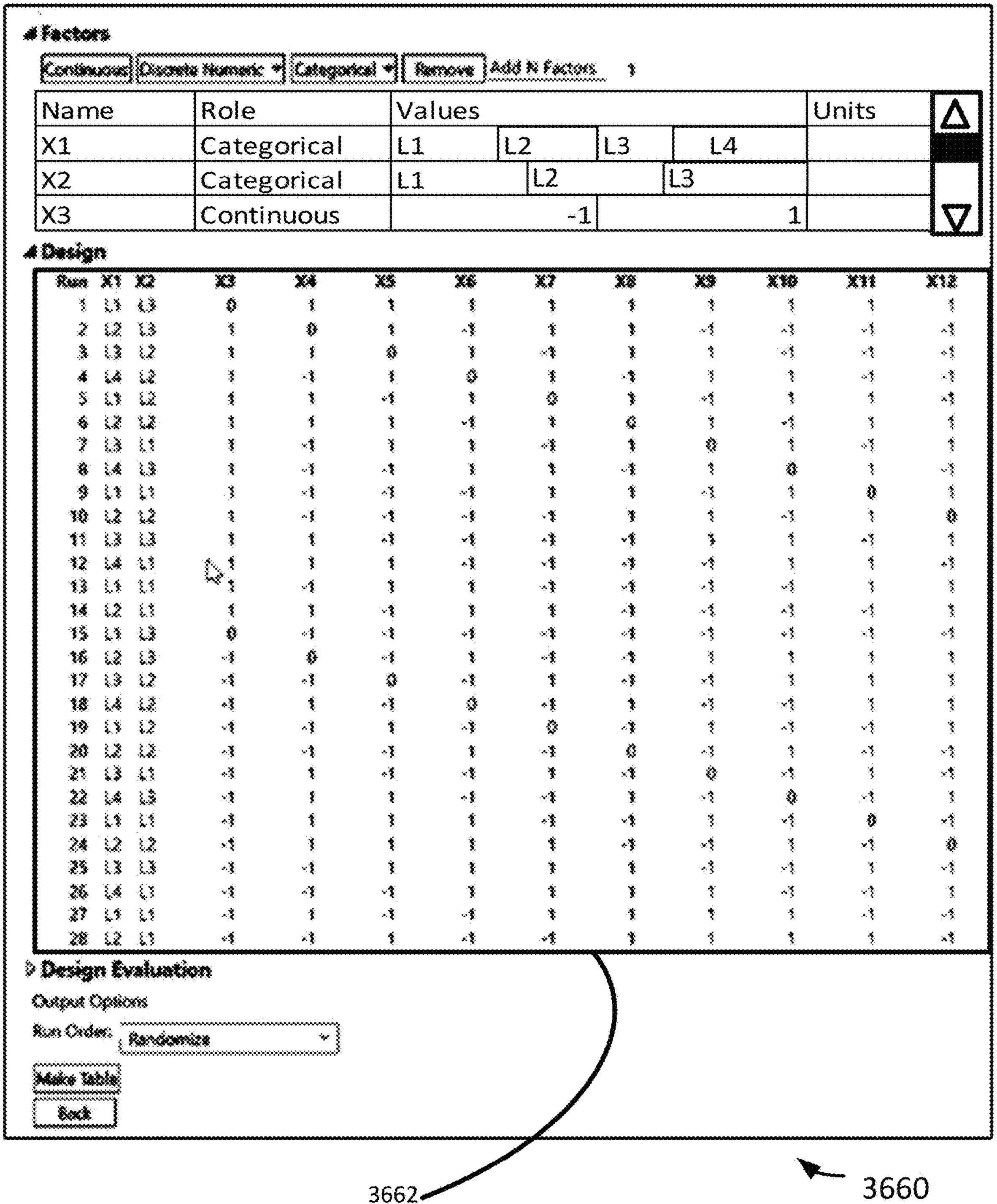

In one or more embodiments, the graphical user interface 3500 can be used to update the number of runs in a design. For instance, FIG. 36A shows a graphical user interface 3600 with an updated text box 3606 indicating a new run size of 28, which is not a multiple of m, for the categorical and continuous factor specified in FIG. 34. A computing system can receive an updated run size (e.g., for changing a quantity of runs for an experiment from the initial run size of 24) when the user selects Make Design control 3608. As shown in FIGS. 36B and 36C a computing system can generate an updated screening design. This updated screening design is generated even when the requested number of runs is not a multiple of the highest product of quantities of levels for factor pairs.

Graphical user interface 3630 in FIG. 36B shows evaluating a design generated according to the user-specified runs in FIG. 36A. A graph 3632 shows a color map on correlations indicating an orthogonality of factors specified in the graphical user interface 3400. Even with this different number of runs, the screening design still indicates mostly orthogonal cells. FIG. 36C shows a graphical user interface 3660 indicating a generated design 3662.

Figure 37A:
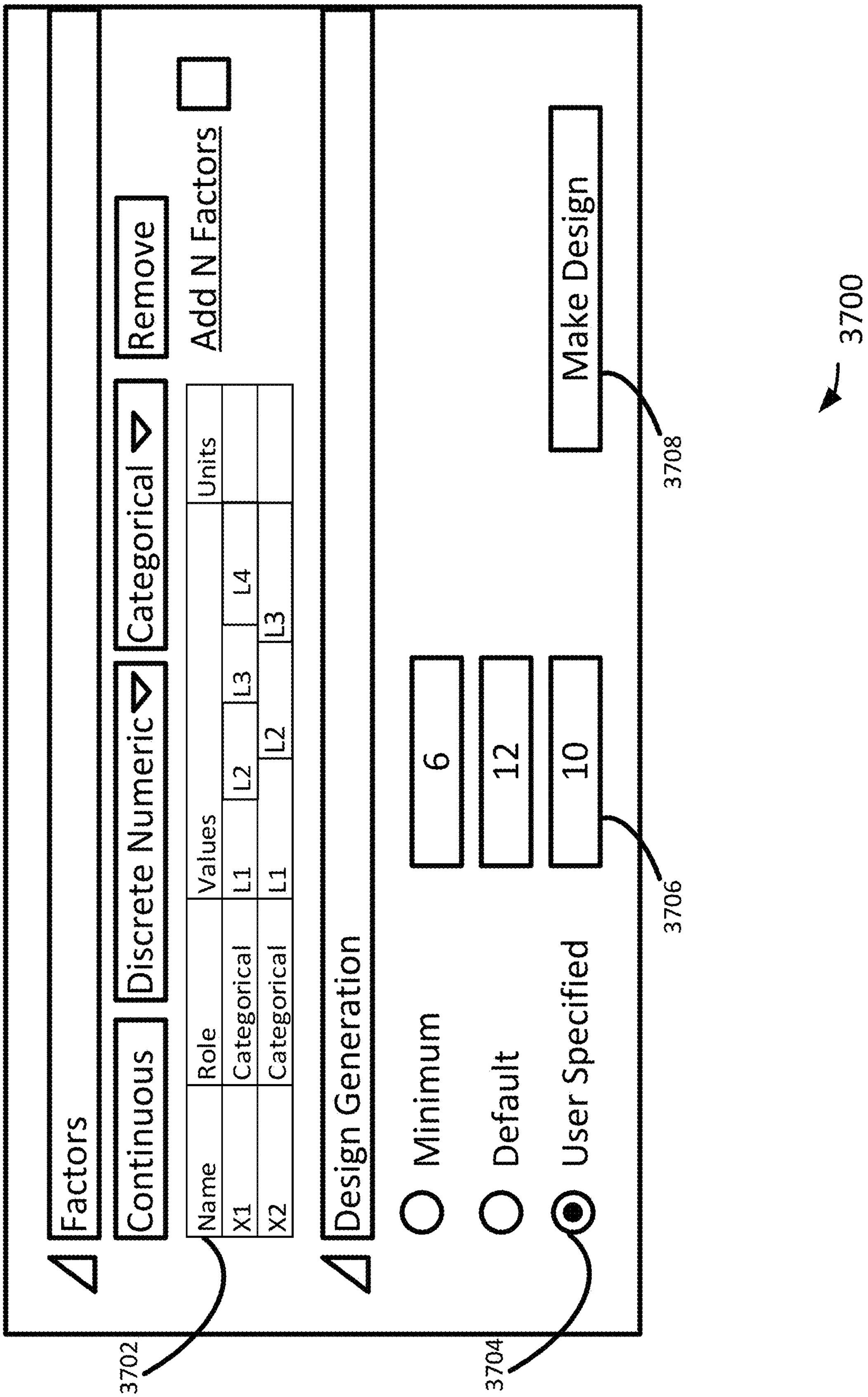
FIGS. 37A-37C illustrate graphical user interfaces for generating a screening design for categorical factors with a user-specified 10 runs.
Figure 37B:
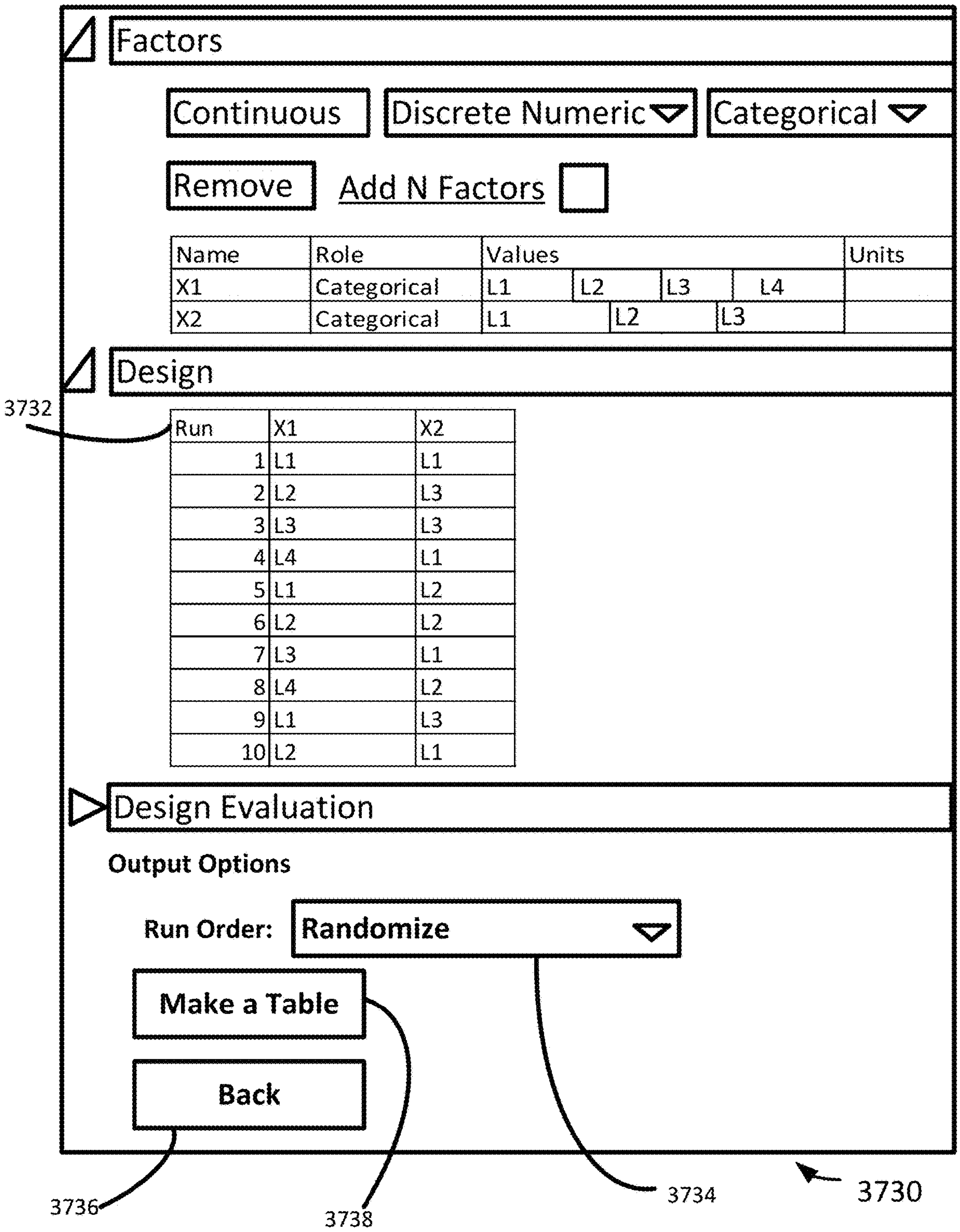
Figure 37C:
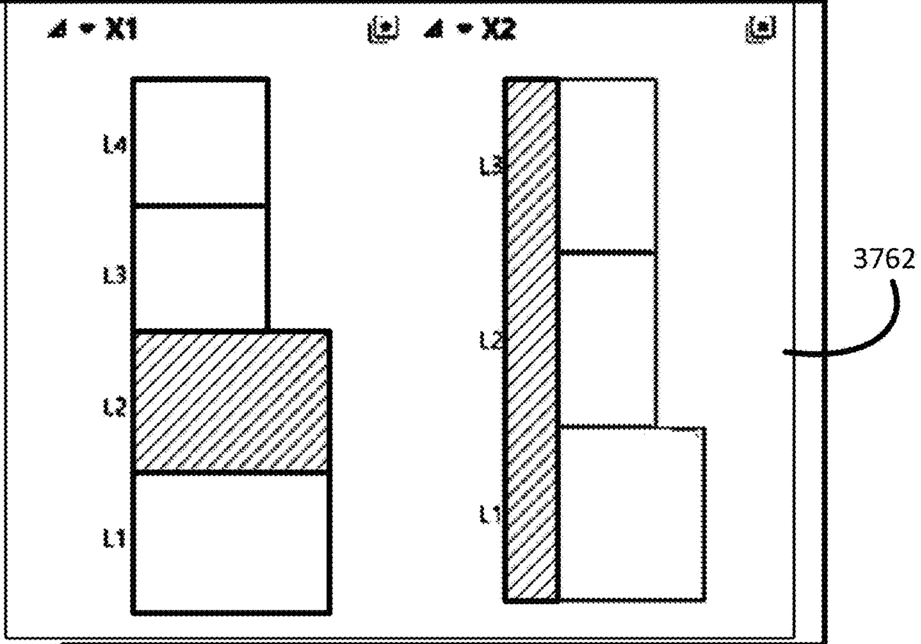

In one or more embodiments the user-requested quantity of runs can be less than twice the default number of runs. FIGS. 37A-37C illustrate graphical user interfaces for generating a screening design for categorical factors with a user-specified ten runs. In FIG. 3700 the user has only requested two categorical factors in factor table 3702. The user has specified a design with ten runs by selecting user specified option 3704 and specifying “10” in textbox 3706. The user can select Make Design control 3708 to request a computer-generated screening design with the features specified in graphical user interface 3700 (e.g., using computing system 1400 shown in FIG. 14).

FIG. 37B shows a graphical interface 3730 responsive to the factors and runs requested in graphical user interface 3700 of FIG. 37A. Design table 3732 specifies a screening design with ten runs and the two categorical factors. As with other examples, the design can be evaluated using design evaluation options shown herein. The run order can also be changed using run order drop down box 3734. For example, the design table 3732 can be considered a first run order, and the computing system can receive an indication to change the first run order for the screening design (e.g., the user can select from drop down box 3734 options such as “randomize”, “row exchange optimization”, “sort left to right”, “sort right to left” or “randomize with Blocks” described in more detail with respect to FIG. 25A). The design table 3732 can be updated according to a second run order different from the first run order responsive to the selection. A make table control 3738 allows a user to output the screening design in a tabular format (e.g., for providing to a test system conducting an experiment). A back control 3736 allows a user to return to a previous selection or graphical user interface such as a graphical user interface for specifying a run order.

FIG. 37C shows a graphical user interface 3760 indicating an evaluation of distribution of categorical factor inputs within a generated screening design. For categorical factors it is often ideal to have a balance between the quantities of each option for a given categorical factor in the design. Table 3764 indicates the counts for each input of a set of candidate inputs for a first categorical factor in the screening design in which there were four options or levels. As shown the counts indicate that a respective count is within one of any other count of any other input of the first set of candidate inputs (e.g., L1 and L2 have equal counts, L2 and L3 have counts within 1, L3 and L4 have equal counts, L1 and L3 have counts within 1). Table 3766 indicates the counts for each input of a set of candidate inputs for a second categorical factor in the screening design in which there were three options or levels. As shown the counts indicate that a respective count is within one of any other count of any other input of the first set of candidate inputs (e.g., L1 and L2 have counts within 1, L2 and L3 have equal counts, L1 and L3 have counts within 1).

Distribution graph 3762 allows a user to select a particular level and see its representation within runs for options of another categorical factor. As shown L2 for factor X1 has an even representation amongst options for factors X2.

If the user decides to update the design to select the default of 12 runs in graphical user interface 3700 in FIG. 37A, the runs in the screening design can update to have an equal quantity of each element of each set of candidate inputs for categorical factors. Another words L1-L4 for factor X1 can each have a count of 3 in table 3764 and L1-L3 for factor X2 can each have 4 in table 3766.

In this example, a computing system according to embodiments herein was able to achieve a good distribution of categorical factors even though the requested run size was smaller than even a product of levels for the categorical factors.

What is claimed is:

1. A computer-program product tangibly embodied in a non-transitory machine-readable storage medium, the computer-program product including instructions operable to cause a computing system to:
- receive a request, via a graphical user interface, requesting a screening design for an experiment;
- obtain, for the screening design, multiple factors of a quantity k for screening in the experiment according to the screening design,
  - wherein a first factor of the multiple factors has a first set of candidate inputs comprising at least two candidate inputs for allowable inputs in the experiment, and
  - wherein a second factor of the multiple factors has a second set of candidate inputs comprising at least three candidate inputs for allowable inputs in the experiment;
- receive, via the graphical user interface, an indication of an initial run size that is a user-requested quantity of runs for the screening design, wherein the initial run size is less than 2k+1 runs;
- generate the screening design by:
  - assigning, based on the initial run size, the first factor to a two-level group that only allows at most two allowable inputs for the first factor in the experiment, and
  - assigning, based on the initial run size, the second factor to a three-level group that only allows at most three allowable inputs for the second factor in the experiment; and
- output the screening design which provides candidate runs according to the initial run size with at most two input options for the first factor and at most three input options for the second factor within the screening design for the experiment.

2. The computer-program product of claim 1,
- wherein the first factor is a continuous factor with multiple candidate input options within one or more ranges for the first factor;
- wherein the second factor is a continuous factor with multiple candidate input options with one or more ranges for the second factor; and
- wherein the instructions are operable to cause the computing system to:
  - receive an updated run size that changes a quantity of runs for the experiment from the initial run size; and
  - output an updated screening design according to the updated run size.

3. The computer-program product of claim 1, wherein the instructions are operable to cause the computing system to:
- receive an updated run size that reduces a quantity of runs for the experiment from the initial run size;
- generate an updated screening design by assigning the second factor to the two-level group; and
- output the updated screening design which provides candidate runs for the experiment with at most two input options for the first factor and at most two input options for the second factor.

4. The computer-program product of claim 1,
- wherein the first set of candidate inputs comprises at least three candidate inputs;
- wherein the instructions are operable to cause the computing system to:
  - receive an updated run size that increases a quantity of runs for the experiment from the initial run size;
  - generate an updated screening design by assigning the first factor to the three-level group; and
  - output the updated screening design which provides candidate runs for the experiment with at most three input options for the first factor and at most three input options for the second factor.

5. The computer-program product of claim 1, wherein the instructions are operable to cause the computing system to:
- receive a request indicating a user preference to prioritize the first factor to assignment to the three-level group;
- generate an updated screening design by:
  - assigning the first factor to the three-level group; and
  - assigning the second factor to the two-level group; and
- output, to the graphical user interface, the updated screening design.

6. The computer-program product of claim 1,
- wherein the request for the screening design indicates a construction request that main effects of each factor of the multiple factors in the screening design are orthogonal to quadratic effects from any continuous factors in the three-level group in the screening design;
- wherein the second factor is a continuous factor; and
- wherein the instructions are operable to cause the computing system to generate the screening design according to the construction request.

7. The computer-program product of claim 1,
- wherein the request for the screening design indicates a construction request that main effects of each factor of the multiple factors in the screening design are orthogonal to groups of quadratic effects in the screening design;

wherein the second factor is a continuous factor; and wherein the instructions are operable to cause the computing system to generate the screening design according to the construction request.

8. The computer-program product of claim 1, wherein the multiple factors comprise:

one or more categorical factors with two allowable inputs;

one or more discrete numeric factors with two or more allowable inputs; and one or more continuous factors with respective inputs within one or more ranges.

9. The computer-program product of claim 1, wherein the instructions are operable to cause the computing system to generate the screening design by:

assigning each of the multiple factors to one of the two-level group and the three-level group;

executing stored computer instructions for generating a screening design according to:

a quantity of factors in the two-level group;

a quantity of factors in the three-level group; and the initial run size.

10. The computer-program product of claim 1, wherein the instructions are operable to cause the computing system to generate the screening design by generating a matrix that is a conference matrix or based on the conference matrix.

11. The computer-program product of claim 1, wherein the instructions are operable to cause the computing system to generate the screening design by generating a matrix of order m corresponding to the initial run size by:

generating, according to stored computer instructions, subdesigns, wherein each subdesign corresponds to a matrix of a lower order that order m; and combining the subdesigns to form the matrix of order m.

12. The computer-program product of claim 1, wherein the multiple factors comprise at least four factors;

wherein the instructions are operable to cause the computing system to generate the screening design by generating a matrix that is a combination of one or more of a first type of matrix and one or more of a second type of matrix;

wherein the first type of matrix is a conference matrix, or based on the conference matrix, of an order based on a quantity of a first subset of the multiple factors assigned to the three-level group;

wherein the second type of matrix is for a second subset of the multiple factors assigned to the two-level group, with order generated based on a quantity of the multiple factors assigned to the two-level group; and wherein the first subset of the multiple factors and the second subset of the multiple factors are disjoint sets.

13. The computer-program product of claim 1, wherein the initial run size comprises at least eight runs in the experiment;

wherein the instructions are operable to cause the computing system to generate the screening design by generating a matrix that is a combination of one or more of a first type of matrix and one or more of a second type of matrix;

wherein the first type of matrix is based on a definitive screening design for a subset of the multiple factors; and wherein the second type of matrix is a Hadamard matrix.

14. The computer-program product of claim 1, wherein the initial run size comprises at least sixteen runs in the experiment;

wherein the instructions are operable to cause the computing system to generate the screening design by generating a matrix that is a combination of one or more of a first type of matrix and one or more of a second type of matrix;

wherein the first type of matrix is a conference matrix or based on the conference matrix; and wherein the second type of matrix is a Hadamard matrix.

15. The computer-program product of claim 1, wherein generating the screening design comprises generating an array representing the screening design;

wherein the array comprises an ordering of two groups; and wherein the two groups comprise a first group for inputs for factors assigned to the three-level group and a second group for inputs for factors assigned to the two-level group.

16. The computer-program product of claim 1, wherein the instructions are operable to cause the computing system to:

output the screening design according to a first run order;

receive an indication to change the first run order in the screening design; and output an updated screening design according to a second run order different from the first run order.

17. The computer-program product of claim 1, wherein the instructions are operable to cause the computing system to:

receive construction criteria;

generate the screening design by:

generating a first subdesign option for the screening design;

generating a second subdesign option for the screening design by changing an order of runs in the first subdesign option;

scoring the first subdesign option and the second subdesign option according to the construction criteria; and outputting, based on the scoring, at most one of the first sub-design option and second-subdesign option as a component of the screening design.

18. The computer-program product of claim 1, wherein the instructions are operable to cause the computing system to:

output, to the graphical user interface, an evaluation for screening capabilities of the screening design according to a first construction criteria;

receive secondary construction criteria, wherein the secondary construction criteria are related to one or more of correlations, estimation, and aliasing in effects criteria; and output, to the graphical user interface, an updated screening design according to the secondary construction criteria without changing the evaluation.

19. The computer-program product of claim 1, wherein the instructions are operable to cause the computing system to:

generate multiple subdesigns for each of multiple groups, wherein the multiple groups comprise the two-level group and the three-level group;

output the screening design by combining all the multiple subdesigns into a composite design; and wherein the composite design comprises orthogonality for main effects of the multiple factors.

20. The computer-program product of claim 1, wherein the first set of candidate inputs or the second set of candidate inputs specifies settings for a device that comprises one or more of a machine, software, or hardware;

wherein the screening design comprises candidate runs for an experiment testing a test system comprising the device; and wherein the instructions are operable to cause the computing system to output the screening design to the test system for controlling the device according to the settings.

21. A computer-implemented method comprising:

receiving a request, via a graphical user interface, requesting a screening design for an experiment;

obtaining, for the screening design, multiple factors of a quantity k for screening in the experiment according to the screening design, wherein a first factor of the multiple factors has a first set of candidate inputs comprising at least two candidate inputs for allowable inputs in the experiment, and wherein a second factor of the multiple factors has a second set of candidate inputs comprising at least three candidate inputs for allowable inputs in the experiment;

receiving, via the graphical user interface, an indication of an initial run size that is a user-requested quantity of runs for the screening design, wherein the initial run size is less than 2k+1 runs;

generating the screening design by:

assigning, based on the initial run size, the first factor to a two-level group that only allows at most two allowable inputs for the first factor in the experiment, and assigning, based on the initial run size, the second factor to a three-level group that only allows at most three allowable inputs for the second factor in the experiment; and outputting the screening design which provides candidate runs according to the initial run size with at most two input options for the first factor and at most three input options for the second factor within the screening design for the experiment.

22. The computer-implemented method of claim 21, wherein the first factor is a continuous factor with multiple candidate input options within one or more ranges for the first factor;

wherein the second factor is a continuous factor with multiple candidate input options with one or more ranges for the second factor; and wherein the computer-implemented method further comprises:

receiving an updated run size that changes a quantity of runs for the experiment from the initial run size; and outputting an updated screening design according to the updated run size.

23. The computer-implemented method of claim 21, wherein the computer-implemented method further comprises:

receiving an updated run size that reduces a quantity of runs for the experiment from the initial run size;

generating an updated screening design by assigning the second factor to the two-level group; and outputting the updated screening design which provides candidate runs for the experiment with at most two input options for the first factor and at most two input options for the second factor.

24. The computer-implemented method of claim 21, wherein the first set of candidate inputs comprises at least three candidate inputs; and wherein the computer-implemented method further comprises:

receiving an updated run size that increases a quantity of runs for the experiment from the initial run size;

generating an updated screening design by assigning the first factor to the three-level group; and outputting the updated screening design which provides candidate runs for the experiment with at most three input options for the first factor and at most three input options for the second factor.

25. The computer-implemented method of claim 21, wherein the computer-implemented method further comprises:

receiving a request indicating a user preference to prioritize the first factor to assignment to the three-level group;

generating an updated screening design by:

assigning the first factor to the three-level group; and assigning the second factor to the two-level group; and outputting, to the graphical user interface, the updated screening design.

26. The computer-implemented method of claim 21, wherein the request for the screening design indicates a construction request that main effects of each factor of the multiple factors in the screening design are orthogonal to quadratic effects from any continuous factors in the three-level group in the screening design; and wherein the second factor is a continuous factor; and wherein the generating the screening design comprises generating the screening design according to the construction request.

27. The computer-implemented method of claim 21, wherein the request for the screening design indicates a construction request that main effects of each factor of the multiple factors in the screening design are orthogonal to groups of quadratic effects in the screening design;

wherein the second factor is a continuous factor; and wherein the generating the screening design comprises generating the screening design according to the construction request.

28. The computer-implemented method of claim 21, wherein the computer-implemented method further comprises receiving construction criteria;

wherein the generating the screening design comprises:

generating a first subdesign option for the screening design;

generating a second subdesign option for the screening design by changing an order of runs in the first subdesign option;

scoring the first subdesign option and the second subdesign option according to the construction criteria; and wherein the outputting the screening design comprises outputting, based on the scoring, at most one of the first sub-design option and the second-subdesign option as a component of the screening design.

29. The computer-implemented method of claim 21, wherein the generating the screening design comprises generating multiple subdesigns for each of multiple groups;

wherein the multiple groups comprise the two-level group and the three-level group;

wherein the outputting the screening design comprises combining all the multiple subdesigns into a composite design; and wherein the composite design comprises orthogonality for main effects of the multiple factors.

30. A computing device comprising processor and memory, the memory containing instructions executable by the processor wherein the computing device is configured to:

receive a request, via a graphical user interface, requesting a screening design for an experiment;

obtain, for the screening design, multiple factors of a quantity k for screening in the experiment according to the screening design, wherein a first factor of the multiple factors has a first set of candidate inputs comprising at least two candidate inputs for allowable inputs in the experiment, and wherein a second factor of the multiple factors has a second set of candidate inputs comprising at least three candidate inputs for allowable inputs in the experiment;

receive, via the graphical user interface, an indication of an initial run size that is a user-requested quantity of runs for the screening design, wherein the initial run size is less than 2k+1 runs;

generate the screening design by:

assigning, based on the initial run size, the first factor to a two-level group that only allows at most two allowable inputs for the first factor in the experiment, and assigning, based on the initial run size, the second factor to a three-level group that only allows at most three allowable inputs for the second factor in the experiment; and output the screening design which provides candidate runs according to the initial run size with at most two input options for the first factor and at most three input options for the second factor within the screening design for the experiment.

* * * * *

UNITED STATES PATENT AND TRADEMARK OFFICE

CERTIFICATE OF CORRECTION

PATENT NO. : 12,175,166 B1
APPLICATION NO. : 18/769847
DATED : December 24, 2024
INVENTOR(S) : Ryan Adam Lekivetz et al.

It is certified that error appears in the above-identified patent and that said Letters Patent is hereby corrected as shown below:

In the Specification

In Column 8, Line 41, delete “ROLAP OR MOLAP” and insert -- ROLAP or MOLAP -- therefor.

In Column 16, Line 37, delete “fail and” and insert -- fail, and -- therefor.

In Column 17, Line 48, delete “predetermined, or” and insert -- predetermined or -- therefor.

In Column 35, Line 15, delete “Could” and insert -- Cloud -- therefor.

In Column 52, Line 42, delete “nkl(a, b)” and insert -- $n_{kl}$(a, b) -- therefor.

In Column 53, Line 29, delete “$Eff_{Ref}/Eff_{comp}$” and insert -- $Eff_{Ref}$ / $Eff_{Comp}$ -- therefor.

In Column 53, Line 46, delete “compute 1” and insert -- compute I -- therefor.

In the Claims

In Column 62, Line 38, delete “sub-design option” and insert -- subdesign option -- therefor.

In Column 62, Line 38, delete “and second-subdesign” and insert -- and the second subdesign -- therefor.

Signed and Sealed this
Twenty-ninth Day of April, 2025

Coke Morgan Stewart
*Acting Director of the United States Patent and Trademark Office*